(12) United States Patent
Hayashi

(10) Patent No.: US 7,517,549 B2
(45) Date of Patent: Apr. 14, 2009

(54) METHOD OF, AND APPARATUS FOR, MANUFACTURING ORGANIC EL DEVICE; ORGANIC EL DEVICE; ELECTRONIC DEVICE; AND LIQUID DROPLET EJECTION APPARATUS

(75) Inventor: Takayuki Hayashi, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/347,268

(22) Filed: Jan. 21, 2003

(65) Prior Publication Data

US 2003/0175414 A1 Sep. 18, 2003

(30) Foreign Application Priority Data

Jan. 23, 2002 (JP) ............................. 2002-014029

(51) Int. Cl.
*B05D 5/06* (2006.01)
*B05D 1/38* (2006.01)
*B05D 3/02* (2006.01)

(52) U.S. Cl. .................. 427/66; 427/258; 427/379; 427/384; 427/421.1; 118/50; 118/315

(58) Field of Classification Search ................ 427/66, 427/68, 69, 70, 258, 379, 384, 421.1–427.7; 118/50, 315
See application file for complete search history.

(56) References Cited

U.S. PATENT DOCUMENTS

| | | | | | |
|---|---|---|---|---|---|
| 3,698,024 | A | * | 10/1972 | Bruckner | 8/151 |
| 5,125,980 | A | * | 6/1992 | Schotter | 134/15 |
| 5,821,003 | A | * | 10/1998 | Uemura et al. | 428/690 |
| 6,049,167 | A | * | 4/2000 | Onitsuka et al. | 313/512 |
| 6,066,357 | A | * | 5/2000 | Tang et al. | 427/66 |
| 6,220,693 | B1 | * | 4/2001 | Bode et al. | 347/34 |
| 6,303,963 | B1 | | 10/2001 | Ohtani et al. | |
| 6,390,591 | B1 | * | 5/2002 | Silverbrook | 347/20 |
| 6,420,834 | B2 | * | 7/2002 | Yamazaki et al. | 315/169.3 |
| 6,554,389 | B1 | * | 4/2003 | Hawkins et al. | 347/19 |
| 6,582,504 | B1 | * | 6/2003 | Fujita | 106/311 |
| 6,623,097 | B2 | * | 9/2003 | Okada et al. | 347/21 |
| 6,730,357 | B2 | | 5/2004 | Kawase | |
| 6,776,880 | B1 | * | 8/2004 | Yamazaki | 204/192.15 |
| 6,830,494 | B1 | * | 12/2004 | Yamazaki et al. | 445/24 |
| 6,844,089 | B2 | * | 1/2005 | Richter et al. | 428/690 |
| 6,851,777 | B2 | * | 2/2005 | Speckhart | 347/8 |
| 6,861,370 | B1 | * | 3/2005 | Kasatani | 438/745 |
| 2001/0001050 | A1 | * | 5/2001 | Miyashita et al. | 428/690 |
| 2001/0026125 | A1 | | 10/2001 | Yamazaki et al. | |

(Continued)

FOREIGN PATENT DOCUMENTS

EP 1 103 590 A2 11/2000

(Continued)

*Primary Examiner*—Timothy H Meeks
*Assistant Examiner*—Jimmy Lin
(74) *Attorney, Agent, or Firm*—Oliff & Berridge, PLC

(57) ABSTRACT

An organic EL function layer is formed in the following manner. Namely, relative scanning is carried out between a substrate and a function liquid droplet ejection head having introduced therein a light function material is selectively ejected toward the emitting function material. The light emitting substrate such that an organic EL function layer is formed on a multiplicity of pixel regions on the substrate. The work of ejecting the light emitting function material is carried out in an atmosphere of an inert gas.

12 Claims, 71 Drawing Sheets

U.S. PATENT DOCUMENTS

| | | |
|---|---|---|
| 2001/0050532 A1* | 12/2001 | Eida et al. .................... 313/504 |
| 2002/0001679 A1* | 1/2002 | Matsuyama et al. ......... 427/446 |
| 2002/0009538 A1 | 1/2002 | Arai |
| 2002/0067123 A1* | 6/2002 | Seki et al. .................... 313/504 |
| 2002/0127879 A1* | 9/2002 | Matsuyama et al. ......... 438/782 |
| 2002/0186287 A1* | 12/2002 | Kawase ....................... 347/100 |
| 2002/0187272 A1* | 12/2002 | Kojima et al. ................ 427/421 |
| 2003/0106492 A1* | 6/2003 | Levinson et al. ............. 117/200 |

FOREIGN PATENT DOCUMENTS

| | | |
|---|---|---|
| JP | A-08-225782 | 9/1996 |
| JP | A 09-187710 | 7/1997 |
| JP | A-11-10051 | 1/1999 |
| JP | A 11-334871 | 12/1999 |
| JP | 2000-036385 A | 2/2000 |
| JP | A 2000-107670 | 4/2000 |
| JP | A 2000-198224 | 7/2000 |
| JP | A-2000-323276 | 11/2000 |
| JP | A-2001-052864 | 2/2001 |
| JP | A 2001-113213 | 4/2001 |
| JP | A 2001-171135 | 6/2001 |
| JP | A 2001-252609 | 9/2001 |
| JP | A 2001-291588 | 10/2001 |
| JP | 2001-319863 * | 11/2001 ................ 438/782 |
| JP | A 2001-341296 | 12/2001 |
| JP | 2002-33190 A | 1/2002 |
| JP | A-2002-126599 | 5/2002 |
| JP | 2003-297569 A | 10/2003 |
| WO | WO 95-25149 | 9/1995 |
| WO | WO0170506 | 9/2001 |

* cited by examiner

F I G. 1
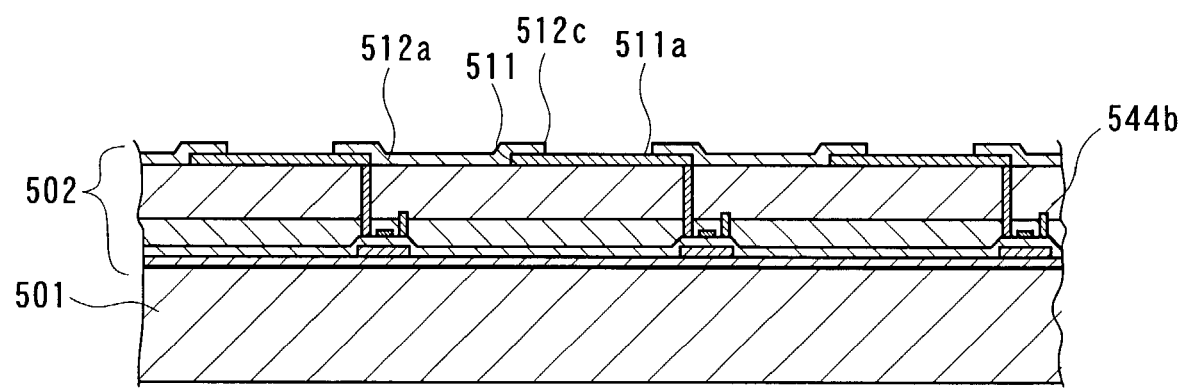

F I G. 5
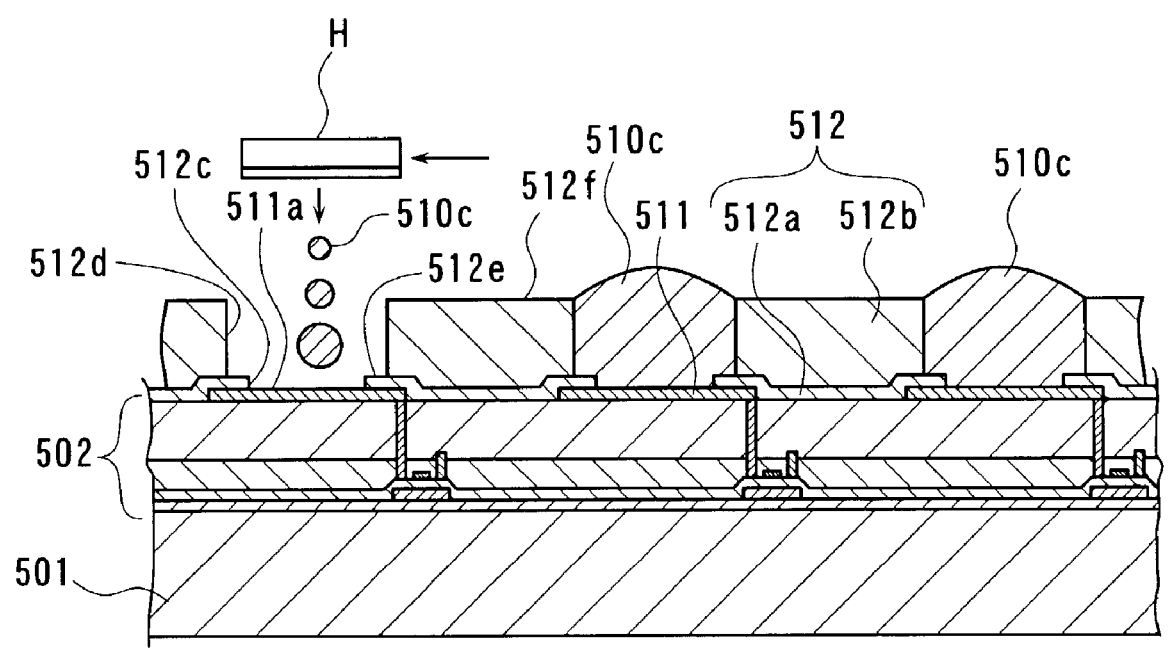

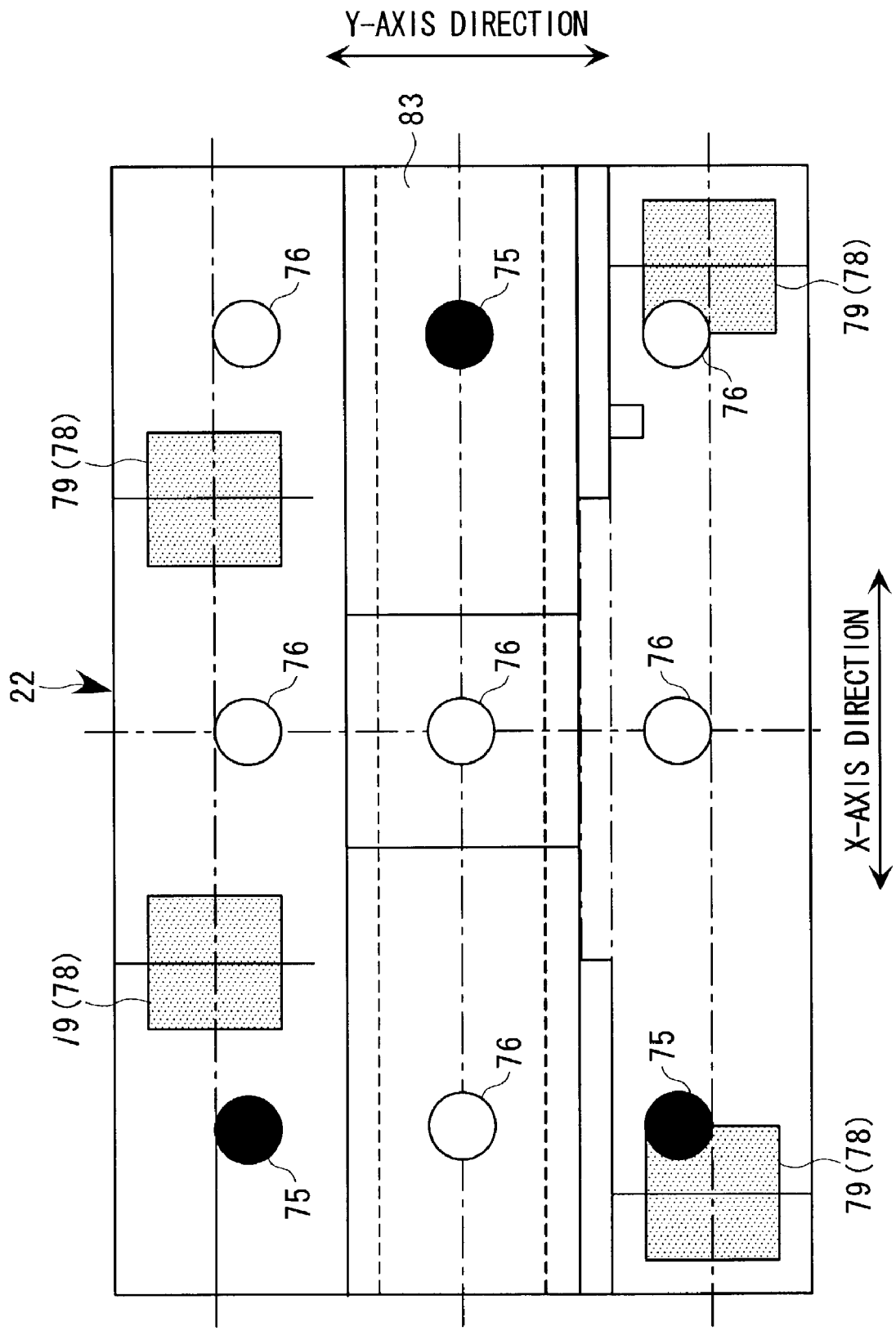

F I G. 3 0
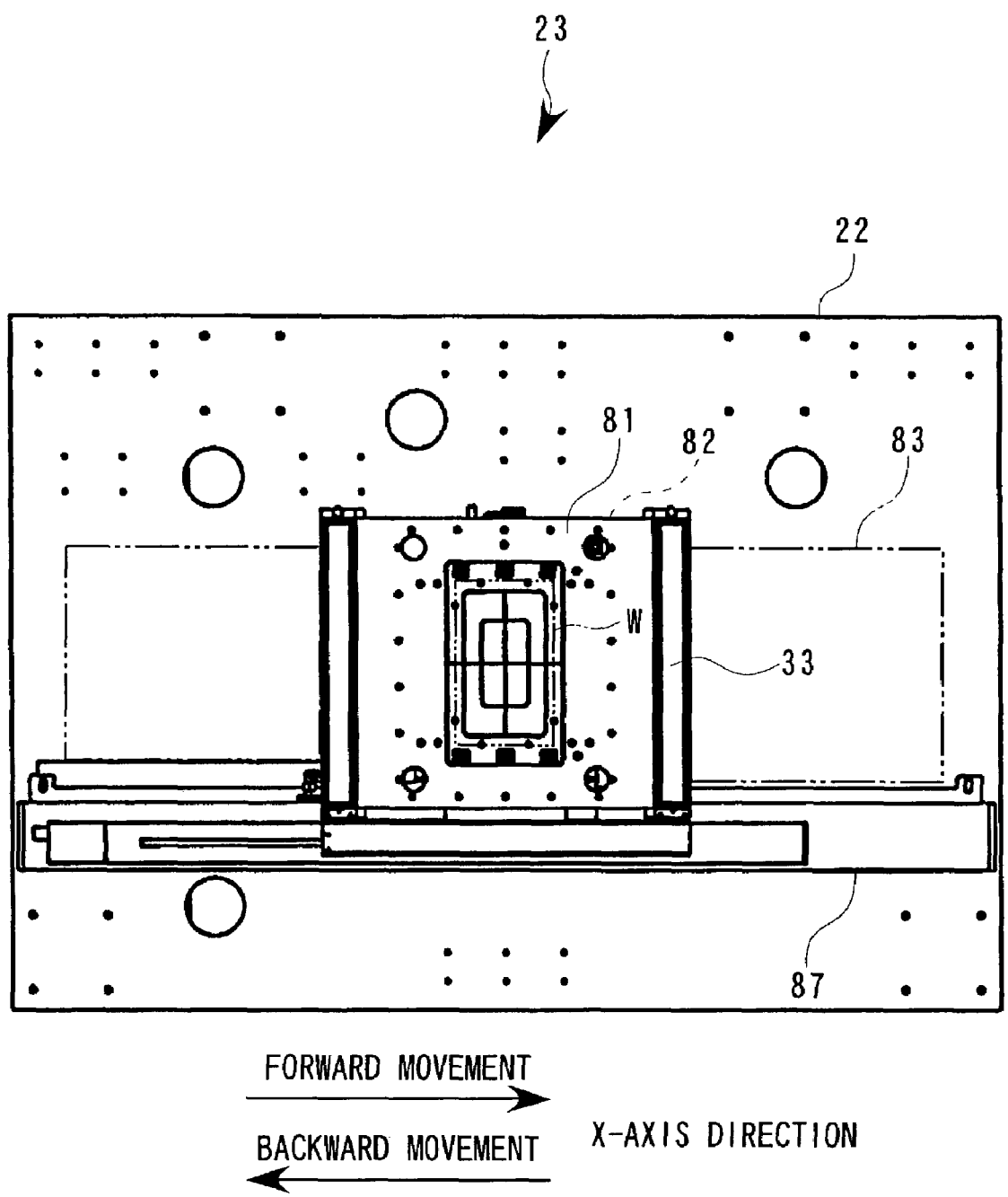

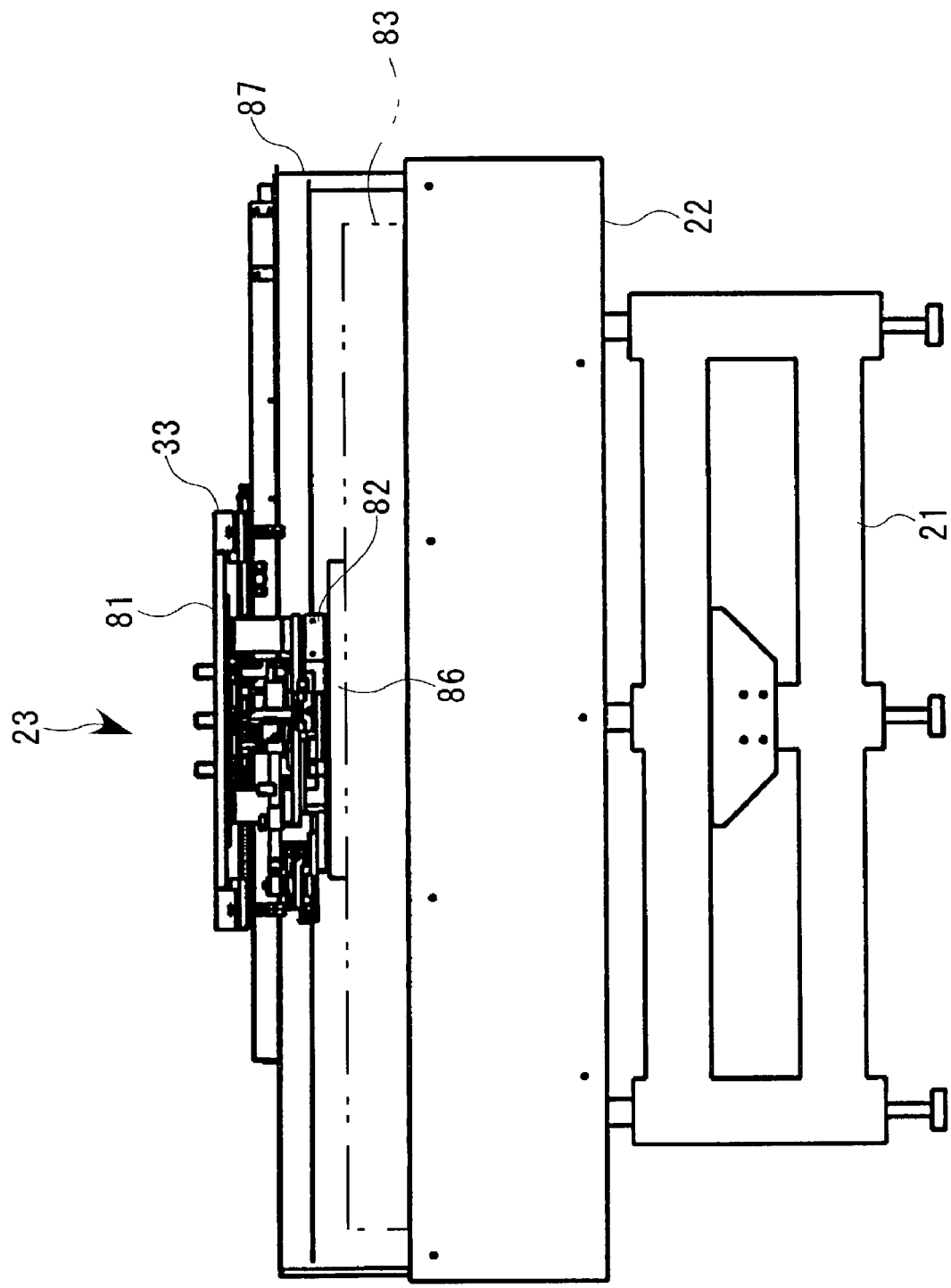

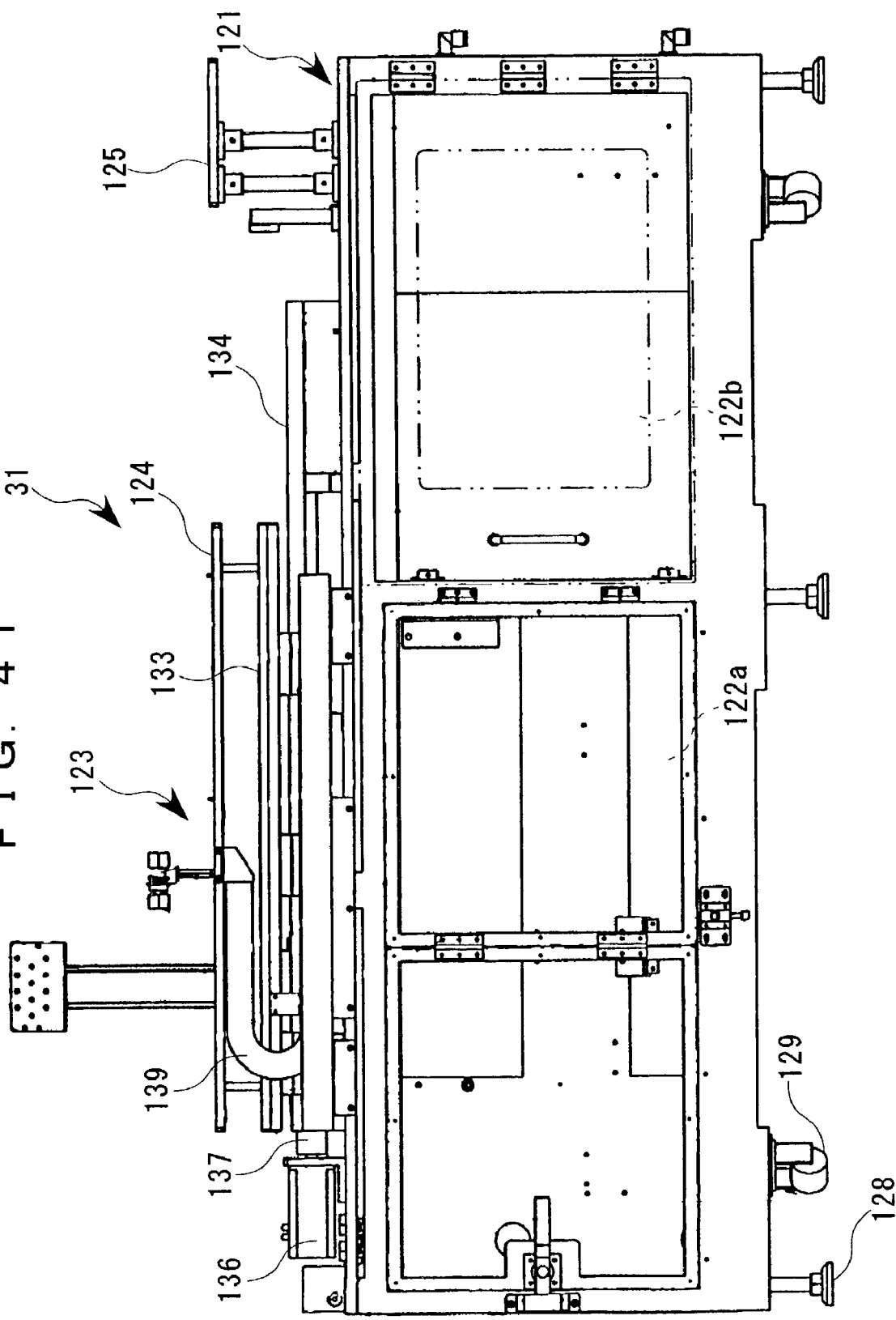
F I G. 41

FIG. 56
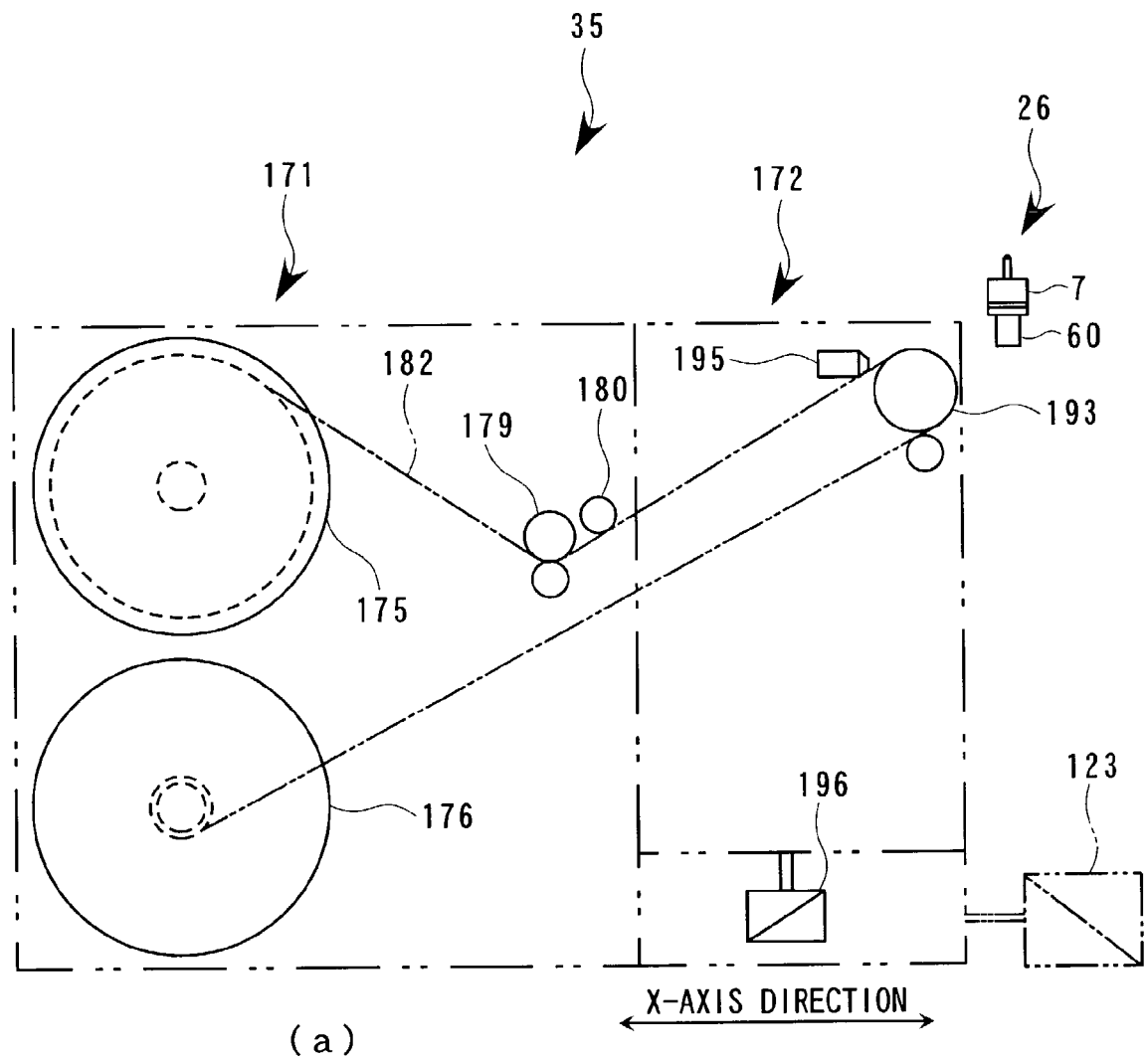
(a)
X-AXIS DIRECTION
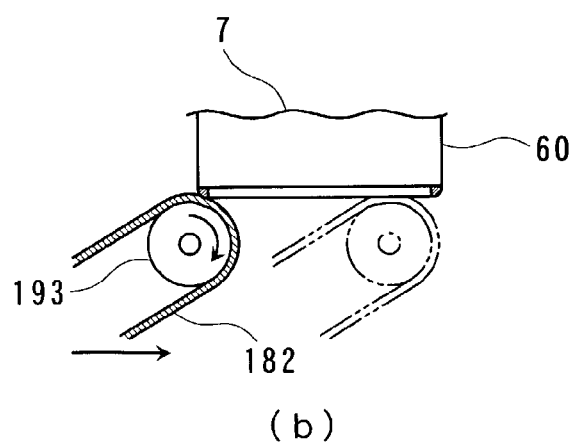
(b)

METHOD OF, AND APPARATUS FOR, MANUFACTURING ORGANIC EL DEVICE; ORGANIC EL DEVICE; ELECTRONIC DEVICE; AND LIQUID DROPLET EJECTION APPARATUS

BACKGROUND OF THE INVENTION

1. Field of the Invention

This invention relates to an apparatus for, and a method of, manufacturing an organic electroluminescent (EL) device in which a function liquid droplet ejection head as represented by an ink jet head is used, an organic EL device, an electronic device, and a liquid droplet ejection apparatus.

2. Description of Related Art

This kind of conventional apparatus for, and a method of, manufacturing an organic EL device in which a function liquid droplet ejection head as represented by an ink jet head is used is still under development for putting it into practical use. In such a conventional apparatus, a light emitting layer is formed in the following manner. Namely, a light emitting material in a liquid state is introduced as a function liquid into a function liquid droplet ejection head. The light emitting material is then ejected to a multiplicity of pigment regions. Solvent in the light emitting material is thereafter evaporated (dried).

In the above-described conventional apparatus for manufacturing an organic EL device using the function liquid droplet ejection head, if a material which is liable to react with oxygen, or the like, in the open air (outside air) is used as the light emitting material, there is the following problem. Namely, the light emitting material to fly by being ejected from the function liquid droplet head in an ordinary environment is brought into contact with the air over an extended area. As a result, deterioration in quality of the light emitting material is likely to be accelerated. In addition, there is another problem in that the light emitting material that has been adhered to a target reacts with oxygen, or the like, whereby cracks, or the like, are likely to occur in the course of drying.

This invention provides a method of, and apparatus for, manufacturing an organic EL device which is capable of preventing the deterioration in quality of, and damages to, a light emitting organic function material in the course of forming an organic EL function layer by ejecting the material. It also provides an organic EL device, an electronic device, as well as a liquid droplet ejection apparatus.

SUMMARY OF THE INVENTION

According to one aspect of this invention, there is provided a method of manufacturing an organic electroluminescent (EL) device comprising the steps of: carrying out relative scanning between a substrate and a function liquid droplet ejection head having introduced therein a light emitting function material; selectively ejecting the light emitting function material such that an organic EL function layer is formed on a multiplicity of pixel regions on the substrate, wherein the step of ejecting the light emitting function material is carried out in an atmosphere of an inert gas.

Preferably, the inert gas is one of nitrogen, oxygen dioxide, helium, neon, argon, krypton, xenon, and radon.

According to this arrangement, since the step of selectively ejecting the light emitting function material to the substrate is performed in the atmosphere of an inert gas, the light emitting function material can be kept out of contact with the open air (outside air) in the course between the ejection of the light emitting function material to the formation of the organic EL function layer. Therefore, the deterioration in quality of, or damage to, the light emitting function material can be prevented.

Preferably, the organic EL function layer is at least an EL light emitting layer of the EL light emitting layer and a hole injection layer.

According to this arrangement, since the portion which forms the main part of the light emitting function in the organic EL device can be formed by the function liquid droplet ejection head, more minute pixels can be formed at a higher accuracy. Therefore, an organic EL device of high resolution and high image quality can be manufactured.

Preferably, in the atmosphere of the inert gas, the flow of the inert gas crosses an ejection area constituting the ejection step.

According to this arrangement, since the flow of the inert gas in the atmosphere crosses the ejection area in which the relative scanning of the function liquid droplet ejection head is carried out while ejecting the light emitting function material, the light emitting function material can be completely kept out of contact with the open air (outside air). Therefore, the deterioration in quality of, or damage to, the light emitting function material can surely be prevented.

Preferably, the atmosphere is maintained by constantly carrying out the supply of the inert gas and exhausting.

According to this arrangement, the atmosphere of the inert gas can be stably maintained and the evaporated solvent of the light emitting function material can be appropriately exhausted out of the apparatus. Preferably, the exhausted solvent is recovered by a treatment apparatus.

It is preferable to maintain the atmosphere at a predetermined temperature through the introduced inert gas.

The predetermined temperature is preferably 20° C.±0.5° C.

According to the above arrangement, since the atmosphere is maintained at a predetermined temperature in the course from the ejection of the light emitting function material to the forming of the organic EL function layer, it is possible to obtain an organic EL function layer which is qualitatively stable. The yield of the organic EL device can thus be improved.

Preferably, the atmosphere is maintained below a predetermined oxygen concentration and the predetermined oxygen concentration is 10 ppm.

According to the above arrangement, the effect of oxygen in the course of ejection of the light emitting function material to the formation of the organic EL function layer can be substantially eliminated, and the yield of the organic EL device can be improved.

Preferably, the atmosphere is maintained below a predetermined moisture content and the predetermined moisture content is preferably 10 ppm.

According to the above arrangement, the effect of the moisture content, i.e., the effect of oxygen and hydrogen contained in the moisture, in the course of ejection of the light emitting function material to the formation of the organic EL function layer, can be substantially eliminated, and the yield of the organic EL device can be improved.

Preferably, the method further comprises the drying step of drying a solvent in the light emitting function material ejected onto the pixel regions, and the drying step is carried out in the atmosphere of the inert gas.

According to this arrangement, since the drying step to dry the solvent in the ejected light emitting function material is also carried out in the atmosphere of the inert gas, the deterioration in the quality of, or damage to, the light emitting function material in the drying step can be effectively prevented.

Preferably, the method further comprises a step of transporting the substrate between an ejection area in which the ejection step is carried out and a drying area in which the drying step is carried out, and the transporting step is carried out in the inert gas atmosphere.

According to this arrangement, since the transporting step is also carried out in the atmosphere of the inert gas, the deterioration in quality, or the like, of the light emitting material during the transportation can effectively be prevented.

Preferably, the organic EL device of this invention is manufactured by the above-described method of manufacturing an organic EL device, and the electronic device of this invention is equipped with an organic EL device of this invention as described above.

According to the above arrangement, the organic EL device itself in which the high-quality organic EL function layer has been stably formed in the multiplicity of pixel regions can be easily manufactured. It is thus possible to provide an inexpensive and reliable organic EL device as well as an electronic device equipped therewith. The organic EL device is a so-called flat display and the electronic device in this case includes various kinds of devices equipped with a flat display, such as a mobile telephone, a personal computer, or the like.

According to another aspect of this invention, there is provided an apparatus for manufacturing an organic EL device comprising: scanning means for carrying out a relative scanning between a substrate and a function liquid droplet ejection head having introduced therein a light emitting function material; liquid droplet ejection means for selectively ejecting the light emitting function material to thereby form an organic EL function layer on a multiplicity of pixel regions on the substrate; and chamber means for housing the liquid droplet ejection means inside an atmosphere of an inert gas.

Preferably, the inert gas is one of nitrogen, oxygen dioxide, helium, neon, krypton, xenon, and radon.

According to the above arrangement, since the liquid droplet ejection means is housed inside the chamber means which constitutes the atmosphere of the inert gas, the ejection of the light emitting function material by the liquid droplet ejection means is carried out inside the atmosphere of the inert gas. Therefore, in the course from the ejection of the light emitting function material by the liquid droplet ejection means to the formation of the organic EL function layer, the contact of the light emitting function material with the open air (outside air) can be eliminated and the deterioration in the quality of, or damage to, the light emitting function material can be prevented.

Preferably, the organic EL function layer is at least an EL light emitting layer of the EL light emitting layer and a hole injection layer.

According to this arrangement, since the portion which forms the main body of the light emitting function in the organic EL device can be formed by the function liquid droplet ejection head, it is possible to form more minute pixels at a higher accuracy. An organic EL device of high resolution and high image quality can therefore be manufactured.

Preferably, the chamber means houses therein an auxiliary apparatus together with the liquid droplet ejection means.

According to this arrangement, it is possible to eliminate or minimize to the extent possible the sealing portion of the chamber means through which the open air easily enters, whereby the atmosphere of the inert gas inside the chamber means can be maintained stable. The auxiliary apparatus includes a supply system for supplying the function liquid, an electric power system, a control system, an air supply system, a maintenance system for cleaning, or the like.

Preferably, the chamber means comprises: a chamber room; a gas supply equipment for supplying the inert gas to the chamber room through a gas supply port; and a gas exhaust equipment for exhausting the inert gas out of the chamber room through a gas exhaust port.

According to this arrangement, the inert gas is supplied by the gas supply equipment to the chamber room which contains therein the liquid droplet ejection means, and the inert gas is exhausted by the gas exhaust system. Therefore, it is possible to smoothly arrange (or form) the atmosphere of the inert gas inside the chamber room, and also to easily perform the control, or the like, over the atmosphere.

Preferably, an ejection area for the liquid droplet ejection means is set in a central part of the chamber room, and a main fluid passage connecting the gas supply port and the gas exhaust port crosses the ejection area.

According to this arrangement, since the flow of the inert gas inside the atmosphere crosses the ejection area in which the function liquid ejection head carries out scanning while ejecting the light emitting function material, the contact of the light emitting function material with the open air can be surely eliminated, whereby the deterioration in quality, or the like, of the light emitting function material can be surely prevented.

Preferably, the chamber room is formed into a substantial square, and the gas supply port and the gas exhaust port are disposed in diagonal positions.

According to this arrangement, the atmosphere inside the chamber room hardly becomes stagnant, whereby the inert gas can be stably supplied. It is also possible to well maintain the atmosphere of the inert gas.

Preferably, the chamber room comprises an inspection panel provided in a detachable manner, the inspection panel having a double panel construction of an inner panel and an outer panel.

According to this arrangement, by making the inspection panel in double panel construction, the chamber room can be constituted into an air tight construction without giving rise to troubles in the maintenance, or the like, of the liquid droplet ejection means. The leakage, or the like, of the inert gas can thus be minimized.

Preferably, the chamber room comprises the inspection panel at two positions, one being disposed in a position facing the liquid droplet ejection means and the other being disposed in a position facing the auxiliary apparatus.

According to this arrangement, at the time of carrying out the maintenance work of the liquid droplet discharge means and the auxiliary apparatus, the workability will not be impaired by the chamber room.

Preferably, the gas supply equipment comprises a gas supply device and a gas conditioner disposed in a gas passage between the gas supply device and the gas supply port, the gas conditioner comprising a cooler, a heater, a fan, and a filter.

According to this arrangement, the inert gas to be supplied from the gas supply equipment to the chamber room through the gas supply port can be conditioned by the gas conditioner in point of temperature and moisture content, and also the impurities such as the dust, or the like, in the inert gas can be removed.

Preferably, the gas conditioner maintains the atmosphere of the inert gas at a predetermined temperature, and the predetermined temperature is $20°$ C.$\pm 0.5°$ C.

According to this arrangement, in the course of ejecting the light emitting function material by the liquid droplet ejection means to the formation of the organic EL function layer, the atmosphere of the inert gas is maintained to the constant temperature. Therefore, it is possible to constantly obtain the qualitatively stable organic EL function layer. The yield of the organic EL device can thus be improved.

Preferably, the gas conditioner maintains the atmosphere below a predetermined oxygen concentration, and the oxygen concentration is 10 ppm.

According to this arrangement, in the course of ejecting the light emitting function material by the liquid droplet ejection means to the formation of organic EL function layer, the effect of oxygen can be substantially eliminated, whereby the yield of the organic EL device can be improved.

Preferably, the gas conditioner maintains the atmosphere of the inert gas below a predetermined moisture content, and the predetermined moisture content is 10 ppm.

According to this arrangement, in the course of ejecting the light emitting function material by the liquid droplet ejection means to the formation of the organic EL function layer, the effect of moisture content, i.e., the effect of oxygen and hydrogen contained in the moisture, can be substantially eliminated, whereby the yield of the organic EL device can be improved.

Preferably, the gas exhaust equipment comprises a gas exhaust passage communicated with the gas exhaust port, and a gas exhaust damper interposed in the gas exhaust passage, and the gas exhaust damper is controlled to be normally open.

According to this arrangement, since the atmosphere inside the chamber room is exhausted little by little, the solvent in the light emitting function material evaporated together with part of the inert gas can also be appropriately exhausted to the outside of the apparatus. The concentration of the inert gas can thus be stably maintained. The exhausted solvent should preferably be recovered by a recovery apparatus.

Preferably, the chamber means further comprises an open air supply equipment for supplying the chamber room with open air in place of the inert gas.

According to this arrangement, in the maintenance work, or the like, of the liquid droplet ejection means, the open air can be smoothly taken into the chamber room by the open air supply apparatus. In other words, the atmosphere inside the chamber room can be easily changed from the inert gas to the open air.

Preferably, the open air supply equipment is communicated with the chamber room through the gas exhaust port.

According to this arrangement, the chamber room need not be provided with a port which is exclusively used for introducing the open air into the chamber room, thereby simplifying the construction of the open air supply apparatus.

Preferably, the organic EL device of this invention is manufactured by the apparatus for manufacturing the organic EL device.

The electronic device of this invention is equipped with the organic EL device according to the above-described invention.

According to the above arrangement, the organic EL device in which a high-quality organic EL function layer has been stably formed in a multiplicity of pixel regions can be easily manufactured. The inexpensive and reliable organic EL device as well as the electronic device that is equipped with the organic EL device can therefore be provided. The organic EL device is a so-called flat display, and the electronic device referred to above is a various kind of device such as a mobile phone, a personal computer, or the like, which is equipped with the flat display.

According to another aspect of this invention, there is provided a liquid droplet ejection apparatus comprising: scanning means for carrying out relative scanning between a substrate and a function liquid droplet ejection head into which a light emitting function material has been introduced; liquid droplet ejection means for selectively ejecting the function material on the substrate to thereby form a function layer on the substrate; and a chamber means for housing the liquid droplet ejection means inside an atmosphere of an inert gas.

According to this arrangement, since the liquid droplet ejection means is housed inside the chamber means constituting the atmosphere of an inert gas, the ejection of the function material by the liquid droplet ejection means is carried out inside the atmosphere of the inert gas. Therefore, in the course from the ejection of the function material to the forming of the function film (layer), the contact of the function material with the open air is eliminated. Even a material that is likely to be damaged in the open air can be prevented from being changed in quality or from being damaged.

As the function material, there can be listed an organic material (liquid) for use in liquid repellency (water repellency), in metallic wiring, in orientation film, or the like, and is capable of being ejected from a function liquid droplet ejection head (ink jet head).

BRIEF DESCRIPTION OF THE DRAWINGS

FIG. 1 is a sectional view showing the step of forming a bank portion (inorganic-matter bank) in manufacturing an organic EL device according to this invention;

FIG. 5 is a sectional view showing the step of forming a hole injection layer (liquid droplet ejection) in the method of manufacturing the organic EL device according to this invention;

FIG. 29 is a schematic view showing the supporting mode of the stone base of the function liquid ejection head according to this invention;

FIG. 30 is a plan view of an X-axis table of the liquid droplet ejection apparatus according to this invention;

FIG. 31 is a side view of the X-axis table of the liquid droplet ejection apparatus according to this invention;

FIG. 41 is a side view of the common machine base of the liquid droplet ejection apparatus according to this invention;

FIG. 56 is a schematic diagram showing the operation of the wiping unit according to this invention;

DETAILED DESCRIPTION OF THE PREFERRED EMBODIMENT

Figure 2:
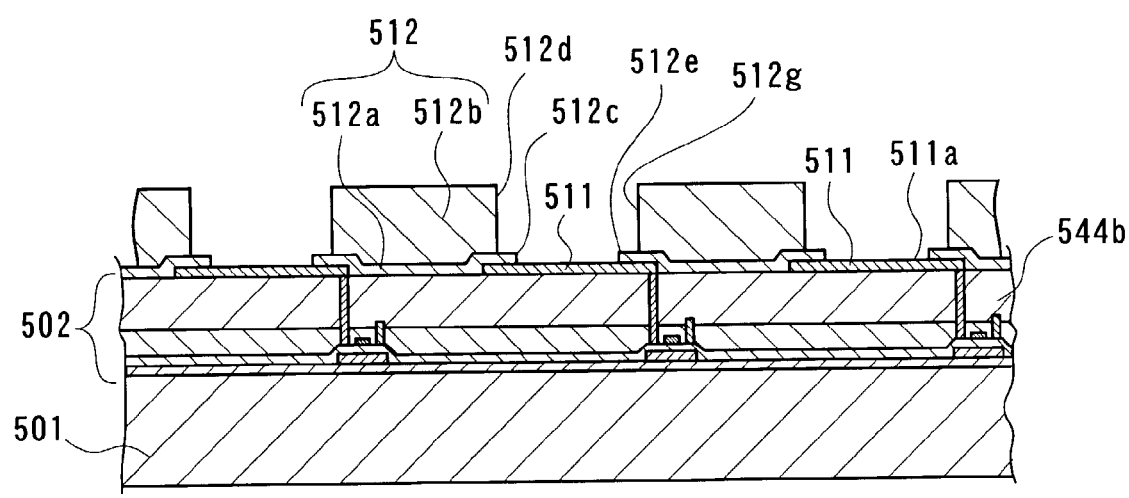
FIG. 2 is a sectional view showing the step of forming a bank portion (organic-matter bank) in manufacturing the organic EL device according to this invention.

With reference to the accompanied drawings, a detailed description will now be made about preferred embodiments of this invention. An ink jet head of an ink jet printer (the ink jet head is also referred to as a liquid droplet ejection head) is capable of ejecting very minute ink droplets (liquid droplets) in the form of dots at a high accuracy. Therefore, it is expected to apply the liquid droplet ejection head to the field of manufacturing various kinds of parts by using, as the liquid droplet (liquid to be ejected), special inks, light emitting or photosensitive resins, or the like.

An apparatus for manufacturing an organic electroluminescent (EL) device according to this embodiment is to be built into a manufacturing line for manufacturing an organic EL device which is a kind of so-called flat display device. In the apparatus in question, a function liquid such as a light emitting material, or the like, is ejected from ejection heads of a plurality of function liquid droplet ejection heads which are used in the apparatus (in the case of an ink jet printing system). There will thus be formed that EL light emitting layer in each of pixels which performs the light emitting function of the organic EL device and a hole injection layer.

In this embodiment, a description will be made first about the structure of the organic EL device as well as about a method (or process) of manufacturing the organic EL device. Thereafter, a description will be made about an apparatus for manufacturing an organic EL device as well as about a method of manufacturing the organic EL device. The apparatus for manufacturing an organic EL device is made up of an imaging apparatus (i.e., an apparatus for forming images or pictures) for performing scanning with mounted function liquid ejection heads, and its peripheral apparatuses. As the peripheral apparatuses, there can be listed a chamber apparatus, a transporting apparatus, and a drying apparatus. In this embodiment, a description is made mainly about the chamber apparatus, and only brief descriptions will be made about the transporting apparatus and the drying apparatus.

FIGS. 1 through 13 show the process of manufacturing an organic EL device inclusive of an organic EL element, and also show the structure of the organic EL device. This process is made up of the following steps: i.e., a step of forming a bank portion (also referred to as a bank forming step); a step of plasma processing; a step of forming light emitting element which in turn is made up of a step of forming a hole injection/transport layer, and a step of forming a light emitting layer; a step of forming opposed opposite) electrodes; and a step of sealing.

In the step of forming a bank portion, a bank layer 512a made of an inorganic matter (hereinafter also called an inorganic-matter bank layer) and a bank layer 512b made of an organic matter (also called an organic-matter bank layer) are laminated in a predetermined position on a circuit element portion 502 and an electrode 511 (also called a pixel electrode) which are formed in advance on a substrate 501. As described, the step of forming a bank portion includes a step of forming the inorganic-matter bank layer 512a on a part of the electrode 511 as well as a step of forming the organic-matter bank layer 512b on the inorganic-matter bank layer 512a.

First, in the step of forming the inorganic-matter bank layer 512a, as shown in FIG. 1, the inorganic-matter bank layer 512a is formed on an interlayer dielectric 544b and on the pixel electrode 511 of the circuit element portion 502. This inorganic-matter bank layer 512a is formed by, e.g., a chemical vapor deposition (CVD) method, a coating method, a sputtering method, or the like, on an entire surface of the interlayer dielectric 544b and on the pixel electrode 511, thereby forming a film of an inorganic matter such as $SiO_2$, $TiO_2$, or the like.

Thereafter, this inorganic-matter film is subjected to patterning by etching, or the like, to thereby form a lower opening portion 512c which corresponds to the position of forming an electrode surface 511a of the electrode 511. At this time, it is necessary to form the inorganic-matter bank layer 512a so as to overlap with the peripheral portion of the electrode 511. By thus forming the peripheral portion (only partly) of the electrode 511 in a manner to overlap with the inorganic-matter bank layer 512a, the light emitting region of the light emitting layer 510 can be controlled.

Then, in the step of forming the organic-matter bank layer 512b, as shown in FIG. 2, an organic-matter bank layer 512b is formed on the inorganic-matter bank layer 512a. The organic-matter bank layer 512b is etched by the art of photolithography, or the like, to thereby form an upper opening portion 512d of the organic-matter bank layer 512b. The upper opening portion 512d is formed in a position which corresponds to the electrode surface 511a and the lower opening portion 512c.

As shown in FIG. 2, the upper opening portion 512d shall preferably be formed larger than the lower opening portion 512c and smaller than the electrode surface 511a. According to this arrangement, the first laminated portion 512e enclosing or surrounding the lower opening portion 512c of the inorganic-matter bank layer 512a is arranged to extend toward the center of the electrode 511 beyond the organic-matter bank layer 512b. By thus bringing the upper opening portion 512d and the lower opening portion 512c into communication with each other, there is formed an opening portion 512g which passes or penetrates through the inorganic-matter bank layer 512a and the organic-matter bank layer 512b.

In the subsequent plasma processing step, there are formed a region having ink affinity and a region having ink repellency on the surface of the bank portion 512 and on the surface of the pixel electrode 511a. This plasma processing step is largely classified into: a preliminary heating step; a step of causing to have an affinity with ink (an ink-affinity step) in which an upper surface 512f of the bank portion 512, a wall surface of the opening portion 512g, and an electrode surface 511a of the pixel electrode 511 are made to have ink-affinity (property to show an affinity with the ink); a step of causing to have a repellency against ink (an ink-repellency step) in which an upper surface 512f of the organic-matter bank layer 512b and a wall surface of the upper opening portion 512d are made to have ink repellency (property to show a repellency against the ink); and a cooling step.

First, in the preliminary heating step, the substrate 501 inclusive of the bank portion 512 is heated to a predetermined temperature. In heating the substrate 501, a heater is attached to a stage on which the substrate 501 is mounted and the substrate 501 is heated by this heater together with the stage. In concrete, it is preferable to make the preliminary heating temperature to the range of, e.g., 70-80° C.

Figure 3:
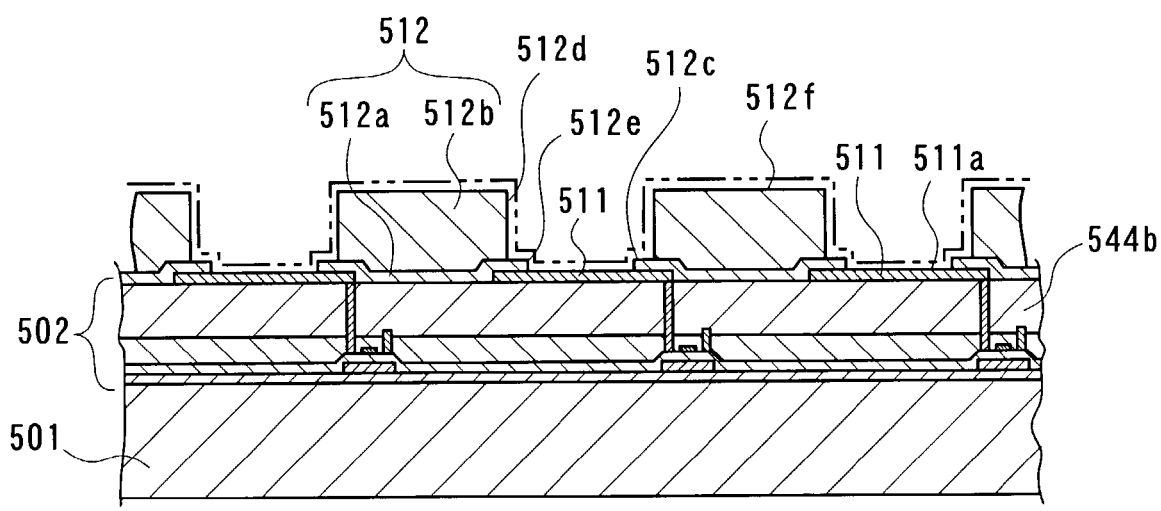
FIG. 3 is a sectional view showing the step of plasma processing (water-affinity processing) in manufacturing the organic EL device according to this invention.

Then, in the ink-affinity step, plasma processing ($O_2$ plasma processing) is carried out in open air (outside air) with oxygen as a processing gas. As a result of this $O_2$ plasma processing, ink-affinity processing is carried out, as shown in FIG. 3, on the electrode surface 511a of the pixel electrode 511, on the wall surfaces of the first laminated portion 512e of the inorganic-matter bank layer 512a and of the upper opening portion 512d of the organic-matter bank layer 512b, and on the upper surface 512f. As a result of this ink-affinity processing, hydroxyl group is introduced into each of these surfaces to thereby give them ink-affinity properties. Those portions which are subjected to the ink-affinity processing are shown by one-dot line.

Figure 4:
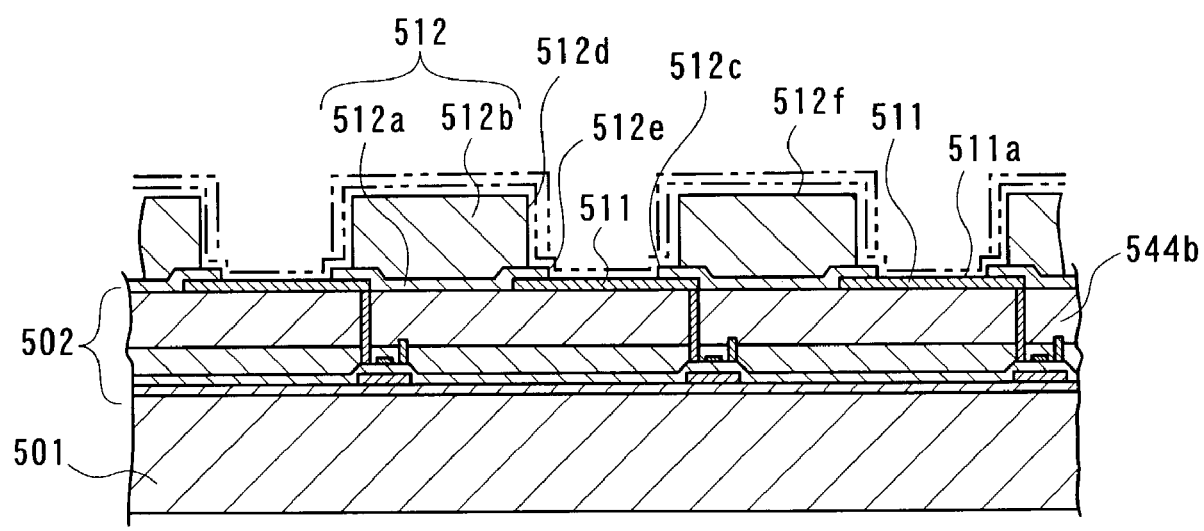
FIG. 4 is a sectional view showing the step of plasma processing (water-repellency processing) in manufacturing the organic EL device according to this invention.

In the subsequent ink-repellency processing step, plasma processing is carried out in the atmosphere of open air with methane tetrafluoride ($CF_4$) as the processing gas ($CF_4$ plasma processing). As a result of $CF_4$ plasma processing, as shown in FIG. 4, the wall surface of the upper opening portion 512d and the upper surface 512f of the organic-matter bank layer are subjected to ink-repellency processing. As a result of this ink-repellency processing, fluorine group is introduced into each of the surfaces to thereby give them ink-repellency properties. In FIG. 4, the regions showing the ink-repellency properties are shown by two-dot line.

In the subsequent cooling step, the substrate 501 heated by the plasma processing is cooled down to room temperature or to the control temperature for the ink jet step (liquid droplet ejecting step). By thus cooling the plasma-processed substrate 501 down to the room temperature or to the predetermined temperature (e.g., to the control temperature at which the ink jet step is carried out), the subsequent hole injection/transport layer forming step can be carried out at a given temperature.

Then, in the light emitting element forming step, the hole injection/transport layer and a light emitting layer are formed on the pixel electrode 511, thereby forming a light emitting element. The light emitting element forming step is made up of the following four steps: i.e., a first liquid droplet ejection step in which a first composition of matter for forming the hole injection/transport layer is ejected onto each of the pixel electrodes; a hole injection/transport layer forming step in which the ejected first composition of matter is dried to thereby form the hole injection/transport layer on the pixel electrodes; a second liquid droplet ejection step in which a second composition of matter for forming the light emitting layer is ejected onto the hole injection/transport layer; and a light emitting layer forming step in which the ejected second composition of matter is dried to thereby form a light emitting layer on the hole injection/transport layer.

First, in the first liquid droplet ejection step, the first composition of matter inclusive of the material for forming the hole injection/transport layer is ejected onto the electrode surface 511a by ink jet method (liquid droplet ejection method). This first liquid droplet ejection step and the subsequent steps shall preferably be carried out in an atmosphere of an inert gas such as argon gas, or the like, free from water and oxygen. In case the hole injection/transport layer is formed only on the pixel electrodes, the hole injection/transport layer to be formed adjacent to the organic-matter bank layer is not formed.

As shown in FIG. 5, the first composition of matter inclusive of the material for the hole injection/transport layer is filled into an ink jet head (a function liquid droplet ejection head) H. An ejection nozzle of the ink jet head H is caused to face the pixel electrode surface 511a which is positioned inside the lower opening portion 512c. While moving the ink jet head H and the substrate 501 relative to each other, the first composition of matter 510c whose amount of liquid per a droplet is kept under control is ejected from the ejection nozzle toward the electrode surface 511a.

As the first composition of matter to be used here, there may be employed a composition formed by dissolving a mixture of a polythiophene derivative, such as poly(ethylene-dioxy)tiophene (PEDOT), and poly(tyrene sulphonicacid) (PSS), or the like, in a polar solvent. As the polar solvent, there may be mentioned glycol ethers, such as isopropyl alcohol (IPA), normal butanol, ?-utyrolactone, N-methylpyrrolidone (NMP), 1,3 dimethyl-2-imidazolidinone (DMI) and derivatives thereof, carbitol acetate, and butylcarbitol acetate. It should be noted that as the hole injection/transport layer-forming material, there may be used the same material for each of the light emitting layers 510b of red color (R), green color (G), and blue color (B), and also there may be used different materials for the respective light emitting layers.

As shown in FIG. 5, the ejected first composition of matter 510 spreads or extends over the ink-affinity processed electrode surface 511a and over the first laminated portion 512e is filled into the lower and upper opening portions 512c, 512d. The amount of the first composition of matter to be ejected onto the electrode surface 511a is determined by the thickness of the hole injection/transport layer, the concentration of the material for forming the hole injection/transport layer in the first composition of matter, or the like. The first composition of matter 510c may be ejected toward the same electrode surface 511a not only in one time but also in several times.

Figure 6:
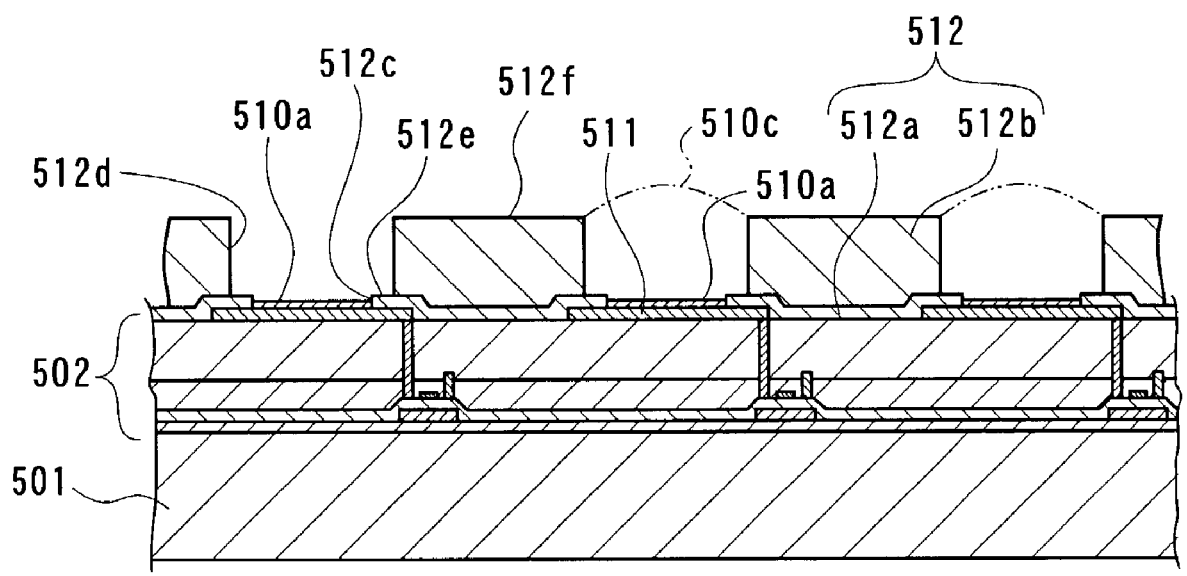
FIG. 6 is a sectional view showing the step of forming the hole injection layer (drying) in the method of manufacturing the organic EL device according to this invention.

As shown in FIG. 6, in the hole injection/transport layer forming step, the ejected first composition of matter is subjected to the processing of drying and heat treatment. The polar solvent contained in the first composition of matter is thus evaporated and the hole injection/transport layer 510a is formed. By carrying out the drying processing, the evaporation of the polar solvent contained in the first composition of matter 510c occurs in portions which are close to the inorganic-matter bank layer 512a and the organic-matter bank layer 512b and, consequently, not only is the polar solvent evaporated but also is the hole injection/transport layer forming material condensed and deposited.

As a result, as shown in FIG. 6, the evaporation of the polar solvent occurs also on the electrode surface 511a by the drying processing. A flat portion 510a which is made up of the hole injection/transport layer forming material is thus formed on the electrode surface 511a. Since the speed of evaporation of the polar solvent on the electrode surface 511a is approximately uniform, the material to form the hole injection/transport layer 511a is uniformly condensed on the electrode surface 511a, whereby the flat portion 510a of a uniform thickness is formed.

In the subsequent second liquid droplet ejection step, the second composition of matter containing the light emitting layer forming material is ejected by the ink jet method (liquid droplet ejection method). In this second liquid droplet ejection step, non-polar solvent which is insoluble to the hole injection/transport layer 510a is used as a solvent for the second composition of matter which is used in forming the light emitting layer, in order to prevent the hole injection/transport layer 510a from getting dissolved again.

On the other hand, since the hole injection/transport layer 510a is low in affinity to the non-polar solvent, the hole injection/transport layer 510a and the light emitting layer 510b cannot be adhered to each other or the light emitting layer 510b cannot be uniformly coated even if the second composition of matter containing the non-polar solvent is ejected onto the hole injection/transport layer 510a. As a solution, in order to enhance the surface affinity of the hole injection/transport layer 510a to the non-polar solvent and the light emitting layer forming material, it is preferable to carry out the surface modification step before forming the light emitting layer.

Therefore, a description will first be made about the surface modification step. The surface modification step is carried out by coating the hole injection/transport layer 510a with a solvent that is the same as the non-polar solvent in the first composition of matter or with a solvent which is similar thereto, by the ink jet method (liquid droplet ejection method), spin coating method, or dip coating method and, thereafter, drying it.

Figure 7:
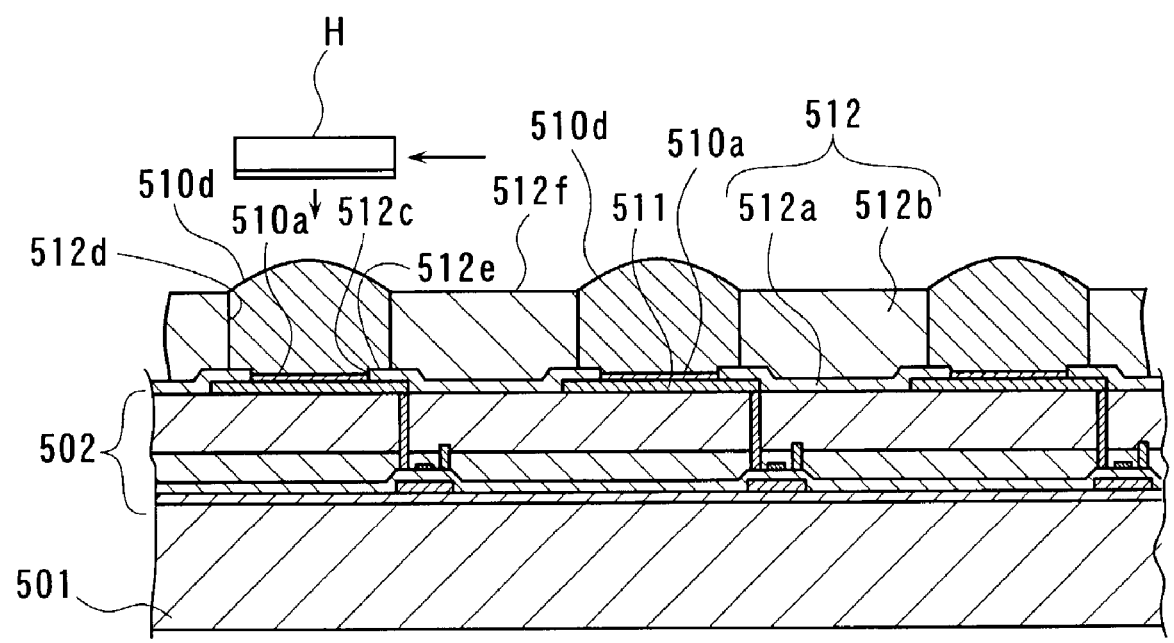
FIG. 7 is a sectional view showing the step of surface modification (droplet ejection) in the method of manufacturing the organic EL device according to this invention.
Figure 8:
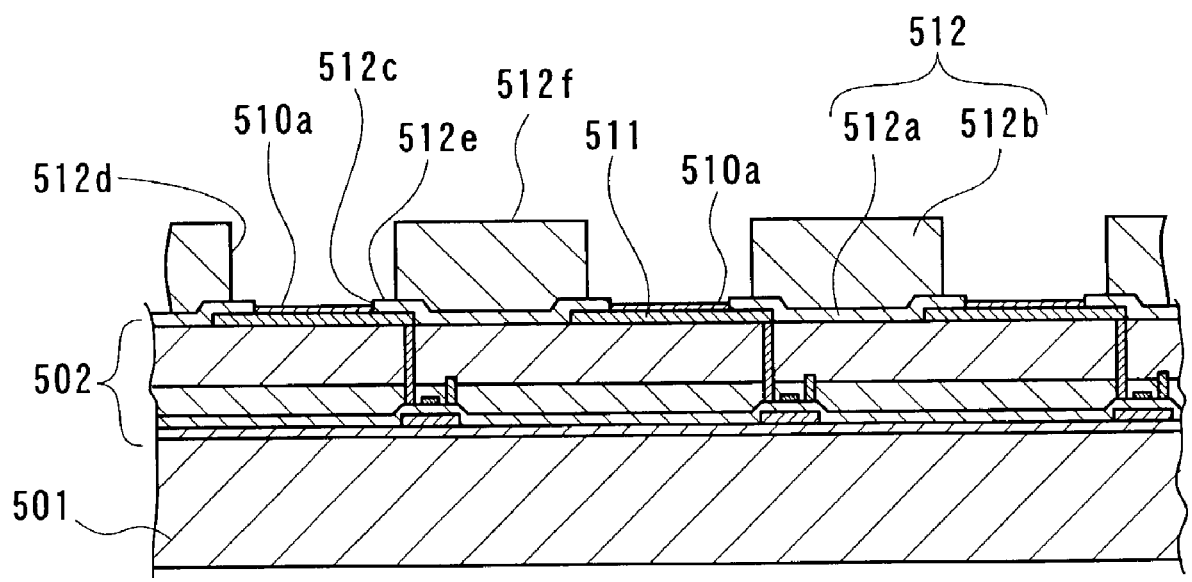
FIG. 8 is a sectional view showing the step of surface modification (drying) in the method of manufacturing the organic EL device according to this invention.

For example, the coating by the ink jet method is carried out in the following manner as shown in FIG. 7. Namely, the ink jet head H is filled with a surface modification solvent. The ejection nozzle of the ink jet head H is caused to face the substrate (i.e., the substrate on which the hole injection/transport layer 510a has been formed). While moving the ink jet head H and the substrate 501 relative to each other, the surface modification solvent 510d is ejected from the ejection nozzle H. Then, as shown in FIG. 8, the surface modification solvent 510d is dried.

Figure 9:
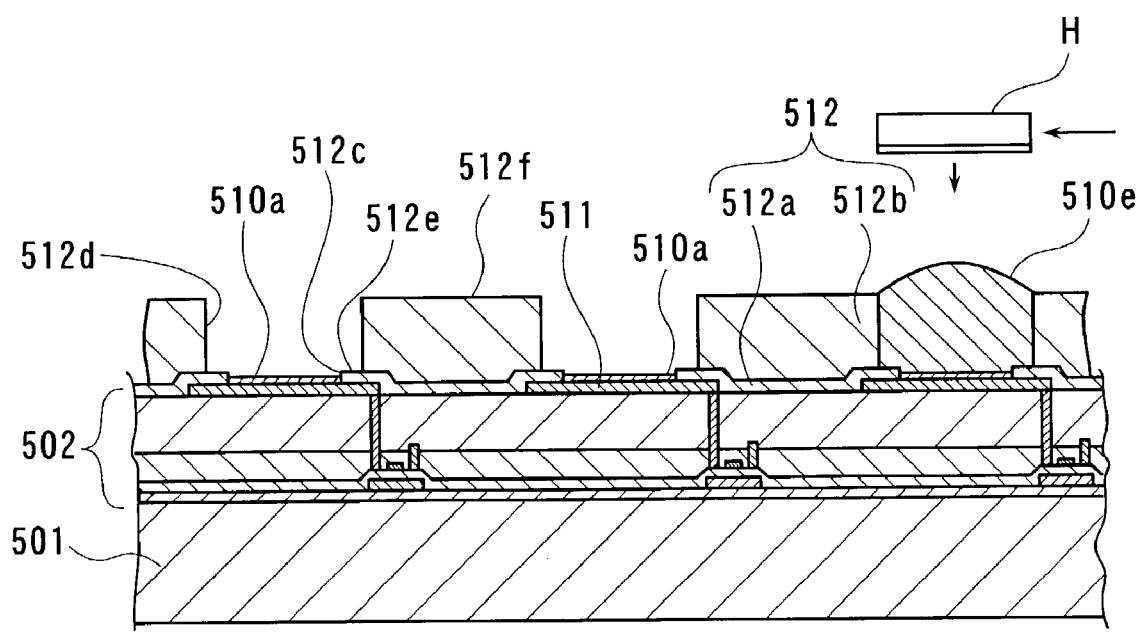
FIG. 9 is a sectional view showing the step of blue color (B) light emitting layer forming in the method of manufacturing the organic EL device according to this invention.

Then, in the second liquid droplet ejection step, the second composition of matter inclusive of the light emitting layer forming material is ejected by the ink jet method (liquid droplet ejection method) onto the hole injection/transport layer 510a. As shown in FIG. 9, the ink jet head H is filled with the second composition of matter containing the blue color (B) light emitting layer forming material. The ejection nozzle of the ink jet head H is caused to face the hole injection/transport layer 510a which is positioned inside the lower and upper opening portions 512c, 512d. While moving the ink jet head H and the substrate 501 relative to each other, the second composition of matter 510e whose amount of flow per each droplet is controlled is ejected from the ejection nozzle onto the hole injection/transport layer 510a As the light emitting layer forming material, there may be used polyfluorene-based high polymer derivatives, (poly)paraphenylene vinylene derivatives, polyphenylene derivatives, polyvinylcarbazole, polythiophene derivatives, perylene-based dyes, coumarin-based dyes, and rhodamine-based dyes. Alternatively, it is possible to use one formed by doping any of the above-described high polymers with an organic EL element. For example, it is possible to use one doped with rubrene, peryene, 9,10-diophenylanthracene, tetraphenylbutadiene, Nile red, Coumarin-6, quinacridon, or the like.

As the non-polar solvent, solvents insoluble to the hole injection/transport layer 510a are preferable, and there may be used, e.g., cyclohexyl benzen, dihydrobenzofuran, trimethylbenzene, tetramethlbenzened, etc. By using such a non-polar solvent for the second composition of the light emitting layer 510b, it is possible to apply the second composition without causing the hole injection/transport layer 510a to be dissolved again.

As shown in FIG. 9, the ejected second composition of matter 510e is spread or extended over the hole injection/transport layer 510a and is filled into the lower and upper opening portions 512c, 512d. The second composition of matter 510e may be ejected onto the hole injection/transport layer 510a not only in one time but also in several times. In this case, the quantity of the second composition of matter in each time of ejection may be the same or may be changed from time to time.

Figure 10:
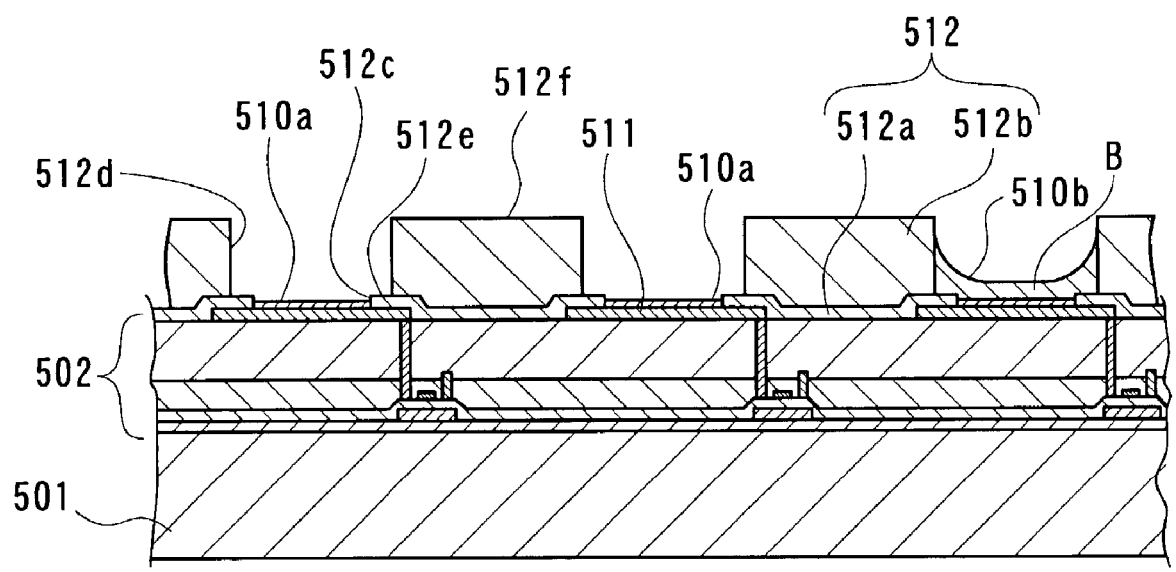
FIG. 10 is a sectional view showing the step of blue color (B) light emitting layer forming (drying) in the method of manufacturing the organic EL device according to this invention.

Then, in the light emitting layer forming step, drying processing and heat treating processing are carried out after the second composition of matter has been ejected, whereby a light emitting layer 510b is formed on the hole injection/transport layer 510a. In the drying processing, the ejected second composition of matter is subjected to drying processing to thereby evaporate the non-polar solvent contained in the second composition of matter. A blue color (B) light emitting layer 510b is thus formed as shown in FIG. 10.

Figure 11:
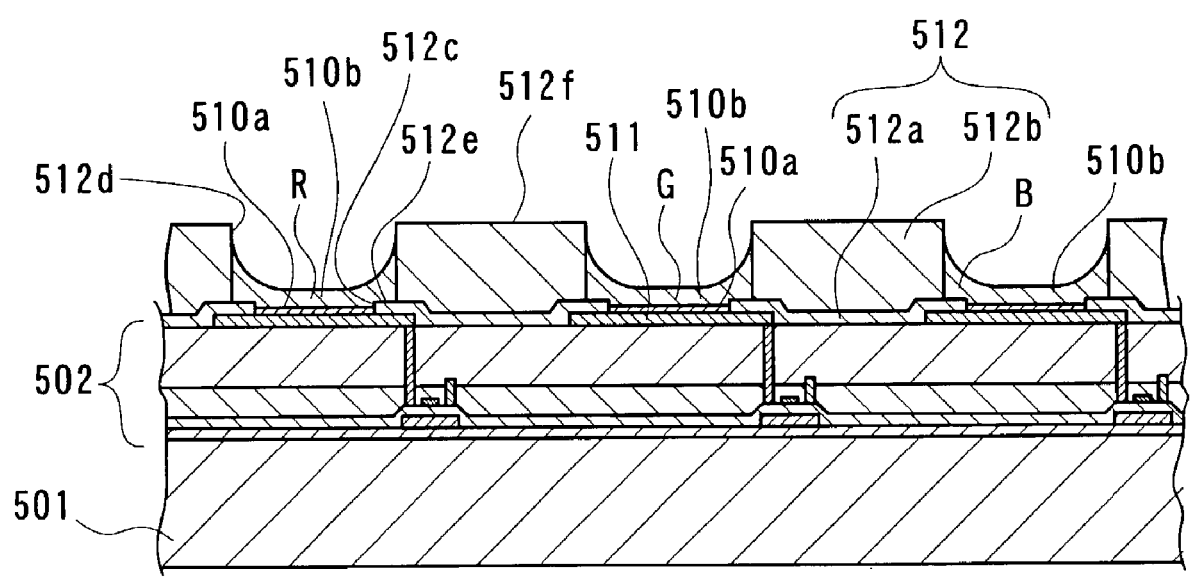
FIG. 11 is a sectional view showing the step of red color (R), green color (G), and blue color (B) light emitting layer forming in the method of manufacturing the organic EL device according to this invention.

Subsequently, as shown in FIG. 11, a red color (R) light emitting layer 510b is formed in the same way as in the case of the blue color (B) light emitting layer 510b. Finally, a green color (G) light emitting layer 510b is formed. It is to be noted that the order of forming the light emitting layers 510b is not limited to the above-described order, but may be arbitrarily determined. For example, it is possible to determine the order of forming the light emitting layers depending on the light emitting layer forming materials.

Figure 12:
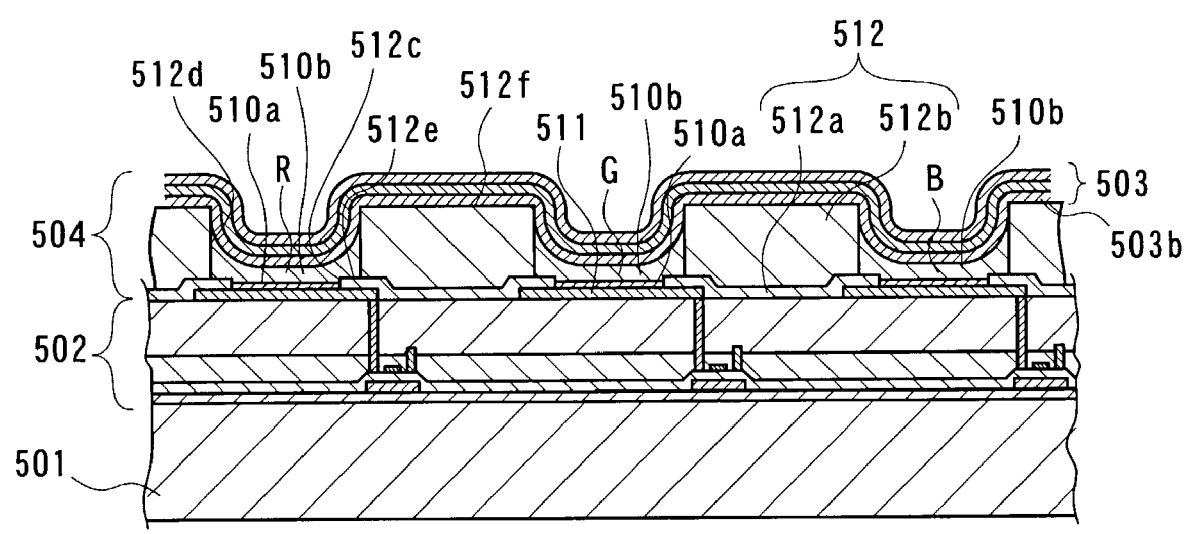
FIG. 12 is a sectional view showing the step of forming opposite electrodes in the method of manufacturing the organic EL device according to this invention.

Thereafter, in the opposed or opposite electrode forming step, a cathode 503 (an opposed electrode) is formed on the entire surface of the light emitting layer 510b and the organic-matter bank layer 512b as shown in FIG. 12. This cathode 503 may be formed by laminating a plurality of materials. For example, on the side close to the light emitting layer, it is preferable to form a material with a small work function. For example, it is possible to use Ca, Ba, or the like. Depending on the material, on some cases, it is better to thinly form LiF, or the like, on a lower layer. It is further preferable to use on the upper side (sealing side) a material with a higher work function than that on the lower layer. These cathodes (cathode layers) 503 are preferably formed by vapor deposition method, sputtering method, chemical vapor deposition (CVD) method, or the like. Particularly, it is preferable to resort to the vapor deposition method in order to prevent the light emitting layer 510b from being damaged by the heat.

Lithium fluoride may be formed only on the light emitting layers 510b, and only on the blue color (B) light emitting layer 510b. In this case, the other red color (R) light emitting layer and green color (G) light emitting layer 510b, 510b will contact the upper cathode layer 503b made from LiF. In addition, on an upper portion of the cathode layer 12, it is preferable to use Al film, Ag film, or the like, which is formed by vapor deposition method, sputtering method, CVD method, or the like. Further, on top of the cathode 503, a protection layer such as of $SiO_2$, SiN, or the like, may be provided for the purpose of prevention of oxidation.

Figure 13:
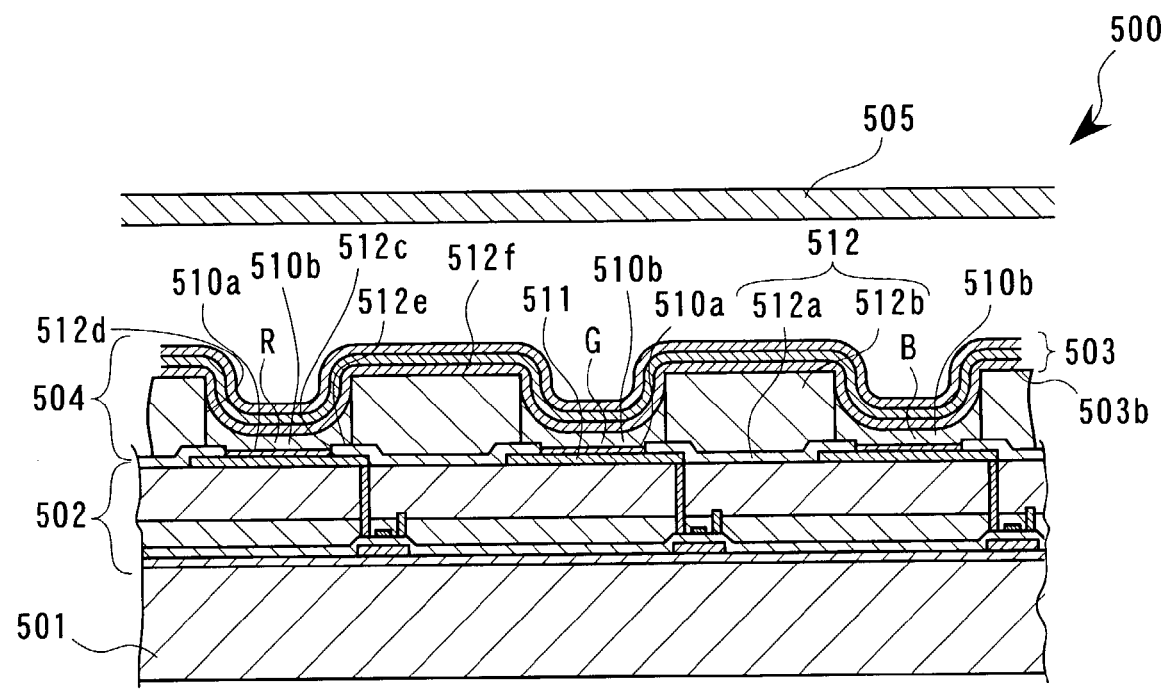
FIG. 13 is a sectional view showing the step of sealing in the method of manufacturing the organic EL device according to this invention.

In the sealing step as shown in FIG. 13, a sealing substrate 505 is laminated on top of the organic EL element 504 in an atmosphere of the inert gas such as of nitrogen, argon, helium, or the like. The sealing step is preferably carried out in the atmosphere of the inert gas of nitrogen, argon, helium, or the like. If the sealing step is carried out in the atmosphere of open air, there is a possibility of penetration of water, oxygen, or the like, into the defect portions if defects such as a pin hole, or the like, are present in the cathode 503. The cathode 503 is thus oxidized, which is not preferable. Finally, the cathode 503 is connected to the wiring of the flexible substrate and the wiring of the driving IC circuit element portion 502 is connected, whereby the organic EL device 500 according to this embodiment is obtained.

A liquid material may be used also in the ink-repellency film, the cathode 503, the pigment electrode 511, or the like, so that they can be formed by the ink jet method.

Description will now be made about the apparatus for manufacturing an organic EL device. As described hereinabove, in the process for manufacturing the organic EL device, the following steps are carried out by ink jet method. Those steps in question are: the hole injection/transport layer forming step (first liquid droplet ejection step+drying step) for forming the hole injection/transport layer (hole injection layer); a surface modification step; and a light emitting layer forming step (second liquid droplet ejection step+drying step) for forming the light emitting layer. Corresponding to the above steps, the apparatus for manufacturing the organic EL device according to this embodiment employs an imaging apparatus (apparatus for making or plotting an image or a picture) which carries out or performs scanning while ejecting light emitting function materials.

Figure 14:
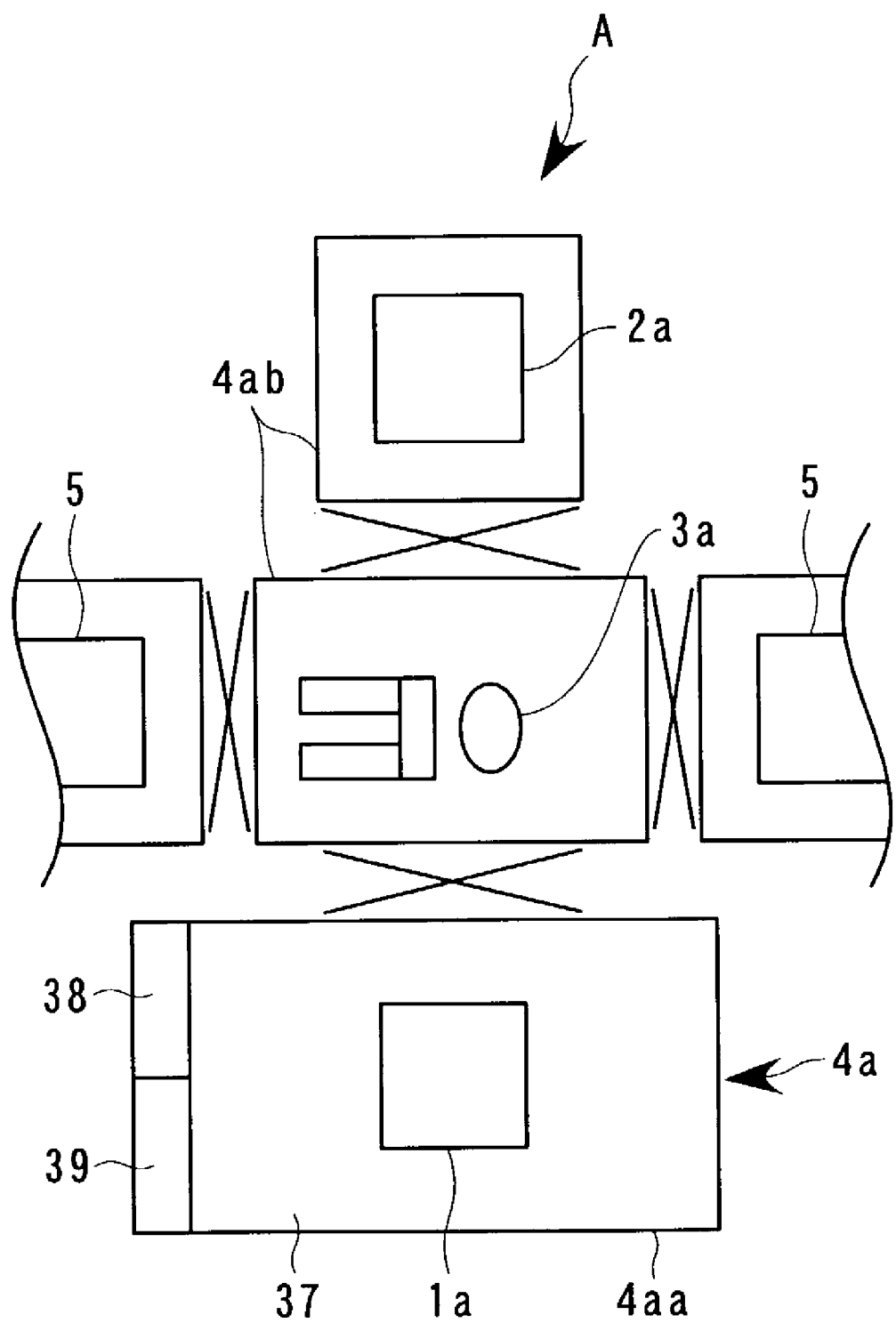
FIG. 14 is a schematic diagram of a hole injection layer forming apparatus according to this invention.

In concrete, as shown in FIG. 14, a hole injection layer forming apparatus A which carries out the hole injection/transport layer forming step (inclusive of the surface modification step, if necessary) is made up of: the above-described imaging apparatus 1a which has mounted thereon function liquid ejection heads for introducing a first liquid droplet (light emitting function material: hole injection layer material); a drying apparatus 2a; a substrate transportation apparatus 3a; as well as a chamber apparatus 4a which contains or houses therein the above apparatuses. As described above, it is preferable to carry out the hole injection/transport layer forming step in the atmosphere of an inert gas. This chamber apparatus 4a is used as a means for carrying out the step therein.

The chamber apparatus 4a is made up of: a main chamber 4aa which contains or houses therein the imaging apparatus 1a; and a subsidiary chamber (sub-chamber) 4ab which contains therein the drying apparatus 2a and the substrate transportation apparatus 3a and which also contains therein in a tunnel shape the connecting portions (transportation paths) for connecting together the above-described chambers. The main chamber 4aa employs a system in which an appropriate or favorable atmosphere is generated therein by causing an inert gas to flow therethrough continuously (details to be described hereinafter). The sub-chamber 4ab employs a system in which an appropriate or favorable atmosphere is generated therein by circulating an inert gas therethrough. In the figure, reference numeral 5 denotes a substrate transfer apparatus.

Figure 15:
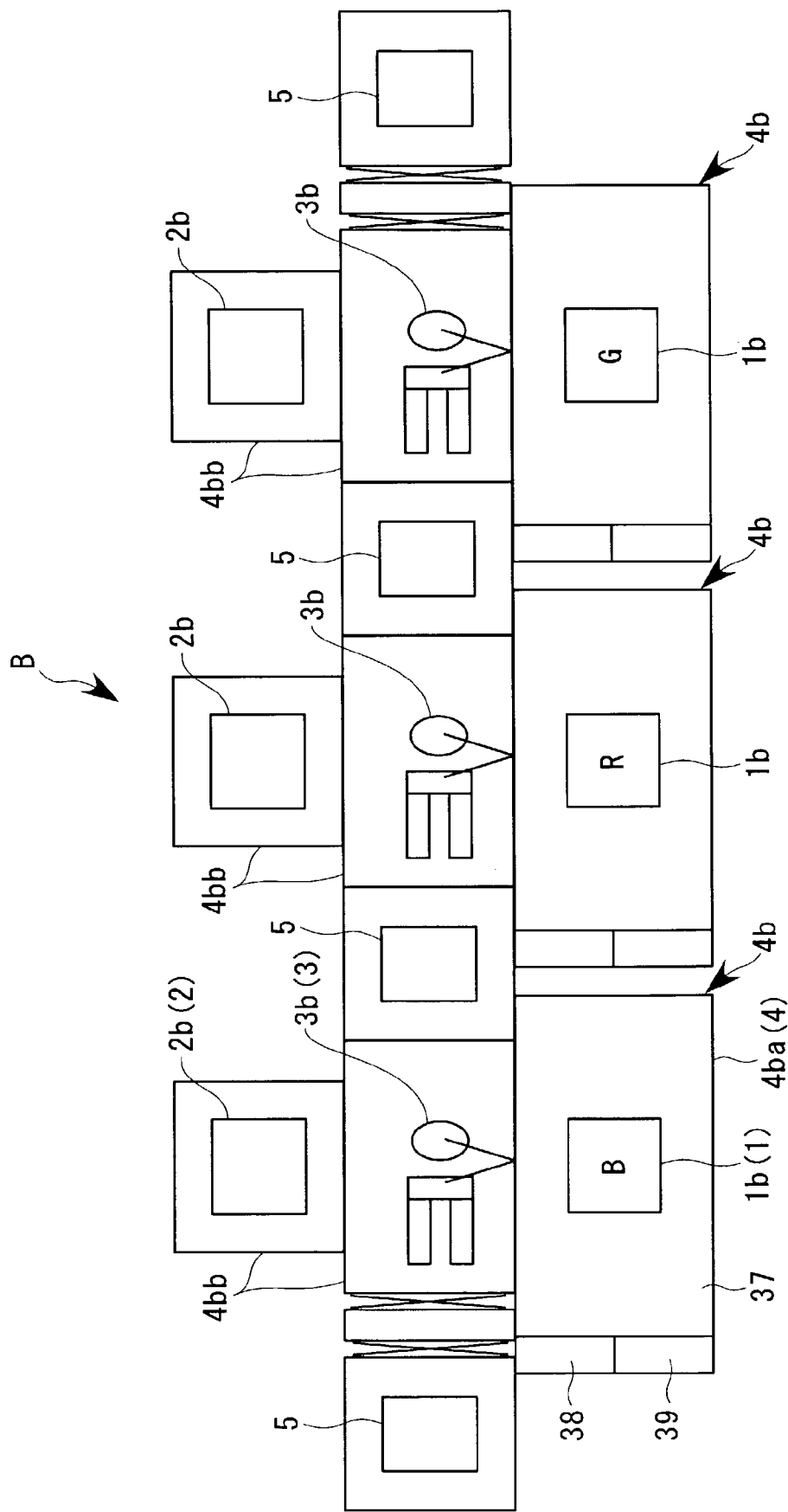
FIG. 15 is a schematic diagram of a light emitting layer forming apparatus according to this invention.

Similarly, as shown in FIG. 15, the light emitting layer forming apparatus B which carries out the light emitting layer forming step is made up of: the above-described imaging apparatus 1b having mounted thereon a function liquid droplet ejection head for introducing a second liquid droplet (light emitting function materials: red·green·blue light emitting layer materials); a drying apparatus 2b; a substrate transportation apparatus 3b, the above-described apparatuses being provided in three sets, one for each of the above-described colors; as well as three sets of chamber apparatuses 4b for respectively containing therein the above-described apparatuses. In the same manner as above, it is preferable to carry out the light emitting layer forming step in the atmosphere of an inert gas. As a means for carrying it out, there is provided the chamber apparatuses 4b. Each of these chamber apparatuses 4b is also made up of: three main chambers 4ba for containing therein respective imaging apparatuses 1b, and three sub-chambers 4bb for containing therein respective drying apparatuses 2b and respective substrate transportation apparatuses 3b and for containing therein the respective connecting portions (transportation paths) for connecting the above apparatuses.

It is to be noted that some parts or elements in the following embodiments are provided in plural numbers instead of only one. In the following detailed descriptions, they will sometimes be referred to in a singular form instead of in a plural form. It is partly for the sake of simplicity, or the like, and shall therefore be understood to include plural form, too, where applicable and appropriate.

The imaging apparatus 1a of the hole injection layer forming apparatus A and the imaging apparatus 1b of the luminescent layer forming apparatus B are different from each other in the light emitting function material to be introduced into the respective function liquid droplet ejection heads and have otherwise the same construction. In addition, the drying apparatuses 2a, 2b, the substrate transportation apparatuses 3a, 3b, and the chamber apparatuses 4a, 4b have respectively the construction that is the same as, or similar to, each other. If the time required for the exchanging of the function liquid ejection heads or the exchanging of the supply systems for the light emitting function materials is left out of consideration, it is thus possible to manufacture an organic EL device in an arbitrary set of apparatuses (imaging apparatus 1, drying apparatus 2, substrate transportation apparatus 3, and chamber apparatus 4).

Therefore, in this embodiment, description is made hereinbelow about the construction of one set of apparatuses on the left end in FIG. 15, i.e., the imaging apparatus 1b for forming a light emitting layer of blue color (B), the drying apparatus 2b, the substrate transportation apparatus 3b, and the chamber apparatus 4b, and the description about the other apparatuses is omitted.

A substrate that has been processed in the above-described bank forming step and the plasma processing step is transported from the substrate transfer apparatus 5 which is located at the left end in FIG. 15 to the substrate transportation apparatus 3 (3b) by means of an apparatus (not illustrated), and is changed therein in its direction and posture for being further transported to the imaging apparatus 1 (1b). The substrate that has been handed over from the substrate transportation apparatus 3 (3b) to the imaging apparatus 1 (1b) is set in position on the imaging apparatus 1 (1b). In the imaging apparatus 1 (1b) a light emitting material (liquid droplet) of blue color is ejected by the function liquid droplet ejection head to a multiplicity of pixel regions (opening portions 512g) in the substrate (second liquid droplet ejection step).

Then, the substrate to which the light emitting material has been coated or adhered is handed over from the imaging apparatus 1 (1b) to the substrate transportation apparatus 3 (3b), and is introduced by the substrate transportation apparatus 3 (3b) into the drying apparatus 2 (2b). In the drying apparatus 2 (2b), the substrate is exposed to a high-temperature atmosphere of an inert gas for a predetermined period of time to thereby evaporate the solvent in the light emitting material (drying step). Here, the substrate is again introduced into the imaging apparatus 1 (1b) to carry out the second liquid droplet ejection step. In other words, the second liquid droplet ejection step and the drying step are repeated for a plurality of times. Once the light emitting layer has attained a desired thickness, the substrate is transported through the substrate transportation apparatus 3 (3b) to the intermediate imaging apparatus 1 (1b) so as to form a light emitting layer of red color (R), and is finally transported to the right end imaging apparatus 1 (1b) to form therein a light emitting layer of green color (G). These steps are carried out in the atmosphere of an inert gas inside the above-described chamber apparatus 4 (4b). It is to be noted here that the order of forming each of the blue, red and green colors may be arbitrarily selected.

Detailed descriptions about the drying apparatus 2 and the substrate transportation apparatus 3 are omitted. It is, however, to be noted that the drying apparatus 2, for example, shall preferably employ a system of using a hot plate or a lamp (infrared lamp), aside from a blow drying system in which an inert gas is blown, a vacuum drying system, or the like. The drying temperature shall preferably be set to 40° C. through 200° C.±2° C.

Detailed description will now be made about the imaging apparatus 1 and the main chamber (chamber means) 4 which constitute the main portion of this invention. The imaging apparatus 1 is made up, as shown in FIGS. 16 through 19, of a liquid droplet ejection apparatus (liquid droplet ejection means) 10 and an auxiliary apparatus 11. The auxiliary apparatus 11 is made up of: a function liquid supply and recovery apparatus 13 which supplies the liquid droplet ejection apparatus 10 with a light emitting function material (light emitting material: function liquid) and which also recovers the function liquid that has become useless (that has been put out of service); an air supply apparatus 14 which supplies each of the constituting parts with compressed air for use in driving-controlling, or the like; a vacuum suction apparatus 15 which sucks air; and a maintenance apparatus 16 which is used for maintenance of the function liquid droplet ejection head 7 (to be described in detail hereinafter).

The liquid droplet ejection apparatus 10 is made up of: a supporting rack 21 disposed on a floor; a stone base 22 disposed on the supporting rack 21; an X-axis table 23 disposed on the stone base 22 and a Y-axis table 24 which crosses the X-axis table 23 at a right angle; a main carriage 25 disposed in a manner to be suspended from the Y-axis table 24; and a head unit 26 mounted on the main carriage 25. The head unit 26 has mounted thereon a plurality of function liquid droplet ejection heads 7 through a subsidiary carriage (carriage) 41 (details are given hereinafter). To correspond to these plurality of function liquid droplet ejection heads 7, a substrate (an object to which the function liquid droplet is ejected) W is set in position on a suction table 81 of the X-axis table 81.

The liquid droplet ejection apparatus 10 of this embodiment has a construction in which the substrate W is moved in a manner synchronized with the driving of the function liquid droplet ejection heads 7 (selective ejection of the function liquid droplet). The so-called main scanning of the function liquid droplet ejection heads 7 is carried out by the reciprocating (back and forth) movements of the X-axis table 23 in the X-axis direction. The so-called subsidiary scanning (sub-scanning) in correspondence to the main scanning is carried out by the reciprocating (back and forth) movements of the function liquid droplet ejection heads 7 in the Y-axis direction by the Y-axis table 24. It is of course possible to carry out the main scanning only by the forward movement (or by the backward movement) in the X-axis direction.

Figure 17:
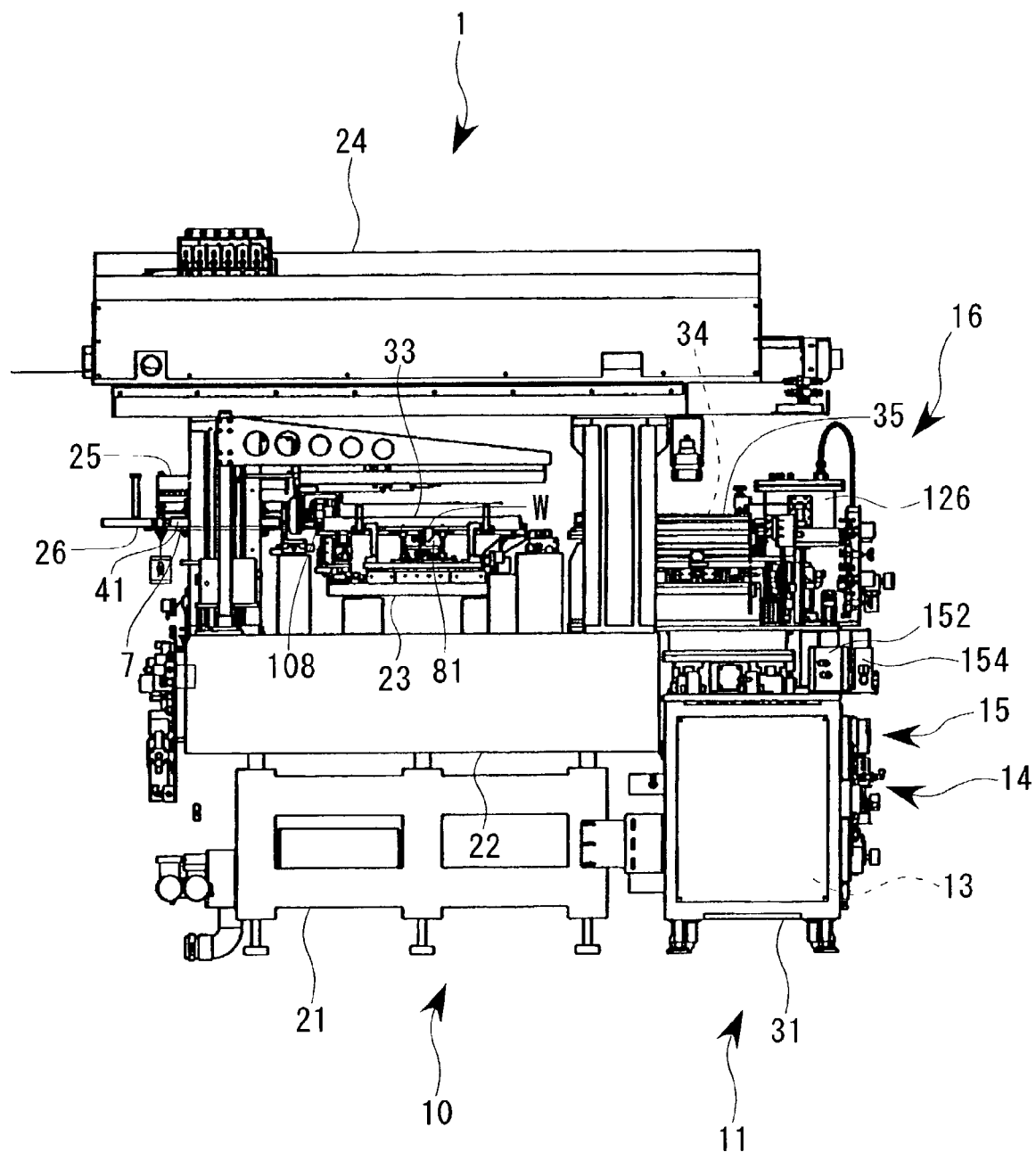
FIG. 17 is a front view showing an outside of the imaging apparatus according to this invention.
Figure 18:
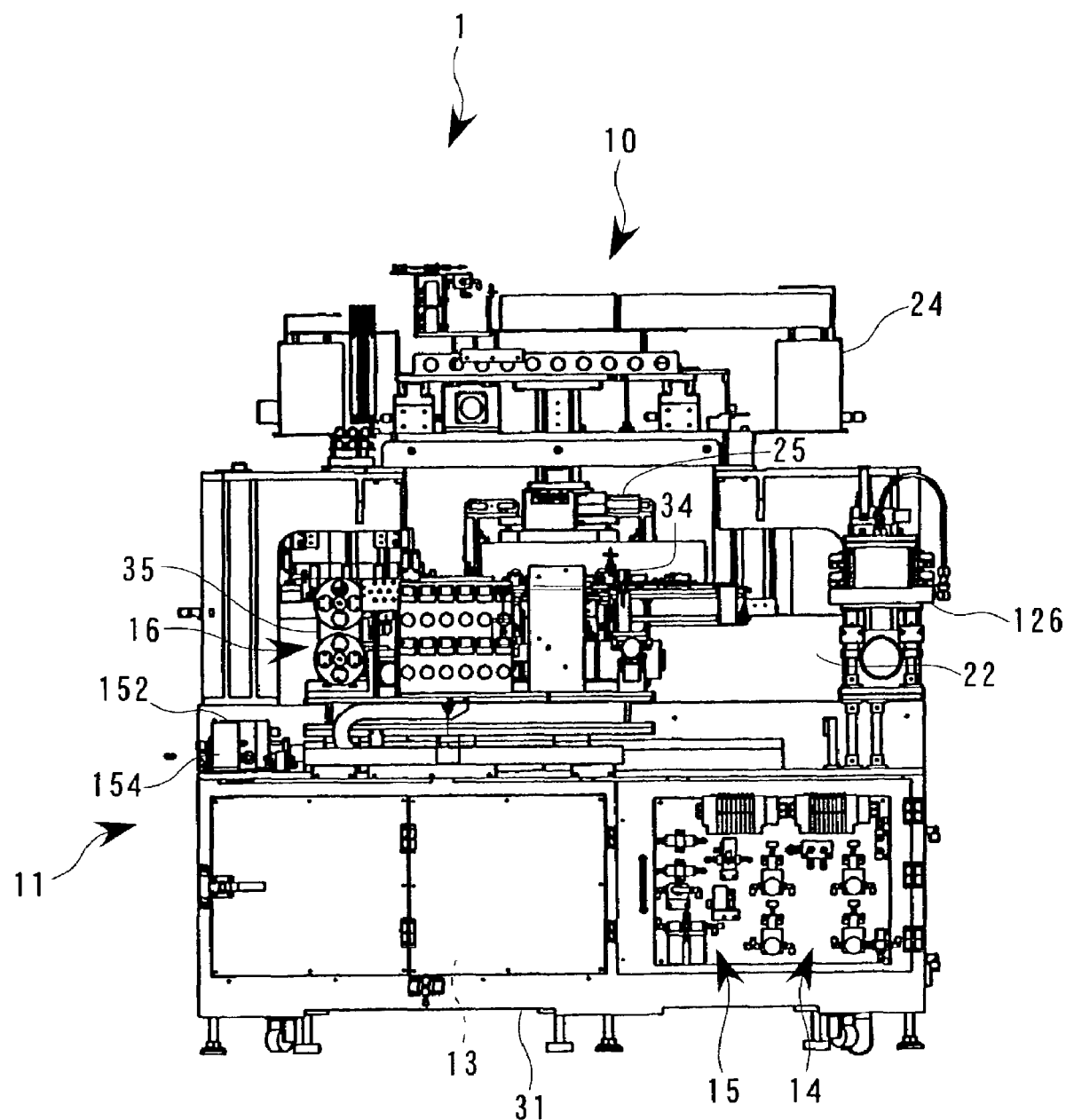
FIG. 18 is a side view showing an outside of the imaging apparatus according to this invention.
Figure 19:
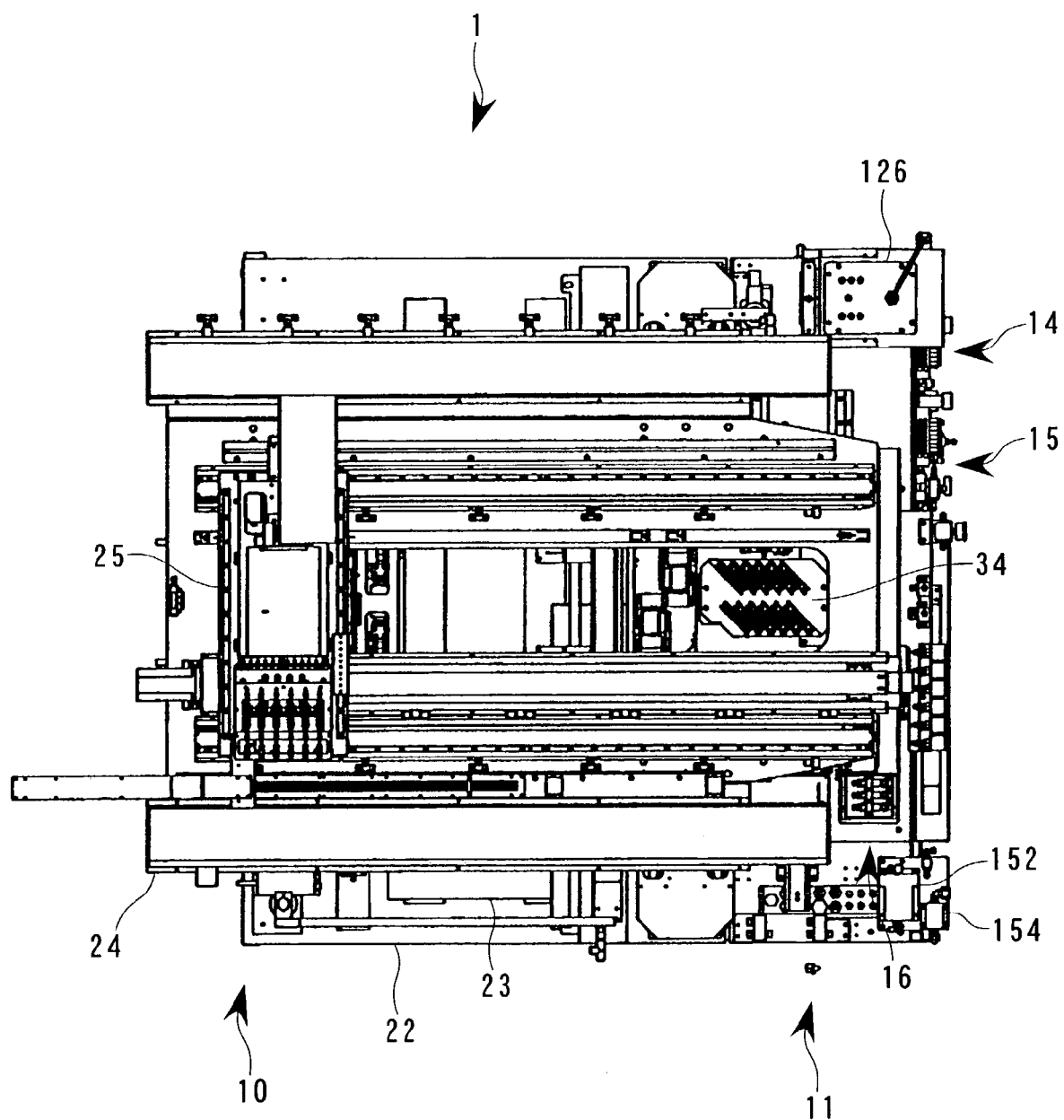
FIG. 19 is a plan view showing an outside of the imaging apparatus according to this invention.

On the other hand, the home position of the head unit 26 is defined to be in the left end position as seen in FIGS. 17 and 19. From the left side of this liquid droplet ejection head 10, the head unit 26 is brought into or replaced (details will be given hereinafter). To this side (i.e., to the side of the viewer) of the figure, the above-described substrate transportation apparatus 3 faces, and the substrate W is carried into or carried out from this side of the figure. To the right side, as seen in the figure, of the liquid droplet ejection apparatus 10, there are integrally disposed main constituting apparatuses of the above-described auxiliary apparatus 11.

The auxiliary apparatus 11 is made up of: a common machine base 31 of a cabinet style; the air supply apparatus 14 and the vacuum suction apparatus 15 which are contained or housed inside one half of the common machine base 31; the above-described function liquid supply and recovery apparatus 13 which is contained in the other one half of the common machine base 31; and the above-described maintenance apparatus 16 which contains the main constituting apparatuses on the common machine base 31.

The maintenance apparatus 16 is made up of: a large and a small, i.e., a total of two, flushing units 33 in which the function liquid droplet ejection heads 7 are subjected to regular flushing operation (ejection work to discard the function liquid from all of the ejection nozzles); a cleaning unit 34 which carries out the suction and keeping of the function liquid from the function liquid droplet ejection heads 7; and a wiping unit 35 which wipes out the nozzle forming surfaces of the function liquid droplet ejection heads 7. The cleaning unit 34 and the wiping unit 35 are disposed on the common machine base 31. The smaller flushing unit 33A is disposed near the substrate W and the larger flushing unit 33B is disposed near the home position of the head unit 26 (detailed description will be made hereinafter).

The main chamber 4 is made in the form of a so-called clean room, as shown in FIGS. 14 and 15, which has disposed in a chamber room 37 an electrical room 38 and a mechanical room 39 in a side by side relationship. The chamber room 37 is filled with nitrogen gas which is an inert gas. The above-described liquid droplet ejection apparatus 10 and the auxiliary apparatus 11 are exposed to the atmosphere of nitrogen gas as a whole and are operated in the atmosphere of nitrogen gas.

Figure 20:
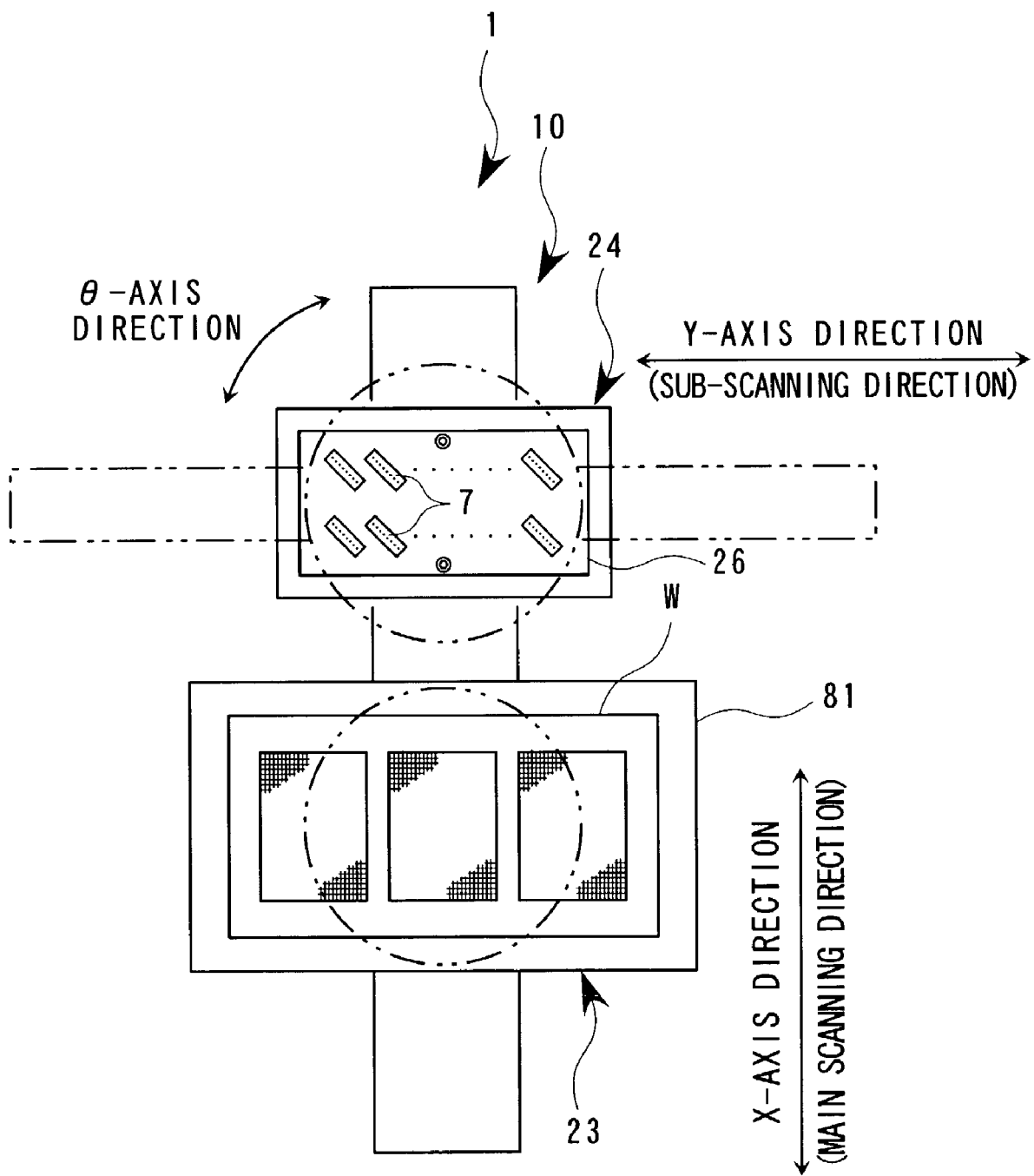
FIG. 20 is a schematic diagram showing a liquid droplet ejection apparatus of the imaging apparatus according to this invention.

Here, with reference to a schematic diagram in FIG. 20, a brief description will be made about the series of operations of the imaging apparatus 1 which operates in the atmosphere of nitrogen gas. First, as a preparatory step, the head unit 26 is brought into the liquid droplet ejection apparatus 10 and is set in position on the main carriage 25. Once the head unit 26 has been set in position on the main carriage 25, the Y-axis table 24 moves the head unit 26 to a position of a head recognition camera (not illustrated) to thereby recognize the position of the head unit 26 by means of a head recognition camera. Based on the result of this recognition, the head unit 26 is corrected in respect of a Θ axis, and the head unit 26 is subjected to a positional correction in respect of the X-axis direction and the Y-axis direction in terms of data. After the positional correction, the head unit 26 (main carriage 25) returns to the home position.

On the other hand, once the substrate W (in this case, each of the substrates to be introduced) is introduced into the suction table 81 of the X-axis table 23, a main substrate recognition camera 90 (to be described in detail hereinafter) recognizes the position of the substrate at that position (the position of handing over and receiving). Based on the result of this recognition, the substrate W is corrected in respect of the Θ axis, and a positional correction of the substrate W in respect of the X-axis direction and the Y-axis direction is carried out in terms of the data. After the positional correction, the substrate W (suction table 81) returns to the home position. For the purpose of an initial adjustment of the X-axis table 23 and the Y-axis table 24 (so-called center alignment), an alignment mask is introduced onto the suction table 81 to thereby carry out the initial adjustment by means of a subsidiary substrate recognition camera 108 which is described in detail hereinafter.

Once the preparations have been finished as described above, in the actual liquid droplet ejection operation, the X-axis table 23 is first driven to thereby move the substrate W back and forth in the main scanning direction. The plurality of function liquid droplet ejection heads 7 are also driven to thereby carry out the selective ejection operation of the function liquid droplets toward the substrate W. After the substrate W has returned, the Y-axis table 24 is then driven to thereby move the head unit 26 by one pitch in the subsidiary scanning direction. In this manner, the back and forth movements of the substrate W and the driving of the function liquid droplet ejection head are carried out again. By repeating these operations several times, the liquid droplets can be ejected from end to end over the entire region of the substrate W.

In this embodiment, the substrate W which is the object to which the function liquid droplet ejection is made is moved in the main scanning direction (X-axis direction) relative to the head unit 26. It may also be arranged that the head unit 26 is moved in the main scanning direction. Or else, there may be employed an arrangement in which the head unit 26 is fixed and in which the substrate W is moved in the main scanning direction and in the subsidiary scanning direction.

Then, a description will now be made about the arrangement of the liquid droplet ejection apparatus 10, the auxiliary apparatus 11 and the main chamber 4. Before proceeding further, in order to facilitate the understanding, a detailed description will be made about the head unit 26 which constitutes the main portion of the liquid droplet ejection apparatus 10.

FIGS. 21 through 24 are arrangement drawings of the head unit. As shown therein, the head unit 26 is made up of: a subsidiary carriage (sub-carriage) 41; a plurality of (twelve) function liquid droplet ejection heads 7 which are mounted on the sub-carriage 41; and a plurality of (twelve) head holding members 42 for mounting each of the function liquid droplet ejection heads 7 on the sub-carriage 41. Twelve function liquid droplet ejection heads 7 are divided into right and left groups of six each and are disposed at a predetermined angle to the main scanning direction.

The six function liquid droplet ejection heads 7 of one group are disposed at a positional deviation, in the sub-scanning direction, relative to the six function liquid droplet ejection heads 7 of the other group. In this manner, all of the ejection nozzles 68 (to be described in detail hereinafter) of the twelve function liquid droplet ejection heads 7 are continuous (partly overlapped) in the sub-scanning direction. In other words, the head arrangement in this embodiment is such that, on the sub-carriage 41, six function liquid droplet ejection heads 7 disposed at an angle in the same direction are provided in two rows and that the function liquid droplet ejection heads 7 in one of the head rows are disposed at 180° rotation relative to the other of the head rows of the function liquid droplet ejection heads 7.

The above-described arrangement pattern is only one example. The adjoining function liquid droplet ejection heads 7 within one head row may be disposed at an angle of 90° relative to each other, or else the function liquid droplet ejection heads 7 of one head row may be disposed at an angle of 90° relative to the function liquid droplet ejection heads of the other head row. In any way, as long as the dots by all of the ejection heads 68 of the twelve function liquid droplet ejection heads 7 are continuous in the sub-scanning direction, they serve the purpose.

In addition, if the function liquid droplet ejection heads 7 are made to be parts for exclusive use by each kind of substrate W, it is not necessary to take the trouble of setting the function liquid droplet ejection heads 7 at an inclination. Instead, it is sufficient to arrange them in a staggered or stepped manner. In more detail, as long as a nozzle array (dot array) of a predetermined length can be constituted, they may be constituted by a single function liquid droplet ejection head 7 or by a plurality of function liquid droplet ejection heads 7. It follows that the number of the function liquid droplet ejection heads 7 and the number of the rows, as well as the arrangement pattern may be arbitrarily selected.

The sub-carriage 41 is made up of: a main body plate 44 which is substantially square in shape and partly notched; a pair of left and right standard or reference pins 45, 45 which are provided in an intermediate position as seen in the long side of the main body plate 44; a pair of left and right supporting members 46, 46 which are attached to both the long sides of the main body plate 44; and a pair of left and right handles 47, 47 which are provided at an end of each of the supporting members 46. The left and right handles 47, 47 serve as members for holding the head unit 26 when an assembled head unit 26, for example, is mounted onto the above-described liquid droplet ejection apparatus 10. The left and right supporting members 46, 46 serve as members for fixing the sub-carriage 41 to the setting portion of the liquid droplet ejection apparatus 10 (details thereof will be described hereinafter). Further, the pair of the standard pins 45, 45 serve as the standard for positioning (positionally recognizing) the sub-carriage (head unit 26), based on the image recognition, in the X-axis, Y-axis, and the Θ-axis directions.

Figure 22:
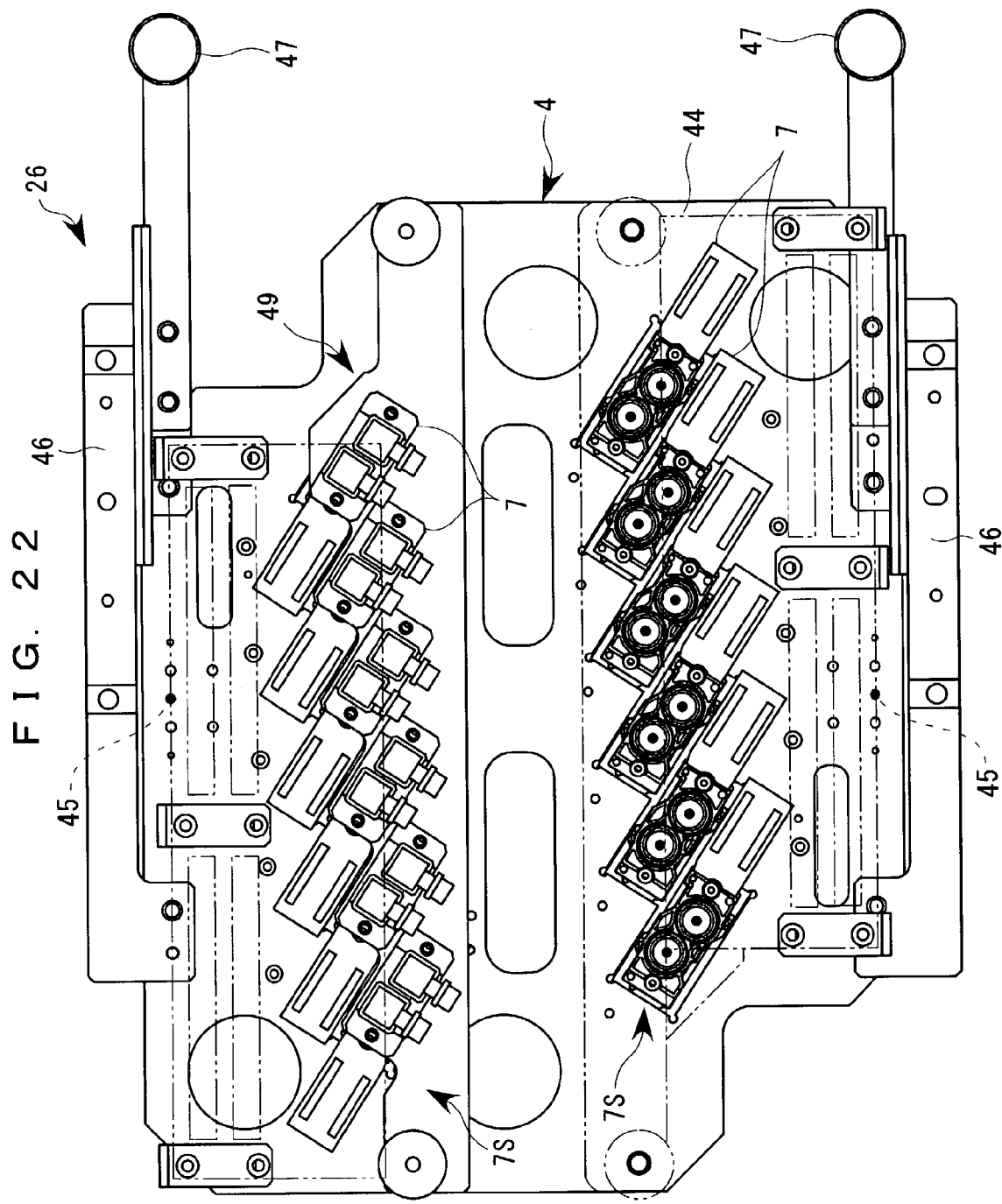
FIG. 22 is a plan view of the head unit of the liquid droplet ejection apparatus according to this invention.

The sub-carriage 41 is further provided, on an upper side of the divided function liquid droplet ejection head groups 7S, with a pair of left and right pipe (or tube) connection assemblies 49, 49 and left and right cable (or wire) connection assemblies 50, 50 which are to be connected to the function liquid droplet ejection heads 7. Each of the cable connection assemblies 50 is connected to the control apparatus (head driver, not illustrated) of the imaging apparatus 1. FIG. 22 is drawn by omitting one (left side) of the pipe connection assemblies 49.

Figure 21:
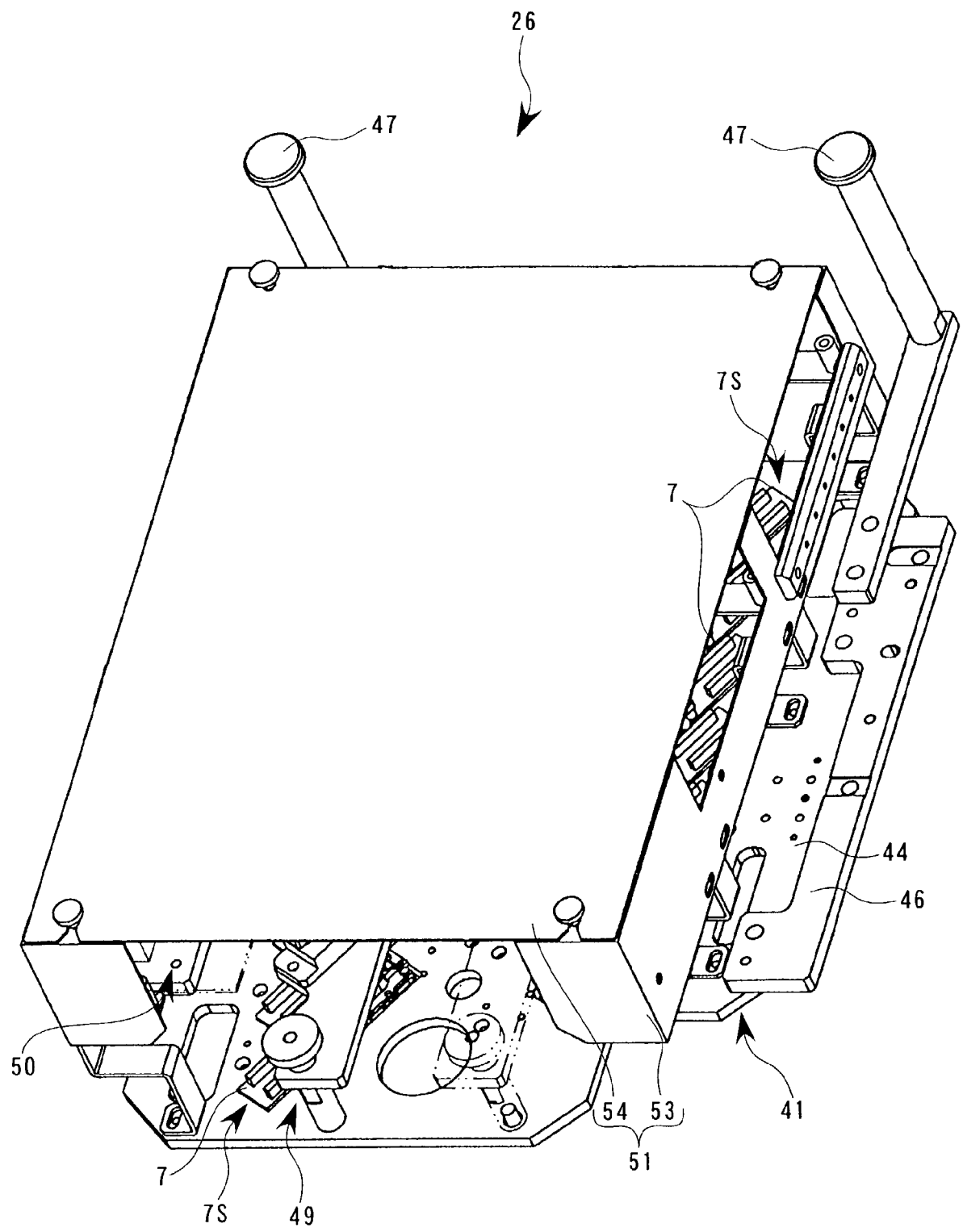
FIG. 21 is an overall perspective view of a head unit of the liquid droplet ejection apparatus according to this invention.
Figure 23:
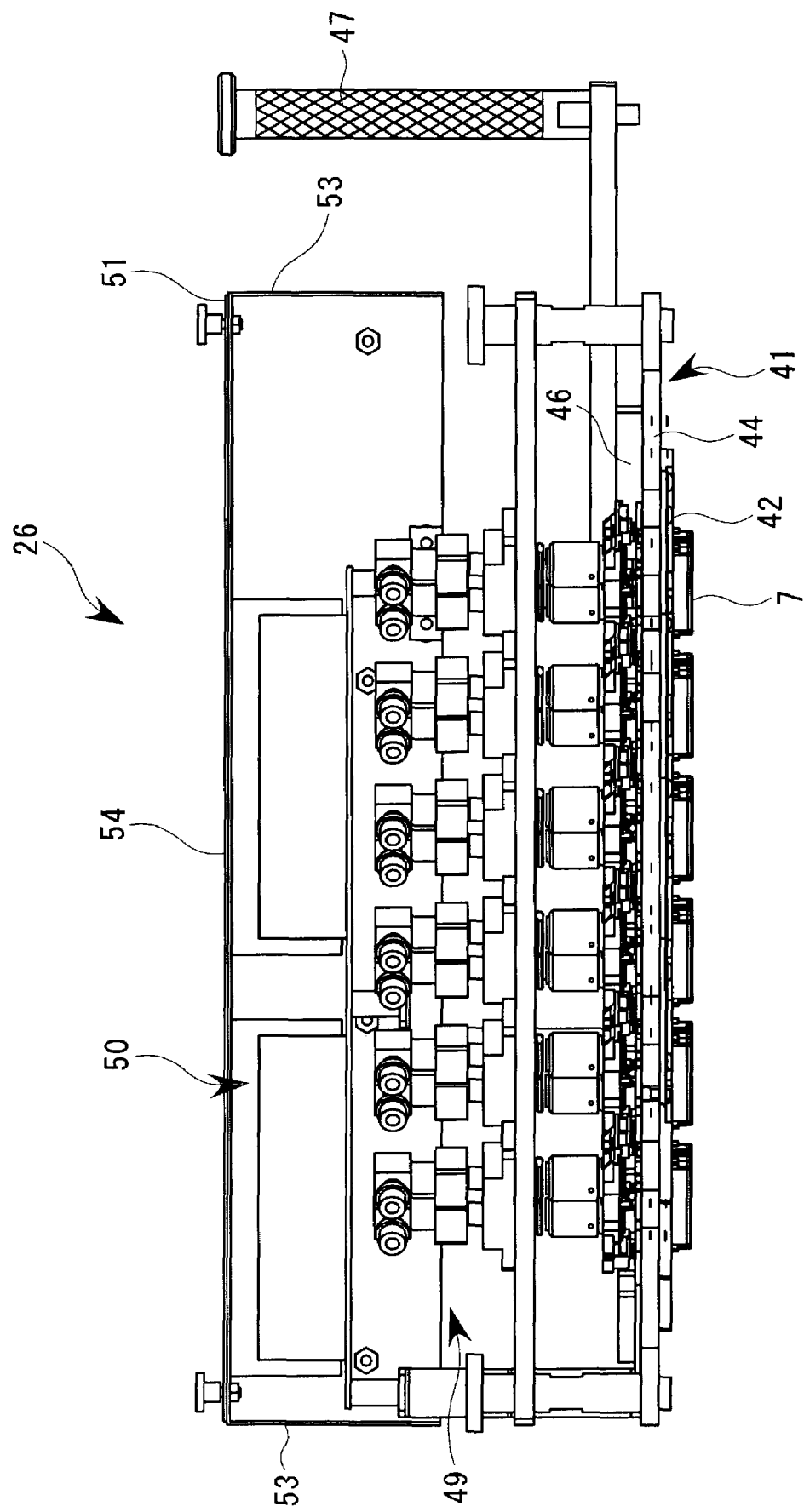
FIG. 23 is a side view of the head unit of the liquid droplet ejection apparatus according to this invention.
Figure 24:
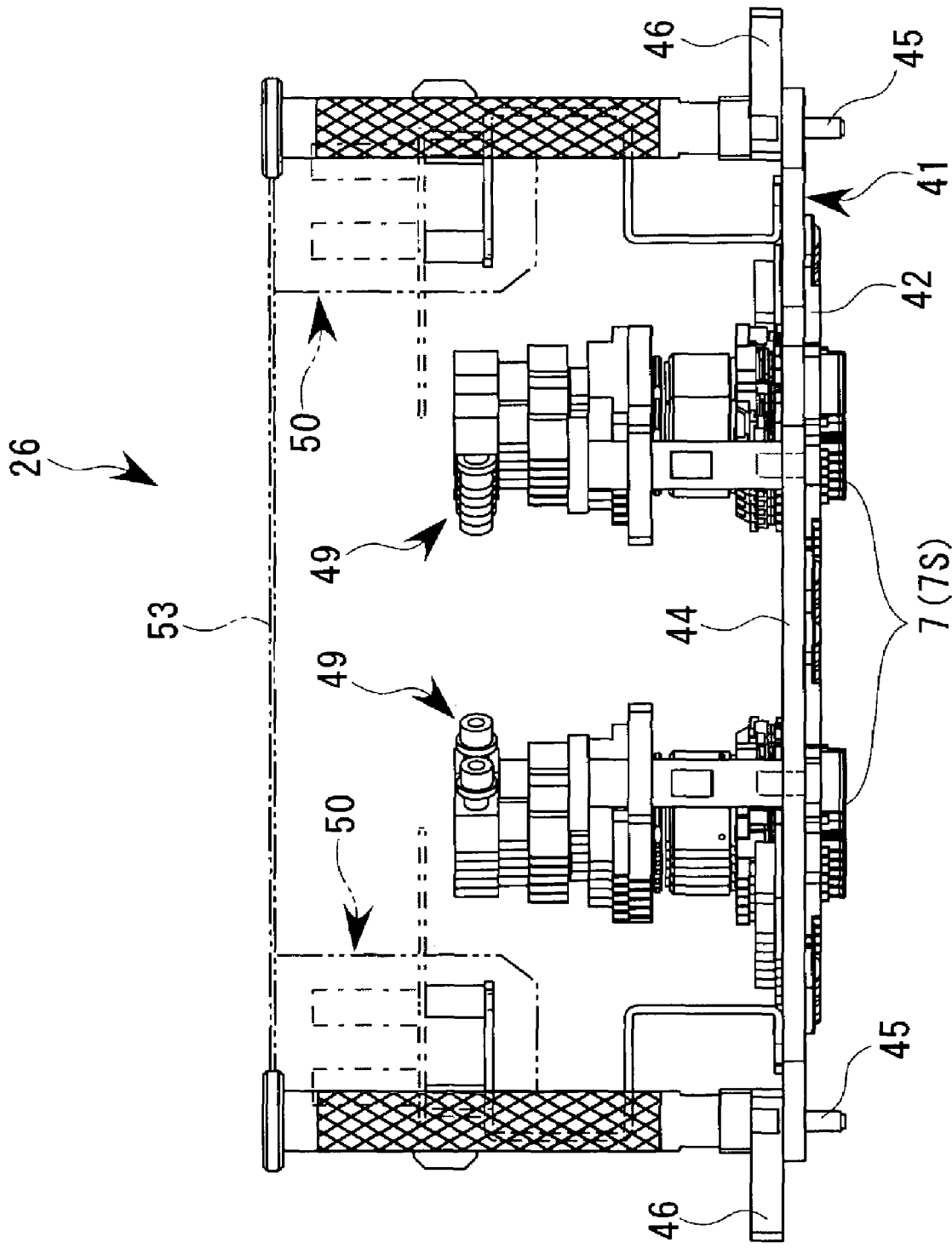
FIG. 24 is a front view of the head unit of the liquid droplet ejection head according to this invention.

As shown only in FIGS. 21 and 23, the head unit 26 is further provided with a substrate cover 51 which covers each of the wiring connection assemblies 50. This substrate cover 51 is made up of a pair of side covers 53, 53 which cover the side surface of each of the wiring connection assemblies 50, and an upper cover 54 which is provided so as to extend between the pair of the side covers 53, 53. The upper cover 54 is arranged to be mounted after the head unit 26 has been set in position on the liquid droplet ejection apparatus 10.

Figure 25:
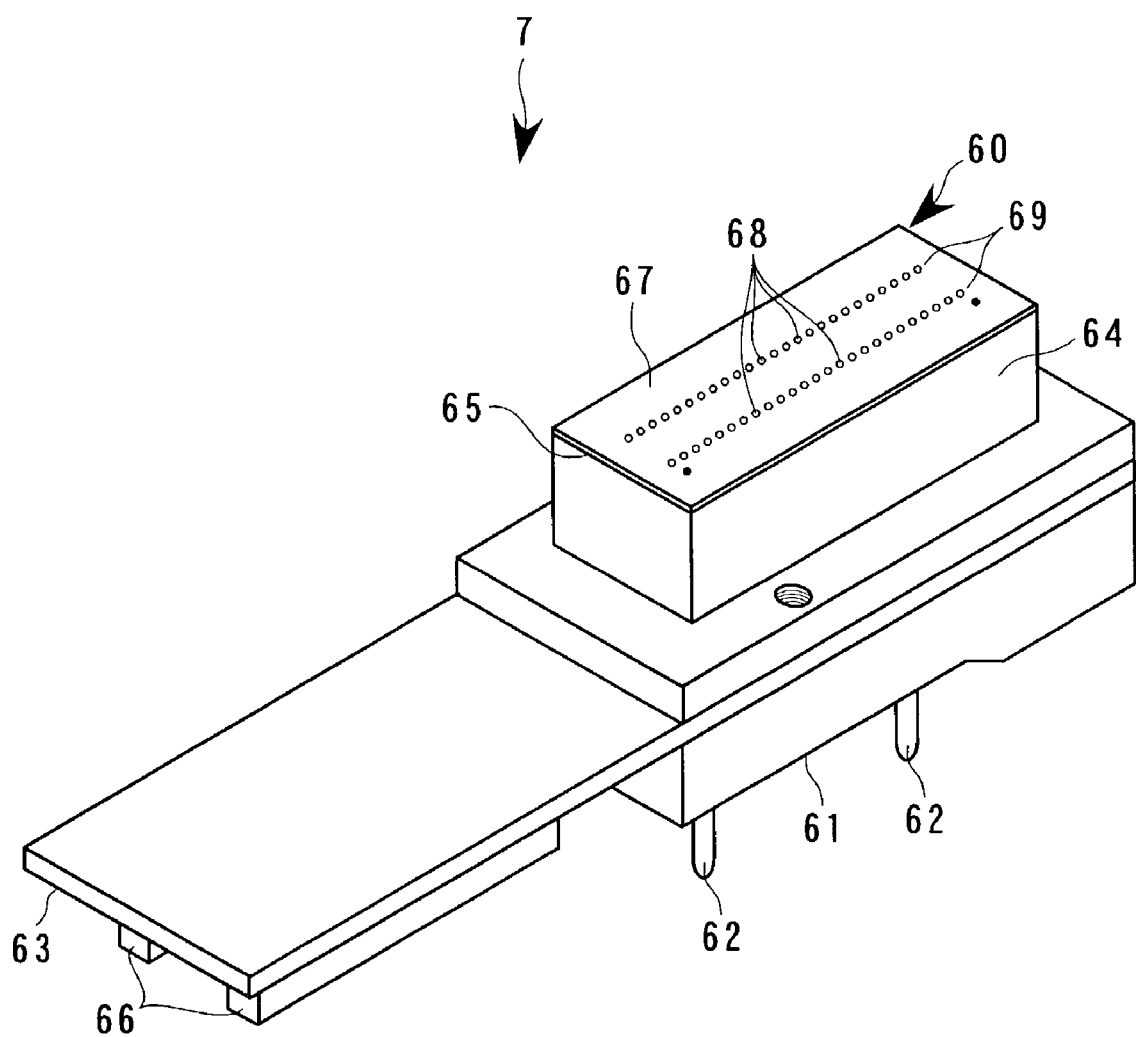
FIG. 25 is an outside perspective view of a function liquid droplet ejection head according to this invention.

As shown in FIG. 25, the function liquid droplet ejection head 7 is of a so-called dual (twin) construction and is made up of: a liquid introduction part 61 having dual connection needles 62, 62; a dual head substrate 63; a dual pump part 64 which is in communication with a lower portion of the liquid introduction part 61; and a nozzle forming plate 65 which is in communication with the pump part 64. To the liquid introduction part 61 is connected the above-described pipe connection assemblies 49, and to the dual connectors 66, 66 are connected the above-described cable connection assemblies 50. A rectangular head main body 60 which projects toward the back side of the sub-carriage 41 is constituted by this pump part 64 and the nozzle forming plate 65. The nozzle forming surface 67 of the nozzle forming plate 65 has parallelly disposed therein two rows of nozzle arrays 69, 69, each row having a multiplicity of ejection nozzles 68.

A description will now be made in sequence about the other constituting apparatuses of the liquid droplet ejection apparatus 10, the auxiliary apparatus 11, and each constituting apparatus in the main chamber 4.

FIGS. 26 through 29 show the supporting rack 21 and the stone base 22 on which is mounted the X-axis table. As shown in these figures, the supporting rack 21 is constituted by assembling L-shaped structural members, or the like, into a rectangle, and has a plurality of (nine) supporting legs 71 with adjusting bolts which are distributed in a lower part thereof. On an upper part of the supporting rack 21 there are provided, in a manner extending sidewise and two in number for each side, a plurality of (eight) fixing members 72 for fixing the stone base 22 at the time of movement such as transportation, or the like. Each of the fixing members 72 is formed into an L shape like a bracket and is fixed, at its base end, to the upper side face of the supporting rack 21 and is brought, at its front end, into contact with the lower side face of the stone base 22 through the adjusting bolts 73. The stone base 22 is placed in position on the supporting rack 21 in an untied state. When the stone base 22 is transported, it is fixed by the fixing members 72 to the supporting rack 21 in a manner immovable in the X-axis direction and in the Y-axis direction (i.e., back-and-forth and sidewise directions) relative to the supporting rack 21.

The stone base 22 is to support the X-axis table 23 and the Y-axis table 24, both being for moving the function liquid droplet ejection heads 7 at a high accuracy, so as not to give rise to deviations in accuracy (especially in respect of the degree of flatness) due to environmental conditions, vibrations, or the like. It is constituted by a solid stone material which is rectangular in plan view. The stone base 22 is provided at its lower part with three main supporting legs 75 and six auxiliary legs 76, all with adjusting bolts, for supporting the stone base 22 on the supporting rack 21. The three main supporting legs 75 support the stone base 22 at three points to thereby secure the degree of parallelism of the surface (also to secure the degree of horizontalness). The six auxiliary legs 76 are to support the portions away from the three main supporting legs 75 of the stone base 22 to thereby keep the stone base 22 from deflecting.

Figure 16:
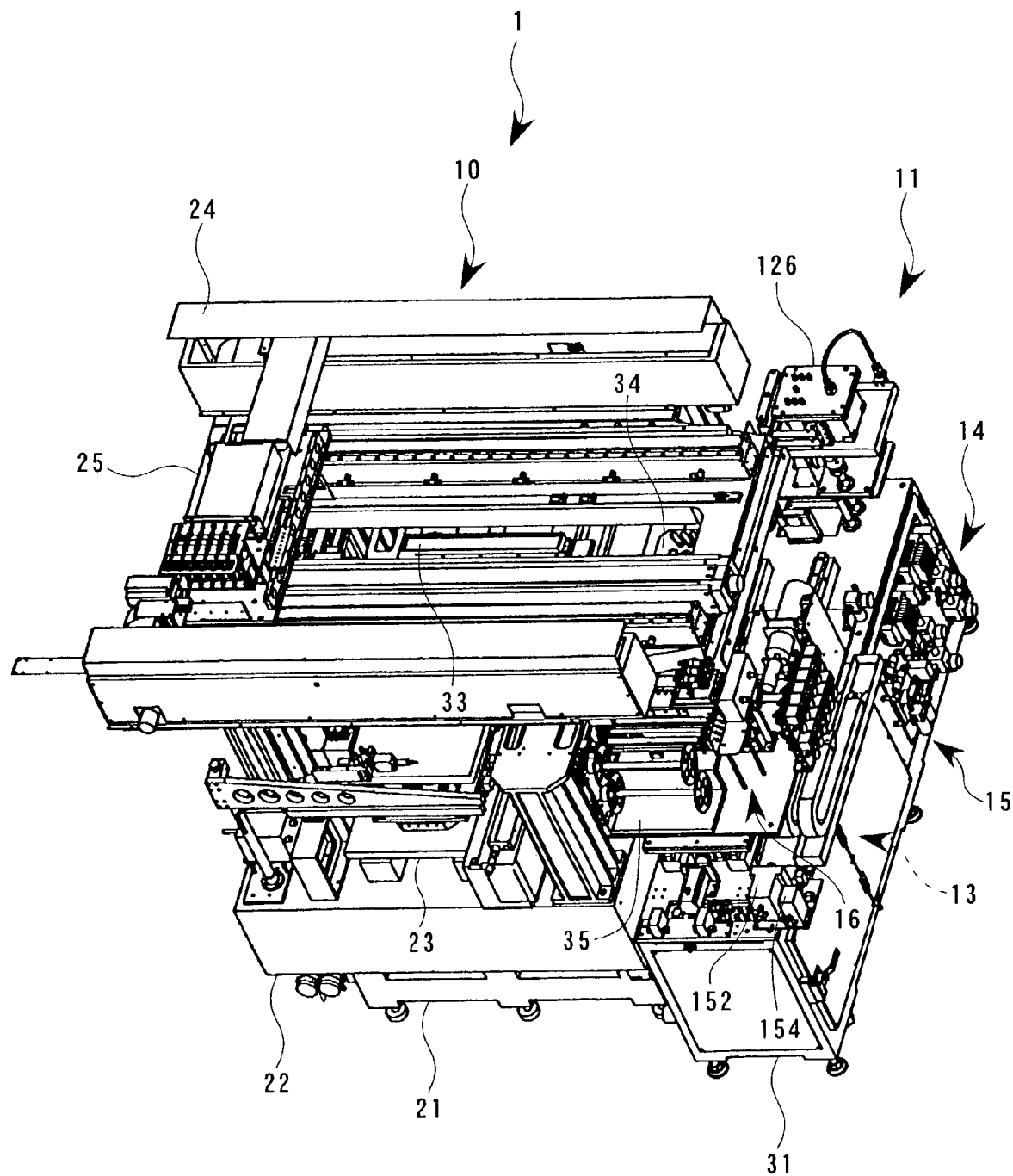
FIG. 16 is an outer perspective view of an imaging apparatus according to this invention.

For this purpose, as schematically shown in FIG. 29, the three main supporting legs 75, 75, 75 are disposed in a manner to form an isosceles triangle with the two main legs 75 forming the base being positioned on that side of the stone base 22 from which the substrate is transported (i.e., on the left side in FIG. 29 and on this side, i.e., on the side of the viewer of the figure, in FIG. 16). The six auxiliary legs 76, 76, 76, 76, 76, 76 are evenly distributed in such a manner that they constitute 3×3 in the longitudinal and lateral directions inclusive of the above-described three main supporting legs 75, 75, 75.

In this arrangement, the X-axis table 23 is disposed such that the axial line thereof coincides with the center line along the long sides of the stone base 22, and the Y-axis table 24 is disposed such that the axial line thereof coincides with the center line along the short sides of the stone base 22. Therefore, the X-axis table 23 is fixed directly to the stone base 22 and the Y-axis table 24 is fixed to the stone base 22 by four supporting columns 78 through respective spacer blocks 79. As a result, the Y-axis table 24 is disposed so as to lie above the X-axis table 23 at right angles thereto. Reference numeral 80 in FIG. 27 denotes four small blocks for fixing thereto main substrate recognition cameras which are described in detail hereinafter. The main substrate recognition cameras are also fixed to the stone base 22.

Figure 26:
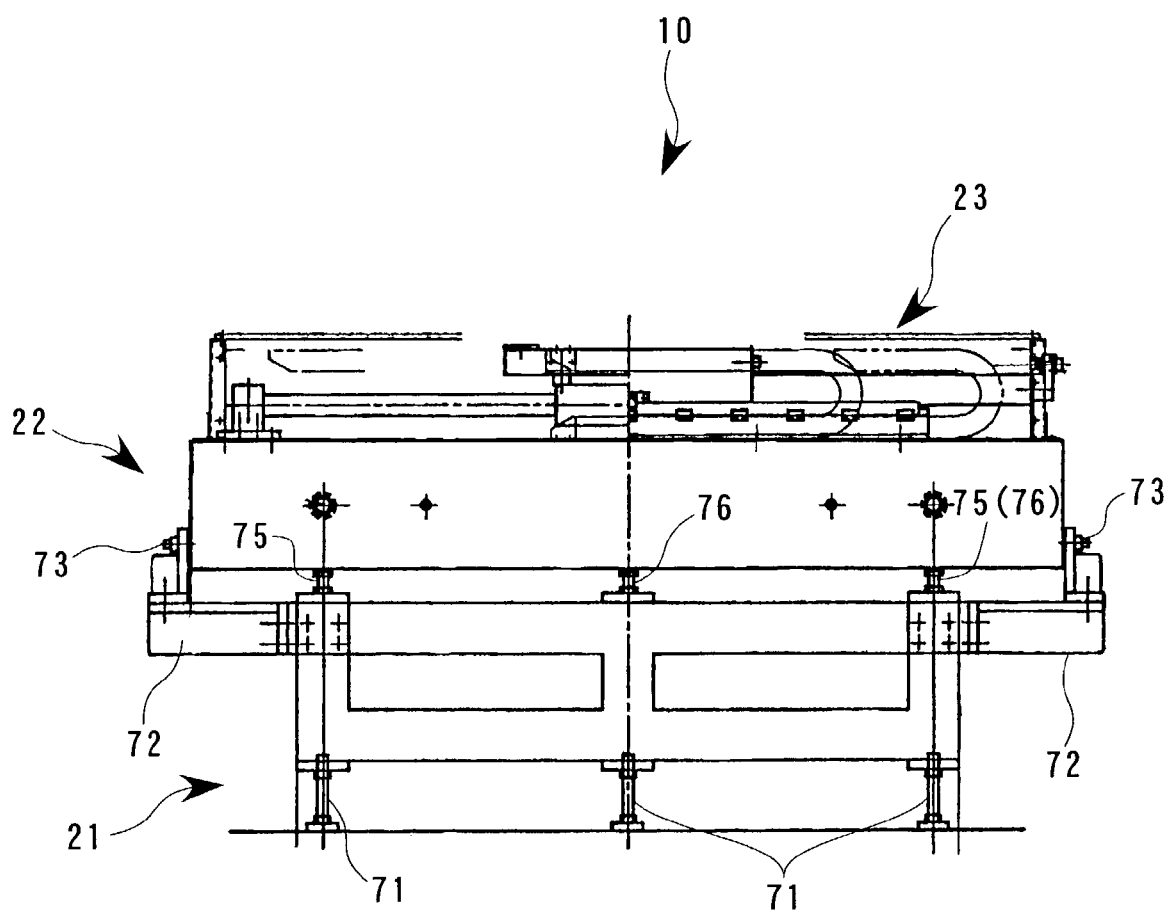
FIG. 26 is a side view around a stone base of the liquid droplet ejection apparatus according to this invention.
Figure 27:
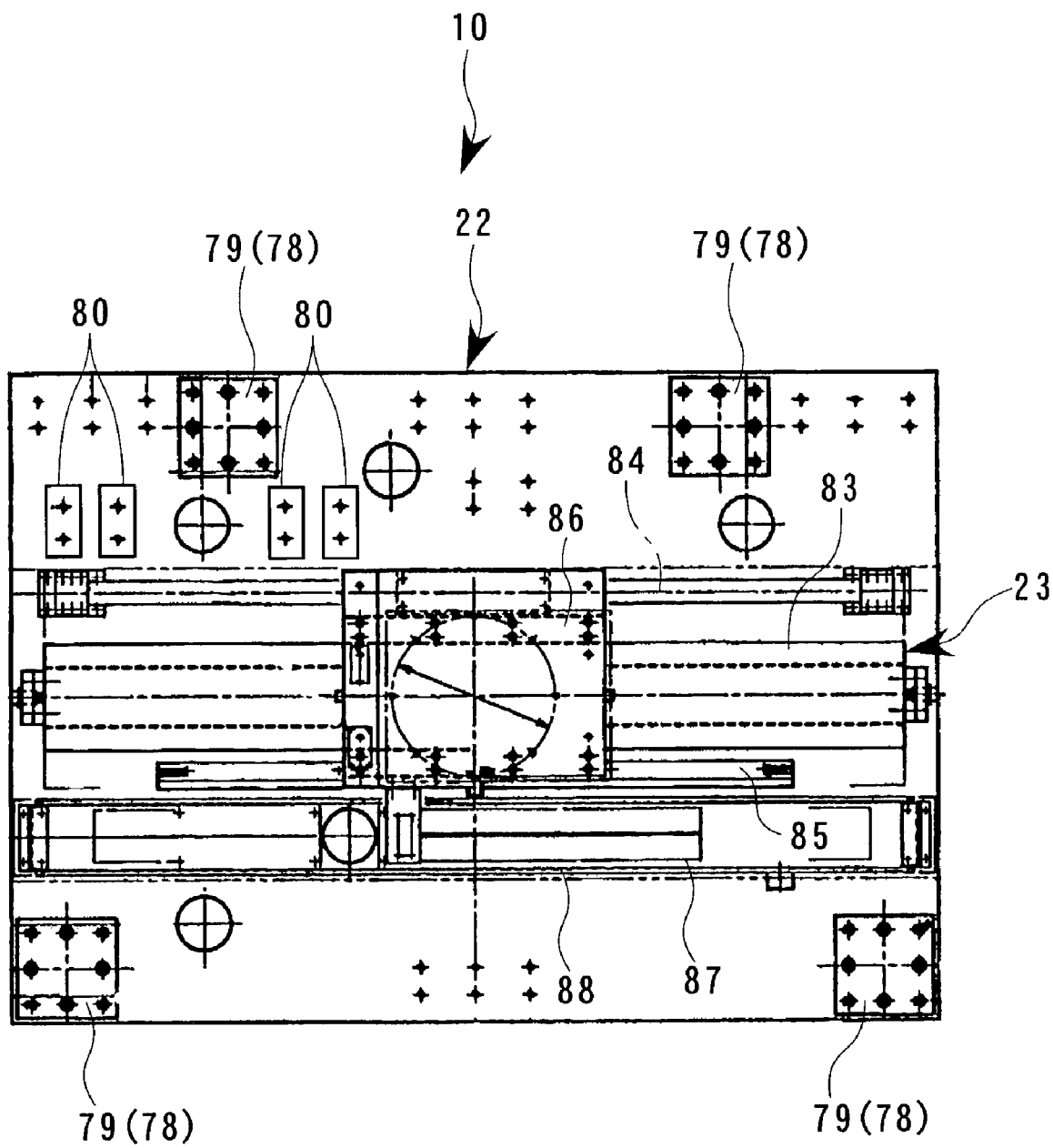
FIG. 27 is a plan view around the stone base of the liquid droplet ejection apparatus according to this invention.
Figure 28:
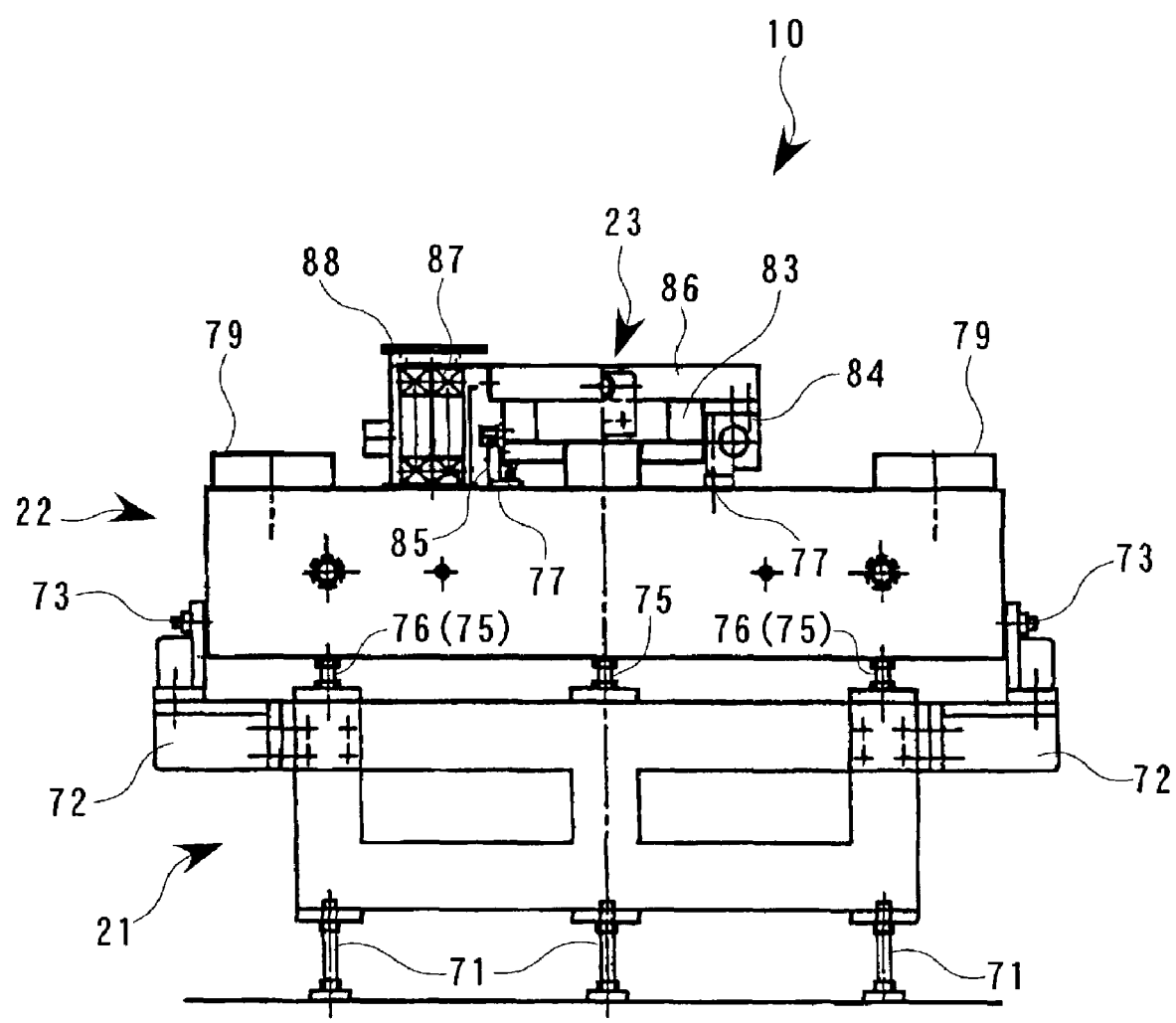
FIG. 28 is a front view around the stone base of the liquid droplet ejection apparatus according to this invention.
Figure 32:
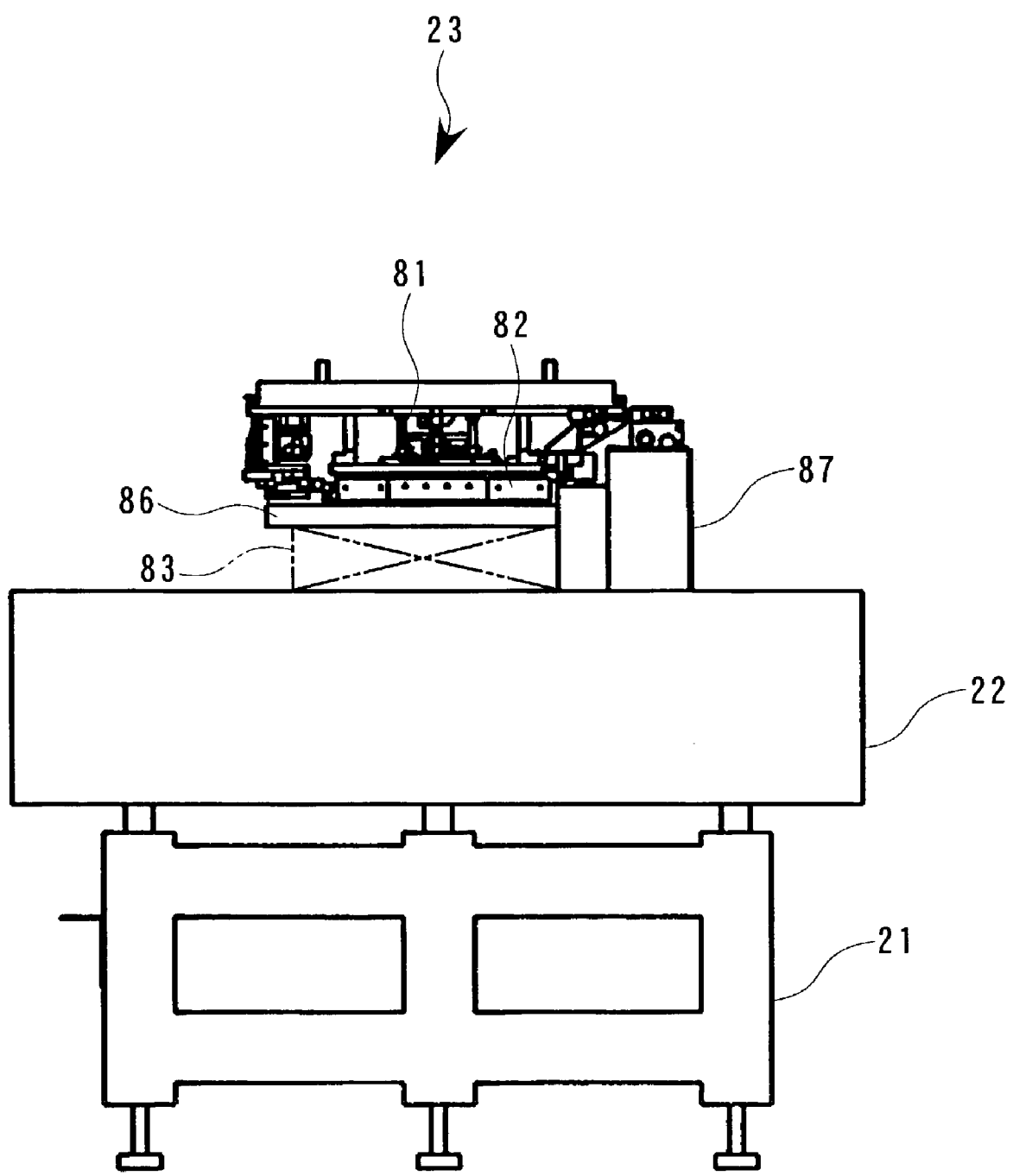
FIG. 32 is a front view of the X-axis table of the liquid droplet ejection apparatus according to this invention.

As shown in the X-axis moving system in FIGS. 26 through 28 and in the Θ-axis moving system in FIGS. 30 through 32, the X-axis table 23 extends along the long sides of the stone base 22 and is made up of: a suction table 81 which sucks the substrate W in position by air suction; a Θ-axis table 82 which supports the suction table 81 (see FIGS. 30 through 32); an X-axis air slider 83 which supports the Θ-axis table 82 in a manner slidable in the X-axis direction; an X-axis linear motor 84 which moves the substrate W on the suction table 81 in the X-axis direction through the Θ-axis table 82; and an X-axis linear scale 85 which is provided in line with the X-axis air slider 83 (see FIGS. 26 through 29).

The X-axis linear motor 84 is positioned on that side of the X-axis air slider 83 from which the head unit 26 is transported, and the X-axis linear scale 85 is positioned on that side of the X-axis air slider 83 on which the auxiliary apparatus 11 is disposed, and the X-axis air slider 83 and the X-axis linear scale 85 are disposed in parallel with each other. The X-axis linear motor 84, the X-axis air slider 83 and the X-axis linear scale 85 are directly supported on the stone base 22. The suction table 81 has connected thereto a vacuum pipe (not illustrated) which is in communication with the above-described vacuum suction apparatus 15. The substrate W which is set in position by the air suction is held by suction in order to maintain its flatness.

The X-axis linear scale 85 has, on the side of the auxiliary apparatus 11, an X-axis flexible cable bundler 87 in parallel with the linear scale 84 in a state in which it is contained in a box 88 on the stone base 22. The X-axis flexible cable bundler 87 contains therein vacuum pipes for the suction table 81, cables for the Θ-axis table 82, or the like, so that they follow the movement of the suction table 81 and the Θ-axis table 82 (see FIGS. 27 and 28).

The X-axis table 23 constituted as described above is operated by the driving of the X-axis linear motor 84 such that the suction table 81 having sucked thereto the substrate W and the Θ-axis table 82 are moved in the X-axis direction guided by the X-axis air slider 83. In the reciprocating movements in the X-axis direction, the relative main scanning of the function liquid droplet ejection heads 7 is carried out by the forward movement from the side of transportation of the substrate toward the inner side. In addition, based on the result of recognition by the main substrate recognition camera 90 (to be described in detail hereinafter), the Θ-axis correction (angular correction within the horizontal plane) of the substrate W is carried out by the Θ-axis table 82.

Figure 33:
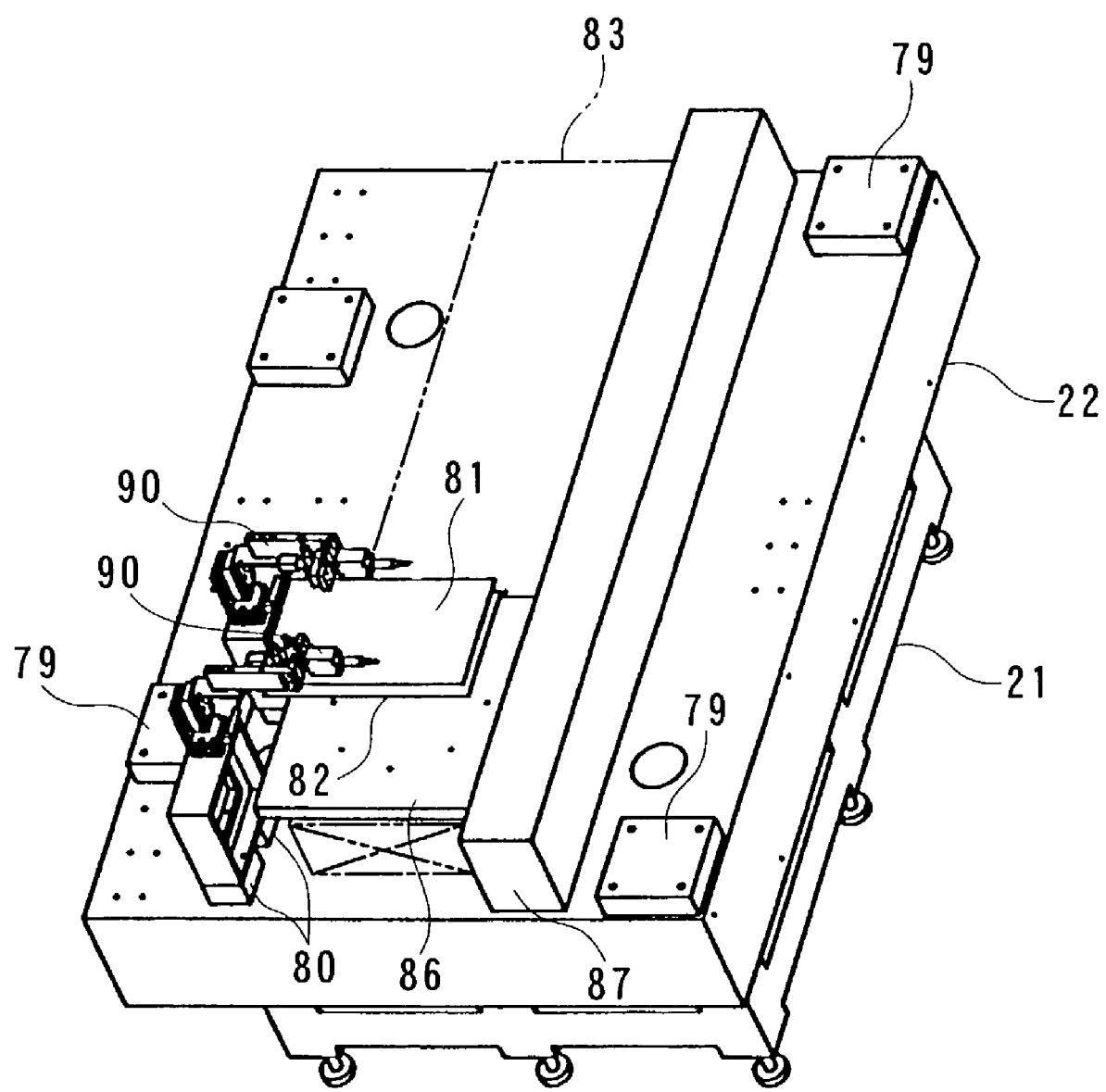
FIG. 33 is a perspective view around a main substrate recognition camera of the liquid droplet ejection apparatus according to this invention.

FIG. 33 shows the main substrate recognition camera. As shown therein, there are disposed a pair of main substrate recognition cameras 90, 90 right above the suction table 81 so as to face the position in which the substrate is transported (receiving and handover position). The pair of main substrate recognition cameras 90, 90 are arranged to simultaneously carry out the image-wise recognition (recognition by means of an image) of the two reference positions of the substrate.

Figure 34:
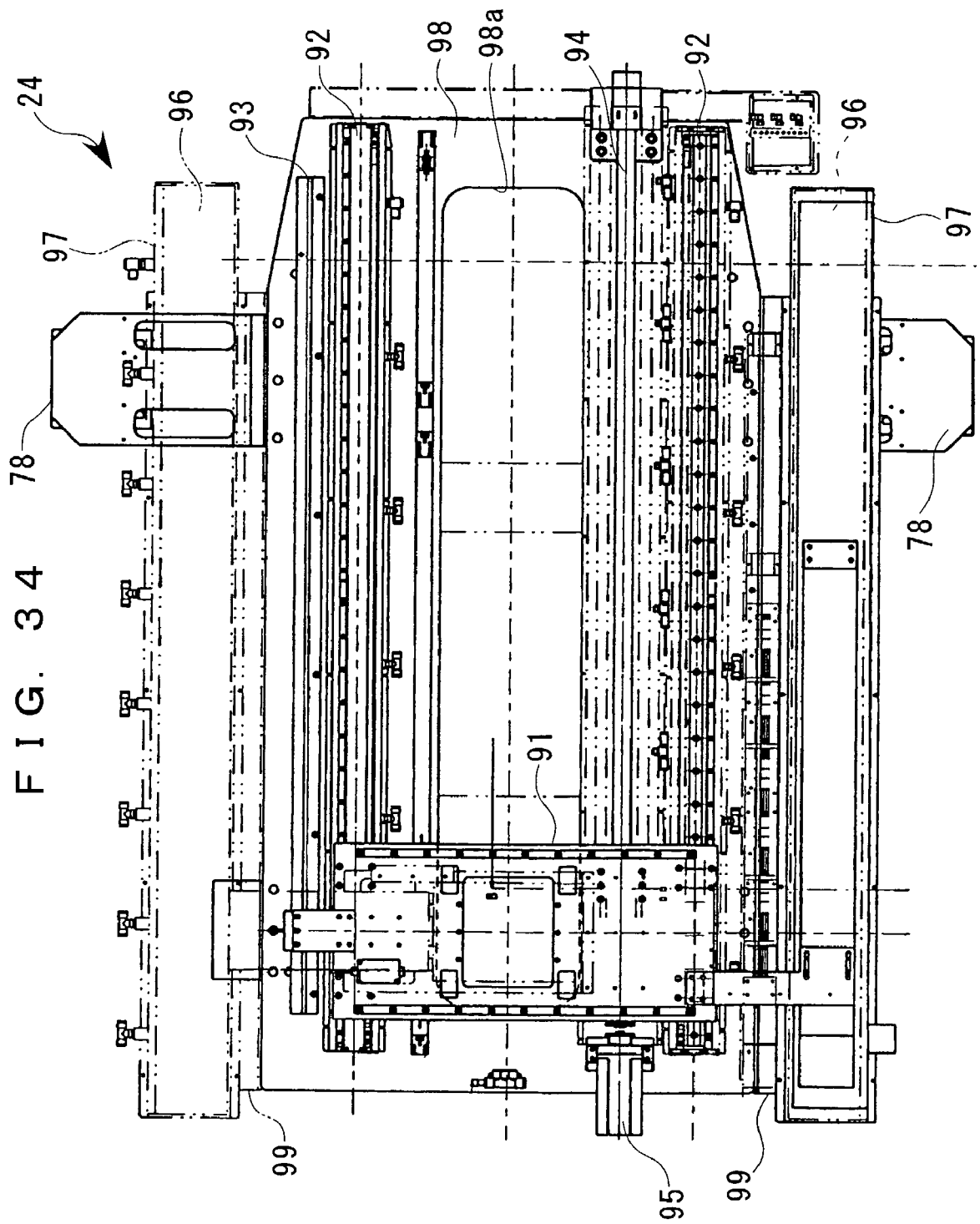
FIG. 34 is a plan view of a Y-axis table of the liquid droplet ejection apparatus according to this invention.
Figure 35:
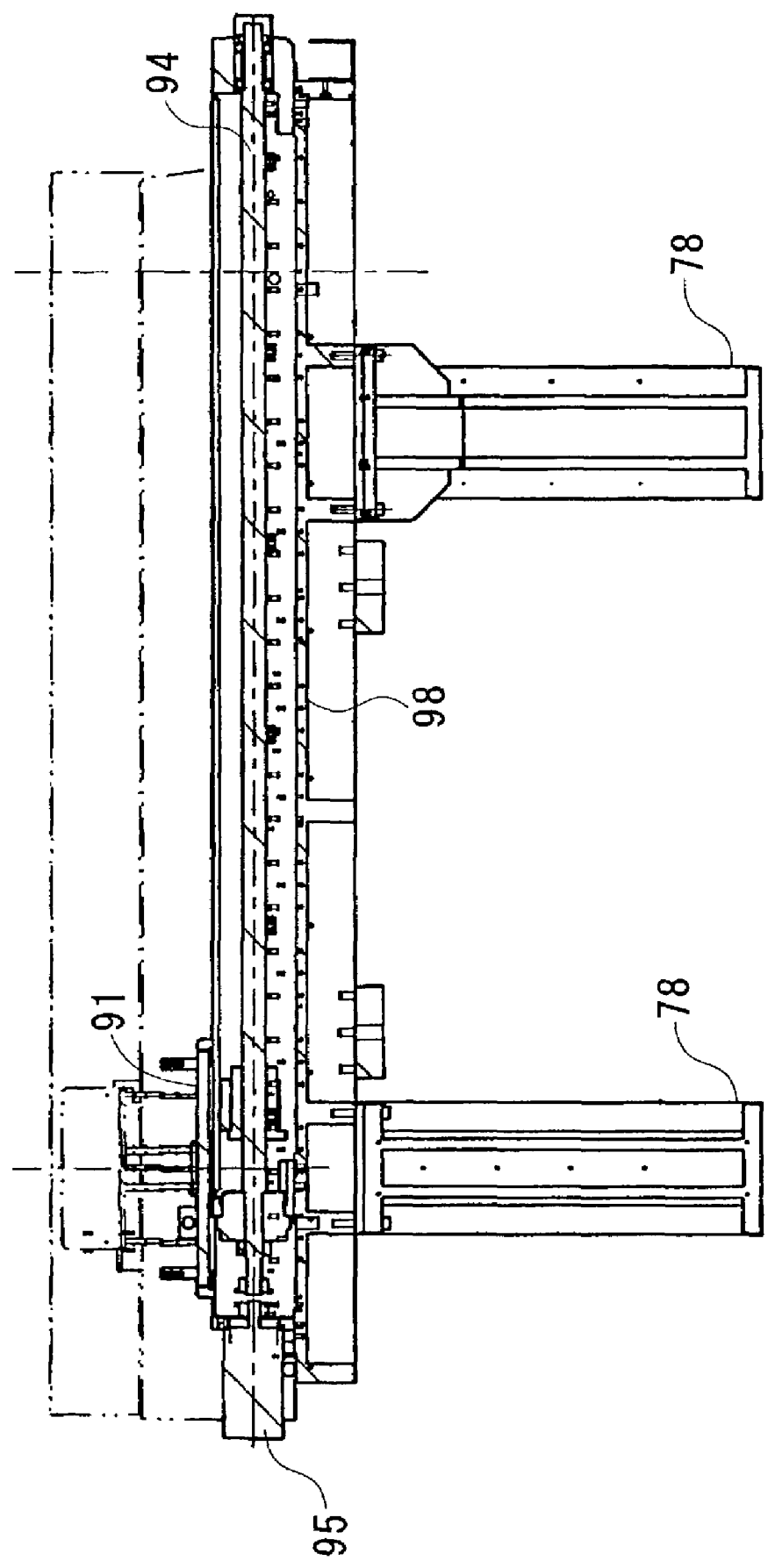
FIG. 35 is a side view of the Y-axis table of the liquid droplet ejection apparatus according to this invention.
Figure 36:
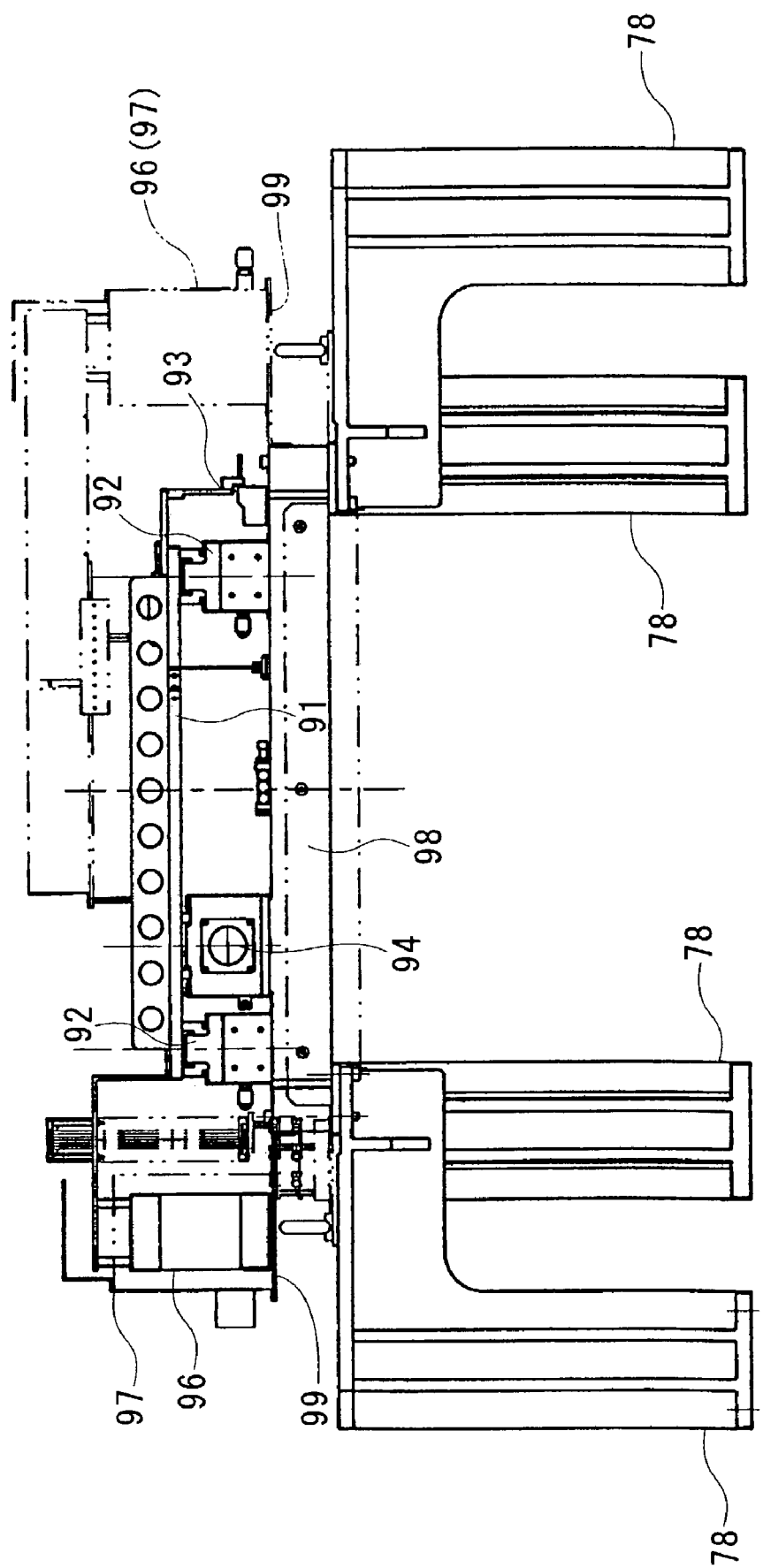
FIG. 36 is a front view of the Y-axis table of the liquid droplet ejection apparatus according to this invention.

As shown in FIGS. 34, 35 and 36, the Y-axis table 24 extends along the short sides of the stone base 22 and is made up of: a bridge plate 91 which suspends the main carriage 25; a pair of Y-axis sliders 92, 92 which support the bridge plate 91 on both ends so as to be slidable in the Y-axis direction; a Y-axis linear scale 93 which is provided in parallel with the Y-axis slider 92; a Y-axis ball screw 94 which moves the bridge plate 92 in the Y-axis direction guided by the pair of Y-axis sliders 92, 92; and a Y-axis motor 95 which rotates the Y-axis ball screw in one direction and in the opposite direction of rotation. A pair of Y-axis flexible cable bundlers 96, 96 are disposed in a manner respectively housed in boxes 97, 97.

The Y-axis motor 95 is constituted by a servo motor. When the Y-axis motor 95 rotates in one direction and in the opposite direction of rotation, the bridge plate 91 which is in screwed engagement therewith through the Y-axis ball screw 94 moves in the Y-axis direction with the pair of the Y-axis sliders 92, 92 serving as the guides. In other words, accompanied by the movement of the bridge plate 91 in the Y-axis direction, the main carriage 25 moves in the Y-axis direction. In the back and forth movements of the main carriage 25 (head unit 26) in the Y-axis direction, the sub-scanning by the function liquid droplet ejection heads 7 is carried out in the forward movement from the home position toward the auxiliary apparatus 11.

On the four supporting columns 78 there are supported thereon a mounting-base plate 98 with the moving path portion of the main carriage 25 forming a rectangular opening 98a. On the mounting-base plate 98 there are disposed the pair of Y-axis sliders 92, 92 to stand clear of the rectangular opening 98a, and the Y-axis ball screw 94 in parallel with each other. On a pair of supporting plates 99, 99 which extend outward from the mounting-base plate 98, there are placed the above-described pair of Y-axis flexible cable bundlers 96, 96 together with the boxes 97, 97 therefor.

The Y-axis flexible cable bundler 96 on the side of transporting the substrate houses therein the cables which are mainly connected to the head unit 26. The Y-axis flexible cable bundler on the opposite side houses therein those pipes for the function liquid droplet which are mainly connected to the head unit 26 (both not illustrated). These cables and pipes are connected to the plurality of function liquid droplet ejection heads 7 in the head unit 26 through the bridge plate 91.

Figure 37:
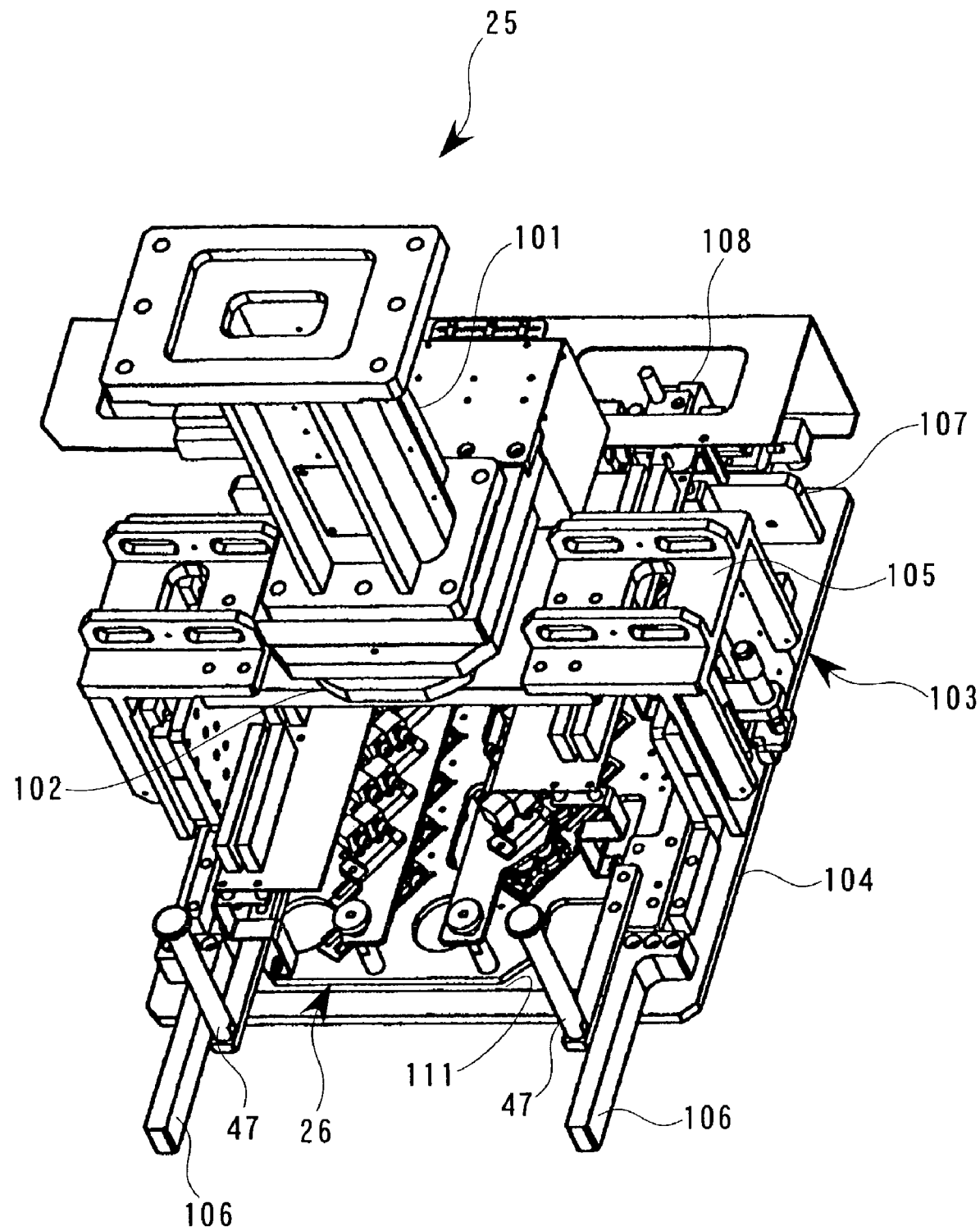
FIG. 37 is a perspective view of a main carriage of the Y-axis table according to this invention.
Figure 38:
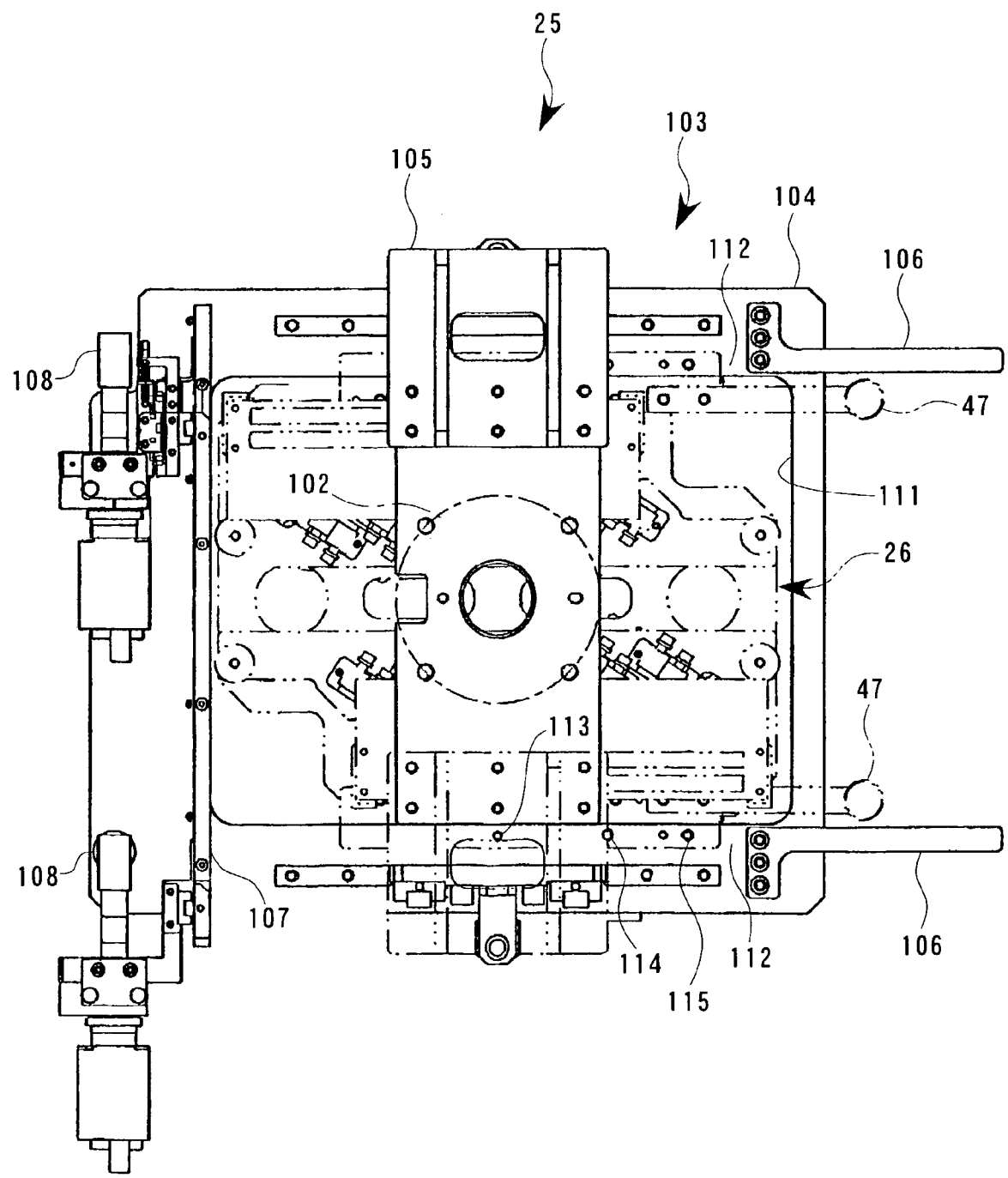
FIG. 38 is a plan view of the main carriage of the Y-axis table according to this invention.
Figure 39:
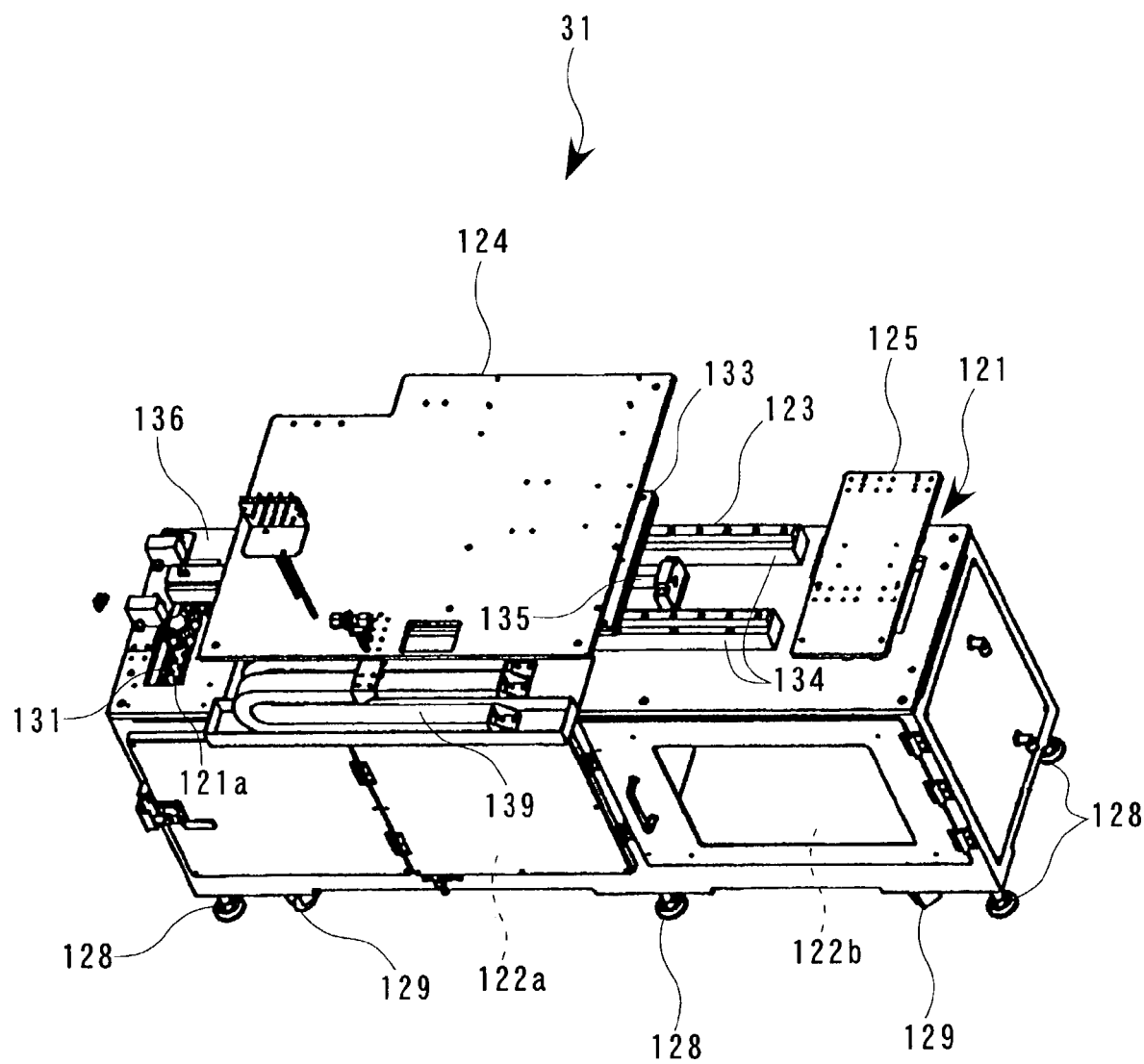
FIG. 39 is a perspective view of a common machine base of the liquid droplet ejection apparatus according to this invention.
Figure 40:
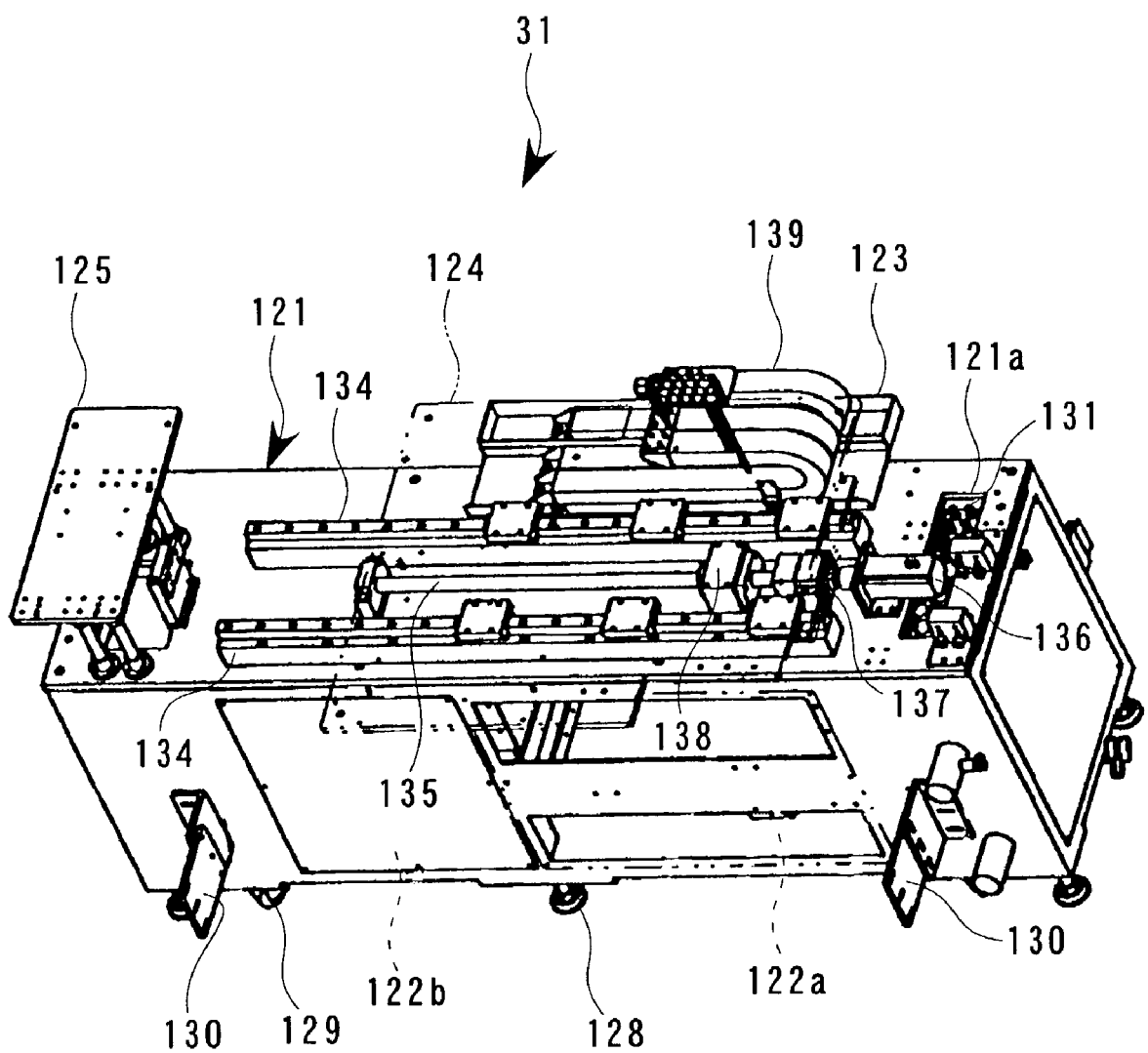
FIG. 40 is a perspective view of the common machine base of the liquid droplet ejection apparatus according to this invention in a state in which the common base is removed.
Figure 42:
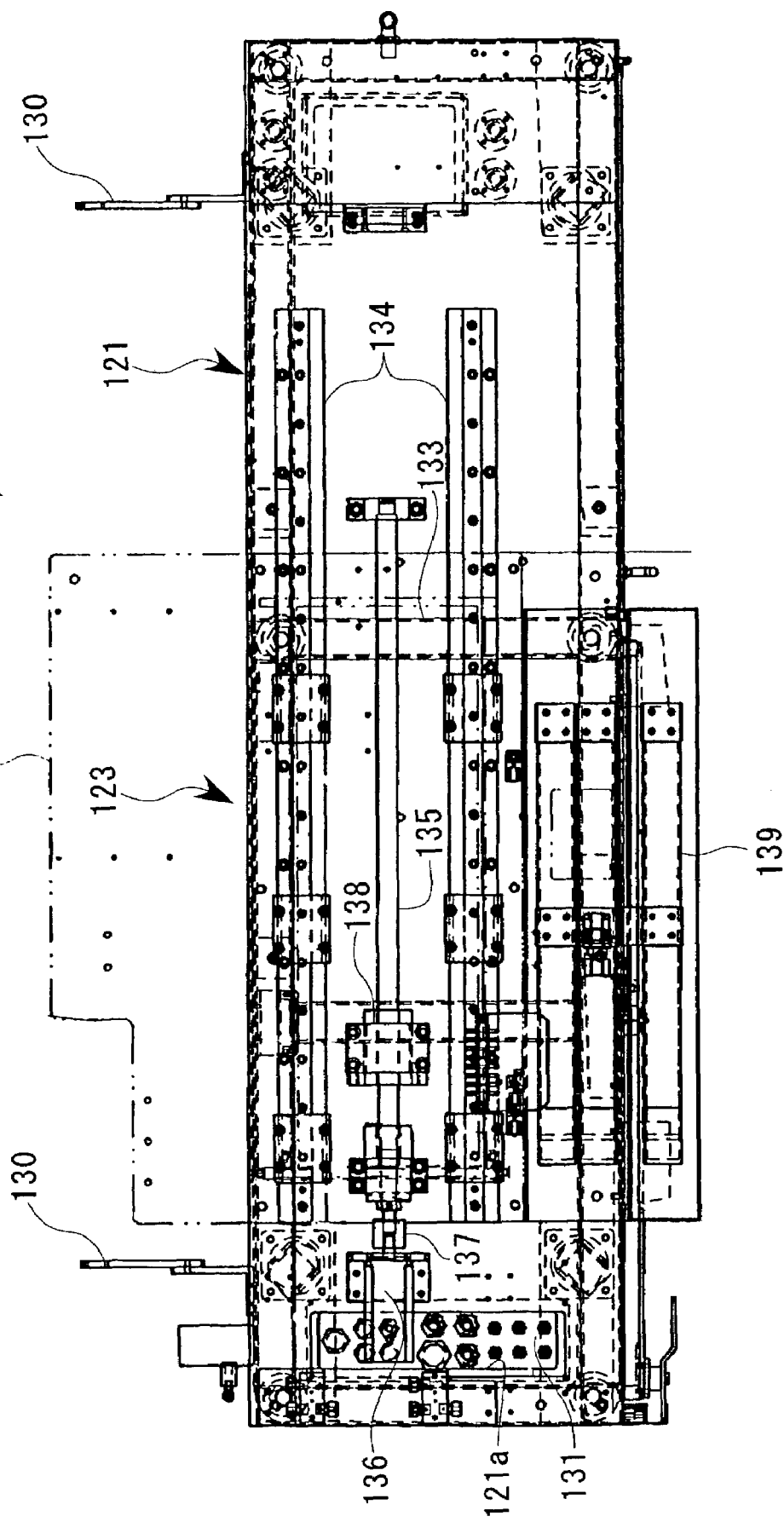
FIG. 42 is a plan view of the common machine base of the liquid droplet ejection apparatus according to this invention.

As shown in FIGS. 37 and 38, the main carriage 25 is made up of: a suspending member 101 which is fixed to the bridge plate 91 from the bottom side and which is of I-shape in external appearance; a Θ-axis table 102 which is attached to the lower surface of the suspending member 101; and a carriage main body 103 which is attached to the lower surface of the Θ-axis table 102 in a suspended manner. This suspending member 101 faces the rectangular opening 98a of the mounting-base plate 98.

The carriage main body 103 is made up of: a base plate 104 on which the head unit 26 is seated; an arch (portal) member 105 which supports the base plate 104 in a suspended manner; a pair of provisional placing L-shaped (angular) members 106, 106 which are provided so as to protrude from one end of the base plate 104; and a stopper plate 107 which is provided at the other end of the base plate 104. On an outside of the stopper plate 107 there are disposed a pair of the above-described subsidiary substrate recognition cameras 108 which recognize the substrate W.

The base plate 104 has formed therein a rectangular opening 111 into which the main body plate 44 of the head unit 26 is loosely fitted. Each left and right opening edge portion 112 of the base plate 104, which forms the rectangular opening 111, is provided with bolt holes 113, 113, two penetrating holes 114, 114, and positioning pins 115 which are used for positioning and fixing the head unit 26.

Into the main carriage 25 which is constituted as described above, the head unit 26 is transported and set in position by holding it with both the handles 47, 47. Namely, the transported head unit 26 is once placed on both the provisional placing L-shaped members 106, 106 (provisional placing). Then, the pipes which are in communication with the functional liquid supply and recovery apparatus 13 which is disposed on the bridge plate 91 are connected to the pipe connection assembly 49 of the head unit 26, and is also the cables of the control system are connected to the cable connection assembly 50. Then, by holding both the handles 47, 47 again, the head unit 26 is pushed forward with both the provisional placing L-shaped members 106, 106 serving as guides. The head unit 26 is thus set in position into the left and right opening edges 112, 112 of the base plate 104.

A description will now be made about the common machine base 31. As shown in FIGS. 39 through 42, the common machine base 31 is made up of: a machine base main body 121 in which two containing rooms, i.e., a large containing room 122a and a small containing room 122b, are formed with a partition wall therebetween; a movable table 123 which is provided on the machine base main body 121; a common base 124 which is fixed to the movable table 123; and a tank base 125 which is provided in an end position away from the movable table 123 on the machine base main body 121. The common base 124 has mounted thereon the cleaning unit 34 and the wiping unit 35. The tank base 125 has mounted thereon an intermediate tank 126 for the function liquid supply and recovery apparatus 13 which is described in detail hereinafter.

On a lower surface of the machine base main body 121 there are provided six supporting legs 128 with adjusting bolts, as well as four casters 129. On that side of the machine base main body 121 which lies on the liquid droplet ejection apparatus 10, there are provided a pair of connection brackets 130, 130 for connection to the supporting rack 21 of the liquid droplet ejection head 10. According to this arrangement, the liquid droplet ejection apparatus 10 and the auxiliary apparatus 11 (common machine base 31) can be integrated, and the auxiliary apparatus 11 can be separated and moved depending on necessity.

The small containing room 122b of the machine base main body 121 contains therein the main portions of the air supply apparatus 14 and the vacuum suction apparatus 15, and the large containing room 122a contains therein the tanks, or the like, of the function liquid supply and recovery apparatus 13. The coupling groups 131 for connection to these tank groups face the rectangular opening 121a which is formed in the upper surface of the end portion of the machine base main body 121 (see left end in FIG. 42). A waste liquid pump 152 (to be described in detail hereinafter) is provided in a position near the rectangular opening 121a.

The movable table 123 extends along the longitudinal direction of the machine base main body 121 and is made up of: a rectangular table 133 which supports the common base 124; a pair of movable sliders 134, 134 which slidably support the rectangular table 133; a ball screw 135 which is disposed between the pair of the movable sliders 134, 134; and a moving motor 136 for rotating the ball screw 135 in one direction and in the opposite direction of rotation. The moving motor 136 is connected to an end of the ball screw 135 through a coupling 137, and the rectangular table 133 is engaged with the ball screw 135 in a screwed manner through a female spool 138. According to this arrangement, when the moving motor 136 is rotated in one direction and in the opposite direction of rotation, the rectangular table 133 and the common base 124 move back and forth in the X-axis direction through the ball screw 135.

The moving table 123 moves the cleaning unit 34 and the wiping unit 35 which are disposed on the common base 124. When the moving table 123 is driven, the head unit 26 is in a position right above the cleaning unit 34 by means of the Y-axis table 24. Once the cleaning unit 34 has sucked the function liquid in close contact with the plurality of function liquid droplet ejection heads 7 of the head unit 26, the nozzle forming surface 67 of each of the function liquid droplet ejection heads 7 gets contaminated or stained. Therefore, the wiping unit 35 comes close to the plurality of function liquid droplet ejection heads 7 by means of the moving table 123 and operates to wipe out the contamination on the nozzle forming surface 67 (details of this operation will be described hereinafter).

On a side of the moving table 123 there is disposed a flexible cable bundler 139. This flexible cable bundler 139 is fixed to the upper surface of the common machine base 31 and the front end thereof is fixed to the common base 124; it contains therein the cables, air pipes, cleaning pipes, pipes for the waste liquid (to be reused), or the like (not illustrated; cleaning is described in detail hereinafter).

With reference to FIGS. 43 through 46, a description will now be made about the function liquid supply and recovery apparatus 13. As shown in the piping diagram in FIG. 43, the function liquid supply and recovery apparatus 13 is made up of: a function liquid supply system 141 which supplies each of the function liquid droplet ejection heads 7 of the head unit 26 with the function liquid; a function liquid recovery system 142 which recovers the function liquid that has been sucked by the cleaning unit 34; a cleaning liquid supply system 143 which supplies the solvent of the function liquid for the purpose of cleaning; and a waste liquid recovery system 144 which recovers the waste liquid of the function liquid from the flushing unit 33.

Figure 44:
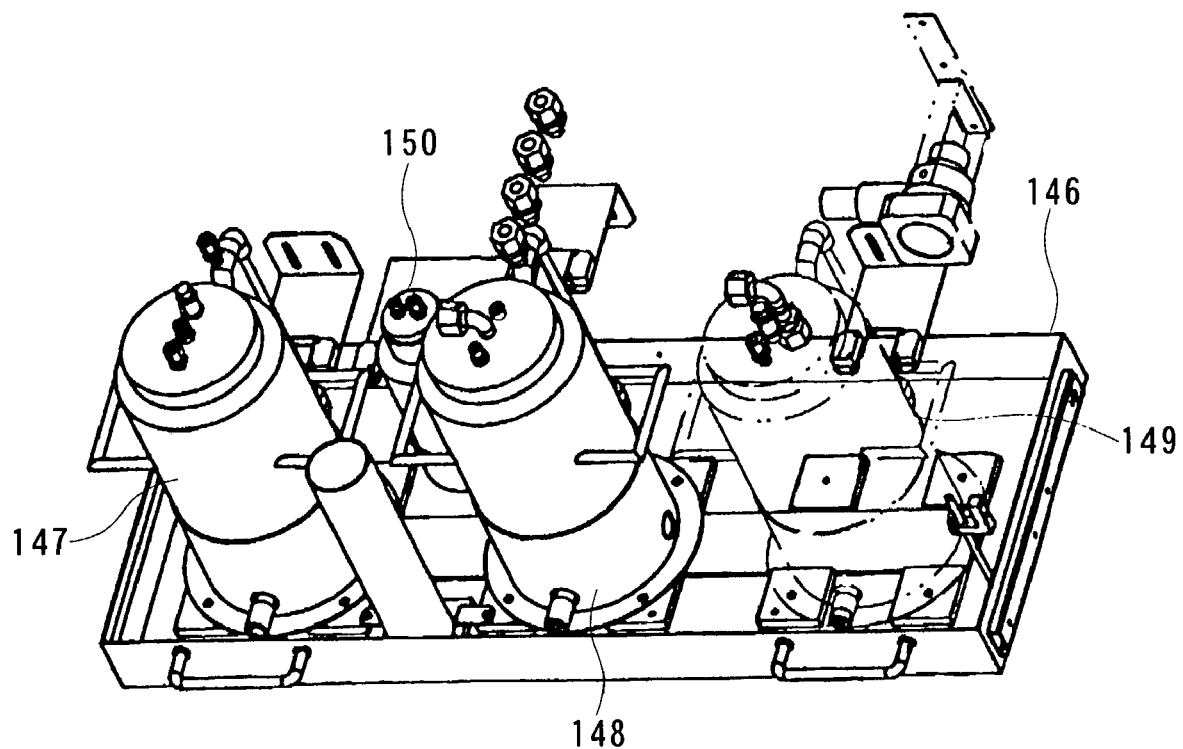
FIG. 44 is a perspective view around pumps of the function liquid supply and recovery apparatus according to this invention.
Figure 45:
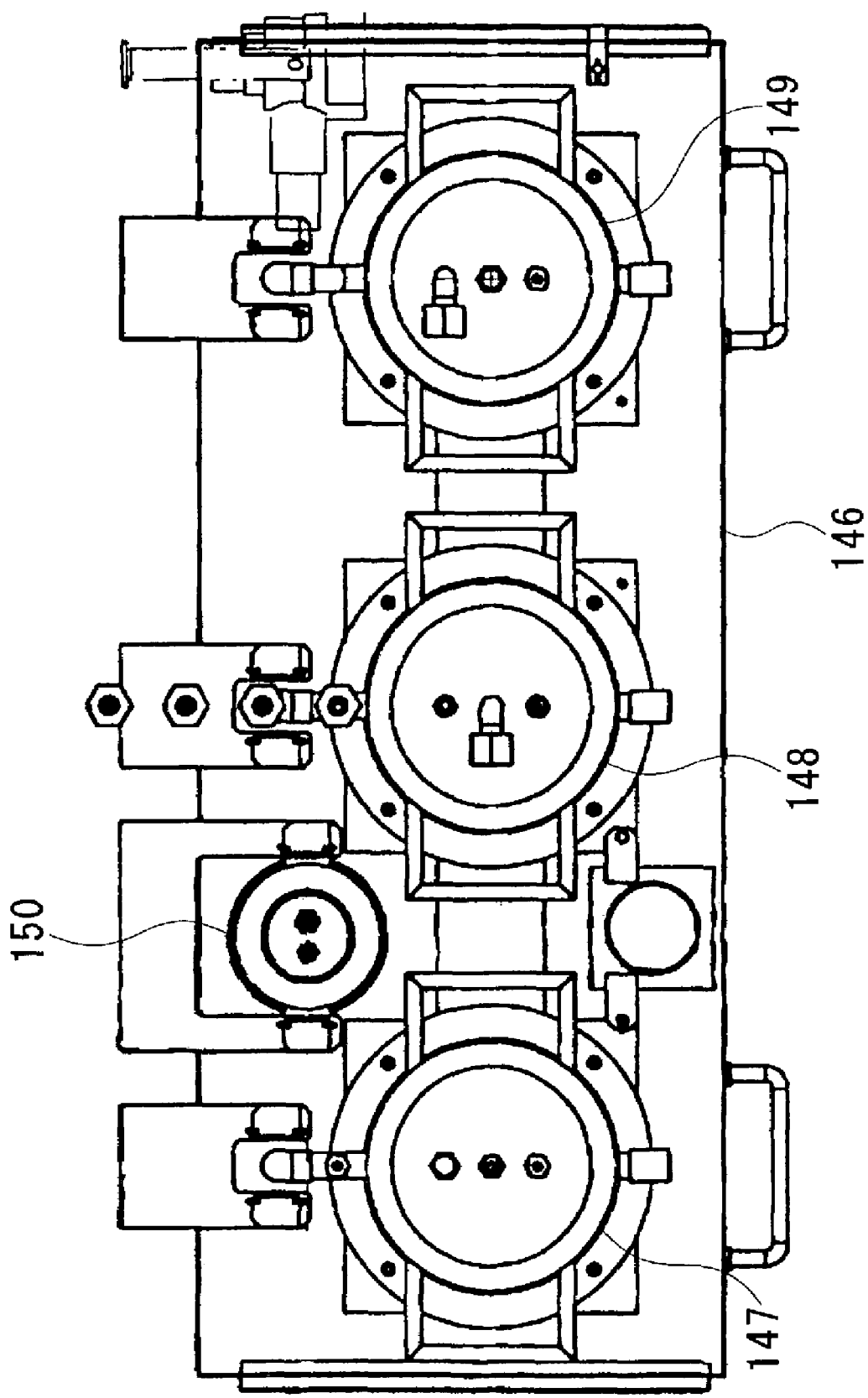
FIG. 45 is a plan view around the pumps of the function liquid supply and recovery apparatus according to this invention.

FIGS. 44 and 45 show the tank groups which are contained inside the large containing room 122*a* in the common machine base 31. A plurality of tank groups are mounted on a liquid-proof pan 146 of a drawer type. On the liquid-proof pan 146 there are laterally disposed, as seen from the left in the figure, a cleaning tank 147 for the cleaning liquid supply system 143, a reusing tank 148 for the function liquid recovery system 142, and a pressurizing tank 149 for the function liquid supply system 141, which constitute the tank groups. A waste liquid tank 150, which is formed into a small size, for the waste liquid recovery system 144 is disposed near the cleaning tank 147 and the reusing tank 148.

Figure 43:
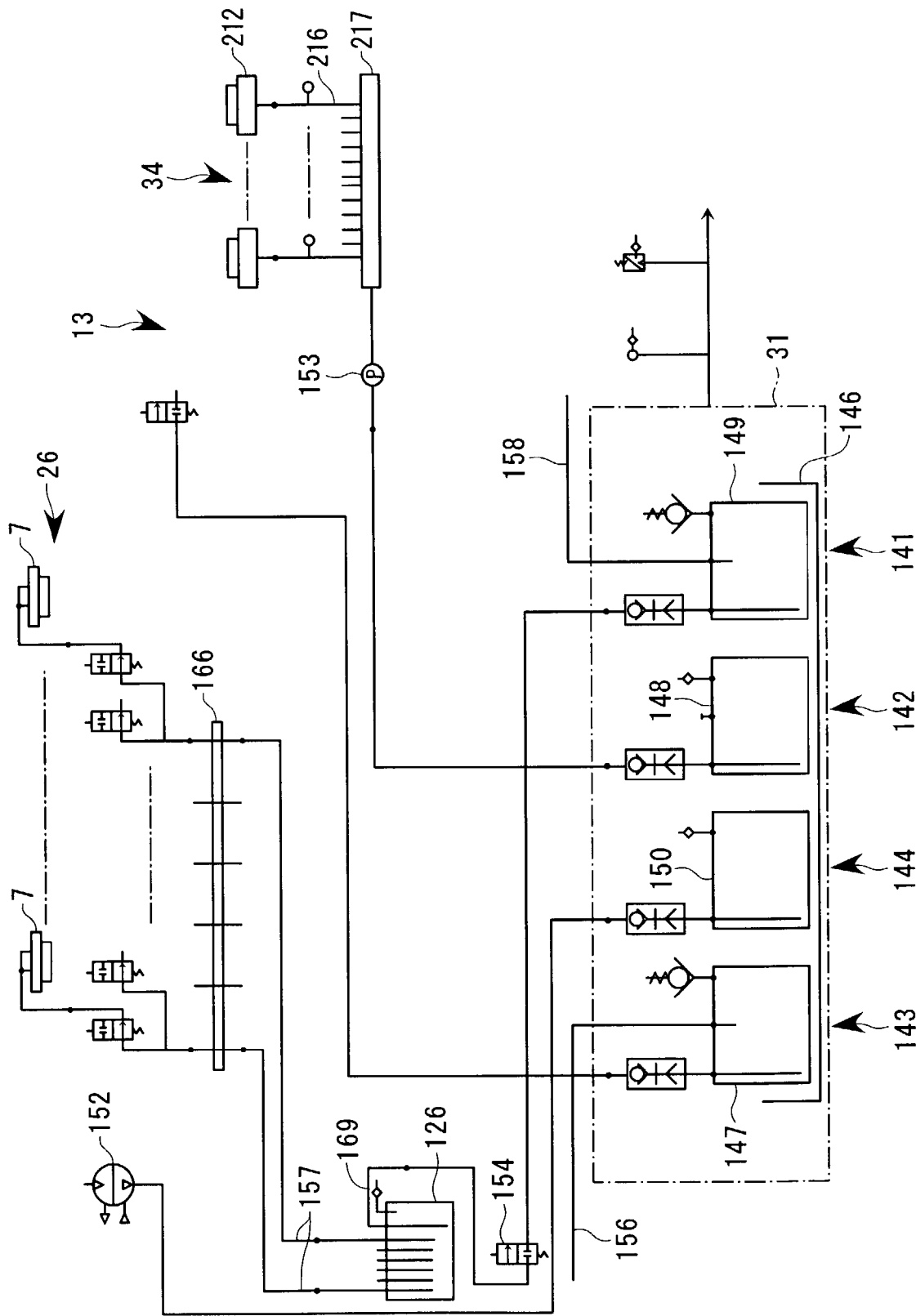
FIG. 43 is a piping diagram of a function liquid supply and recovery apparatus of the liquid droplet ejection apparatus according to this invention.
Figure 46:
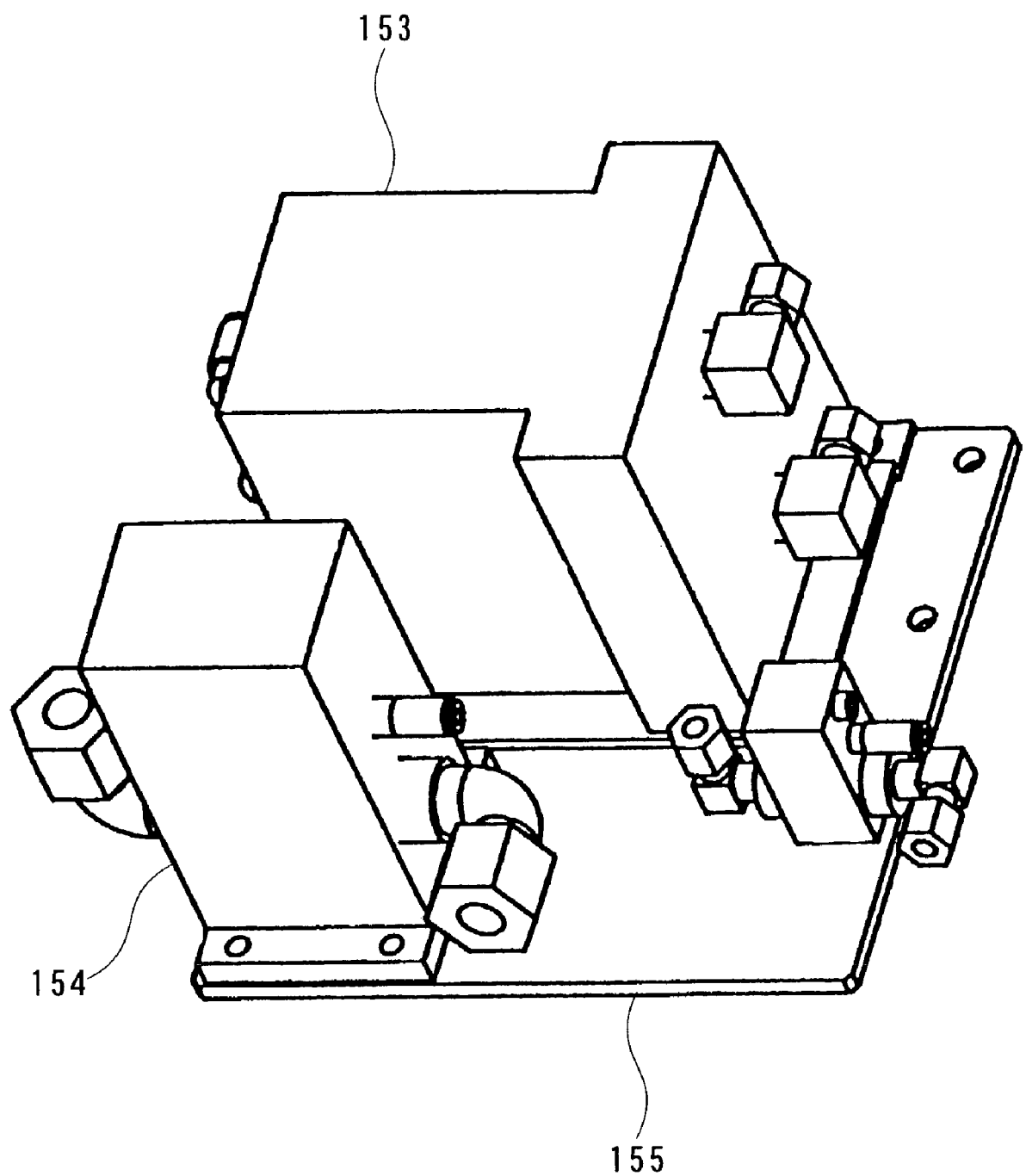
FIG. 46 is a perspective view around a waste liquid pump of the function liquid supply and recovery apparatus according to this invention.

As shown in FIG. 43, the waste liquid tank 150 is connected to the flushing unit 33 through the waste liquid pump 152 and recovers back to the waste tank 150 the function liquid ejected by each of the function liquid droplet ejection heads 7 to the flushing unit 33. The reusing tank 148 is connected to the suction pump 153 of the cleaning unit 34 and recovers the function liquid as sucked by the suction pump 153 from each of the function liquid droplet ejection heads 7. As shown in FIG. 46, the waste liquid pump 152 and a gate valve 154 on an upstream side of the intermediate tank 126, which is described in detail hereinafter, are fixed to the supporting plate 155 and are mounted, as described hereinabove, on the upper surface of the end portion of the machine base main body 121 (see FIG. 16).

As shown in FIG. 43, the cleaning tank 147 is connected at its suction side to the air supply apparatus 14 and is connected at its delivery or discharge side to atomizing nozzles (to be described in detail hereinafter) 195 of the cleaning liquid atomizing head of the wiping unit 35. Namely, the cleaning tank 147 supplies the cleaning liquid inside thereof to the cleaning liquid atomizing head 195 under pressure by the compressed air to be introduced from the air supply apparatus 14. Although the details are described hereinafter, the cleaning liquid ejected out of the cleaning liquid atomizing head 195 is impregnated into a wiping sheet 182 which is to wipe out the function liquid droplet ejection heads 7. A pipe 156 for pressurizing the tank is further connected to the cleaning tank 147.

The pressurizing tank 149 is connected at its suction side to the air supply apparatus 14 and is connected at its delivery side to the intermediate tank 126 of the function liquid supply system 141. This intermediate tank 126 and (a pair of pipe connection assemblies 49, 49 of) the head unit 26 are connected together by a plurality of pipes 157. The pressurizing tank 149 is a main tank for the function liquid and supplies the function liquid inside thereof to the intermediate tank 126 under pressure by the compressed air to be introduced from the air supply apparatus 14. Pipes 158 for pressurizing purpose are further connected to the pressurizing tank 149.

In this arrangement, the function liquid is supplied from the pressurizing tank 149 to the intermediate tank 126 at a predetermined head pressure. The intermediate tank 126 is freed from the influence of the head pressure of this pressurizing tank 149 and, instead, the function liquid is supplied mainly by the pumping operation of the function liquid droplet ejection heads 7, i.e., by the pumping drive of a piezoelectric element. This arrangement is made to prevent the function liquid from oozing (or leaking) out of the ejection nozzles 68 of the function liquid droplet ejection heads 7. Therefore, in order to prevent the function liquid droplet ejection heads 7 from being subjected to an unnecessary head pressure of the intermediate tank 126, the height of the intermediate tank 126 is adjusted by the tank base 125, or the like.

Figure 47:
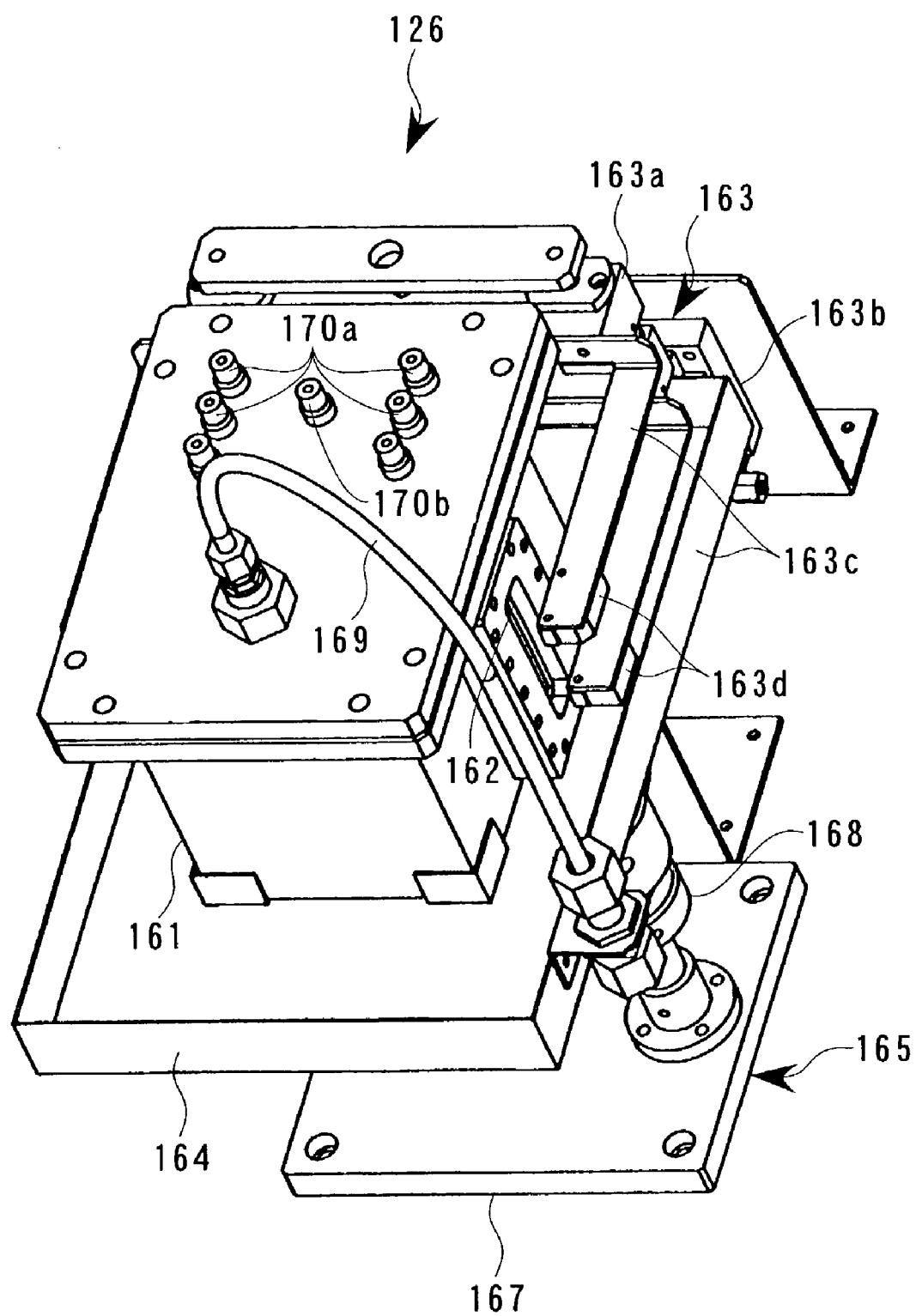
FIG. 47 is a perspective view of an intermediate tank of the function liquid supply and recovery apparatus according to this invention.
Figure 48:
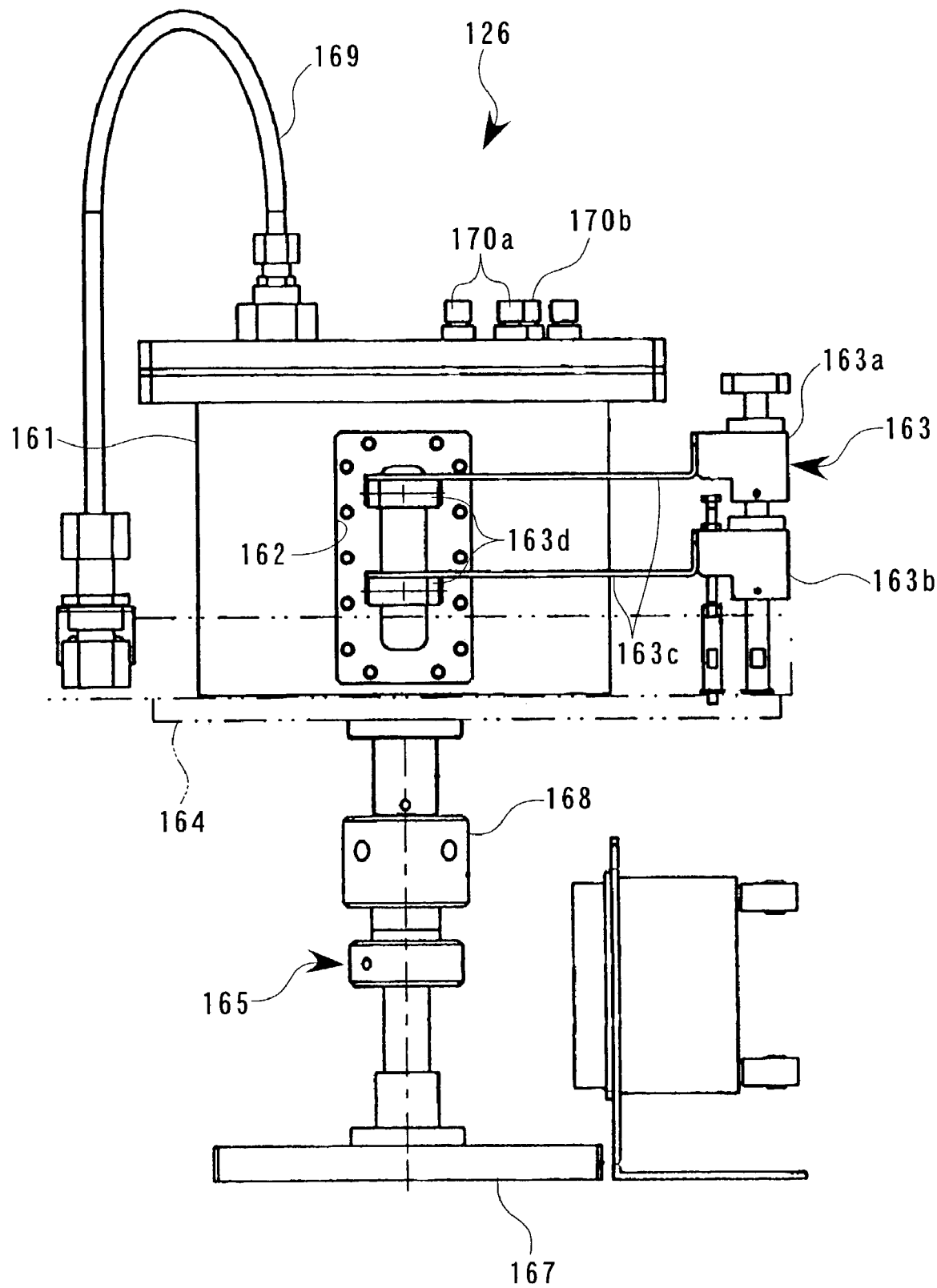
FIG. 48 is a side view of an intermediate tank of the function liquid supply and recovery apparatus according to this invention.
Figure 49:
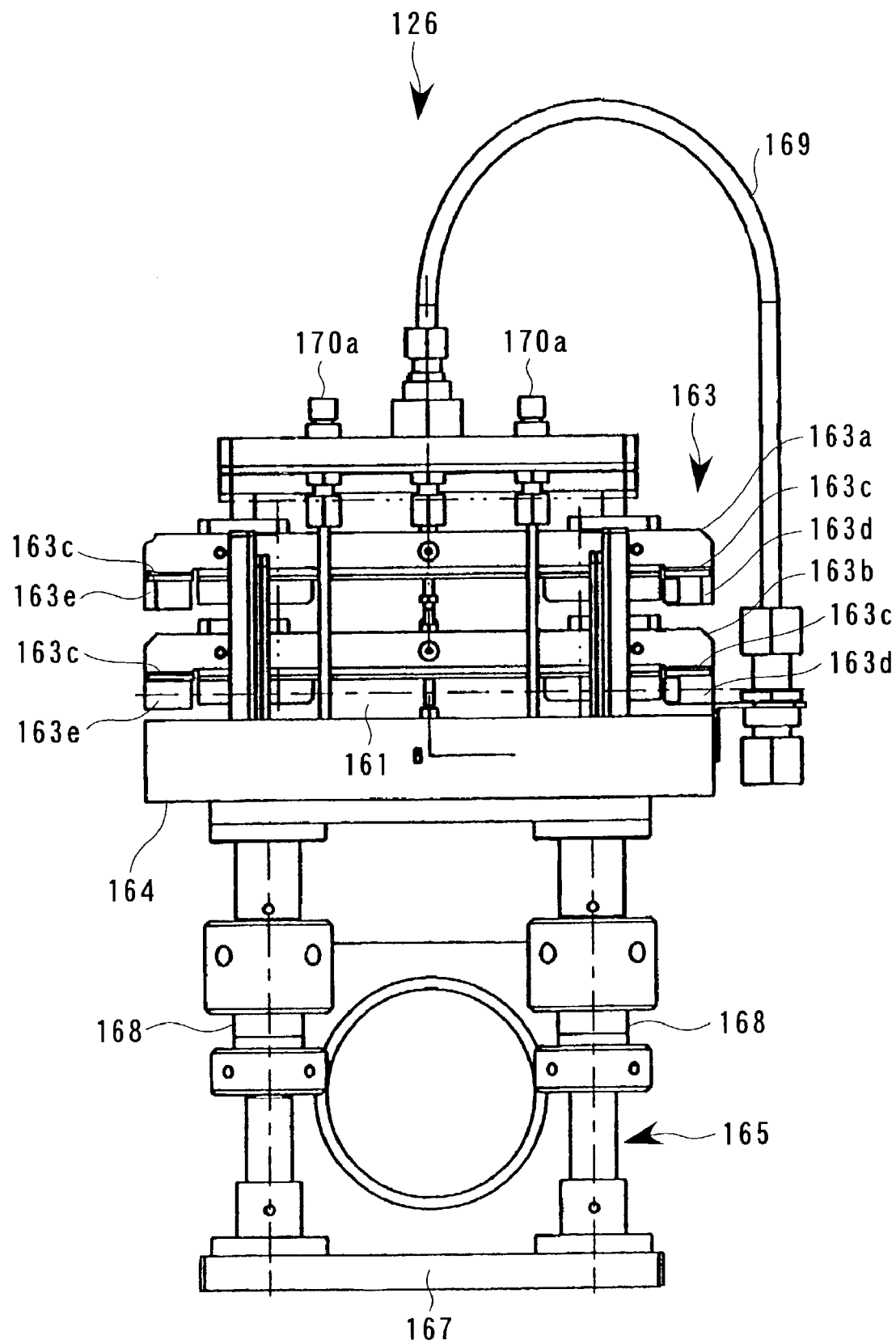
FIG. 49 is a front view of an intermediate tank of the function liquid supply and recovery apparatus according to this invention.

FIGS. 47 through 49 show the intermediate tank 126. The intermediate tank 126 is fixed to the tank base 125 and is made up of: a rectangular tank main body 161 which is provided with a liquid level peep hole 162 on each side and is closed by a flange; a liquid level detector 163 which faces both the liquid level peep holes 162, 162 for detecting the liquid level of the function liquid; a pan 164 on which the tank main body 161 is placed; and a tank stand 165 which supports the tank main body 161 through the pan 164.

The tank stand 165 is made up of an attaching plate 167 and two supporting column-like members 168, 168 which are vertically provided on the attaching plate 167. It is thus so arranged that the height and the level of the tank main body 161 can be finely adjusted by the two supporting column-like members 168. The (lid of the) upper surface of the tank main body 161 has connected thereto a supply pipe 169 which is communicated with the pressurizing tank 149. There are also provided six connectors 170*a* for the pipes (reference numeral 158 in FIG. 43) which are communicated with the head unit 26, and a connector 170*b* for opening to the open air (outside air).

The liquid level detector 163 is made up of a high-liquid level detector 163*a* and a low-liquid level detector 163*b* which are disposed at a slight vertical distance from each other. The high-liquid level detector 163*a* and the low-liquid level detector 163*b* are mounted so as to be respectively adjustable in height at the base portion relative to the tank stand 165. The high-liquid level detector 163*a* and the low-liquid level detector 163*b* have a pair of plate-shaped arms 163*c*, 163*c* which extend toward the respective liquid level peep holes 162, 162 of the tank main body 161. The pair of the plate-shaped arms 163*c*, 163*c* have on one end thereof a light emitting element 163*d* which faces one of the liquid level peep holes 162 and on the other end thereof a light receiving element 163*e* which faces the other of the liquid level peep holes 162. In other words, a transmission type of liquid level sensor is constituted by the light emitting element 163*d* and the light receiving element 163*e*.

On an upstream side of the supply pipe 169 which is connected to the intermediate tank 126, there is interposed a gate valve 154 (see FIGS. 43 and 46). The supply of the function liquid to the intermediate tank 126 is controlled by this gate valve 154. In other words, the opening and closing of the gate valve 154 is controlled by the liquid level sensor of the high-liquid level detector 163*a* (detection of maximum liquid level) and by the liquid level sensor of the low-liquid level detector 163*b* (detection of minimum liquid level) so that the liquid level in the intermediate tank 126 always lies between the maximum level and the minimum level. According to this arrangement, the variation in head pressure of the function liquid to be supplied from the intermediate tank 126 to each of the function liquid droplet ejection heads 7 is minimized to the extent possible.

As shown in FIG. 43, the piping to lead from the intermediate tank 126 to the plurality of function liquid droplet ejection heads 7 (twelve in number having twenty four nozzle arrays 69) is arranged that six pipes 157 from the intermediate tank 126 are branched into twelve pipes through a header pipe 166. Each of these pipes is branched into two (twenty four in all) by a Y-shaped coupling near each of the function liquid droplet discharge heads 7. According to this arrangement, in each of the passages leading from the intermediate tank 126 to the plurality of function liquid droplet ejection heads 7, the pipe lengths become equal to each other, resulting in the same pressure loss (pipe friction loss).

A description will now be made about the maintenance apparatus 16, in the order of the wiping unit 35, the cleaning unit 34, and the flushing unit 33.

As sown in FIGS. 50 through 55, the wiping unit 35 is made up of a rolling unit 171 (see FIGS. 50 through 52) which is independently constituted, and a wipe-out unit 172 (see FIGS. 53 through 55), both of which are disposed on the common base 124 in an abutting positional relationship. The rolling unit 171 is disposed on this side of the common base 124 and the wipe-out unit 172 is disposed on the other (inner) side of the common base 124, i.e., on the side of the cleaning unit 34.

The wiping unit 35 of this embodiment has the following arrangement. Namely, while moving (traveling) a wiping sheet 182 (to be described hereinafter) relative to the head unit 26 which is held stationary right above the cleaning unit 34, i.e., in the cleaning position, the wiping unit 35 is moved by the moving table 123 in the X-axis direction, to thereby wipe out the function liquid droplet ejection heads 7. For this purpose, the wiping unit 35 is arranged to be rolled out of the rolling unit 171 to move around the wipe-out unit 172 for wiping operation and is rolled into the rolling unit 171.

Figure 50:
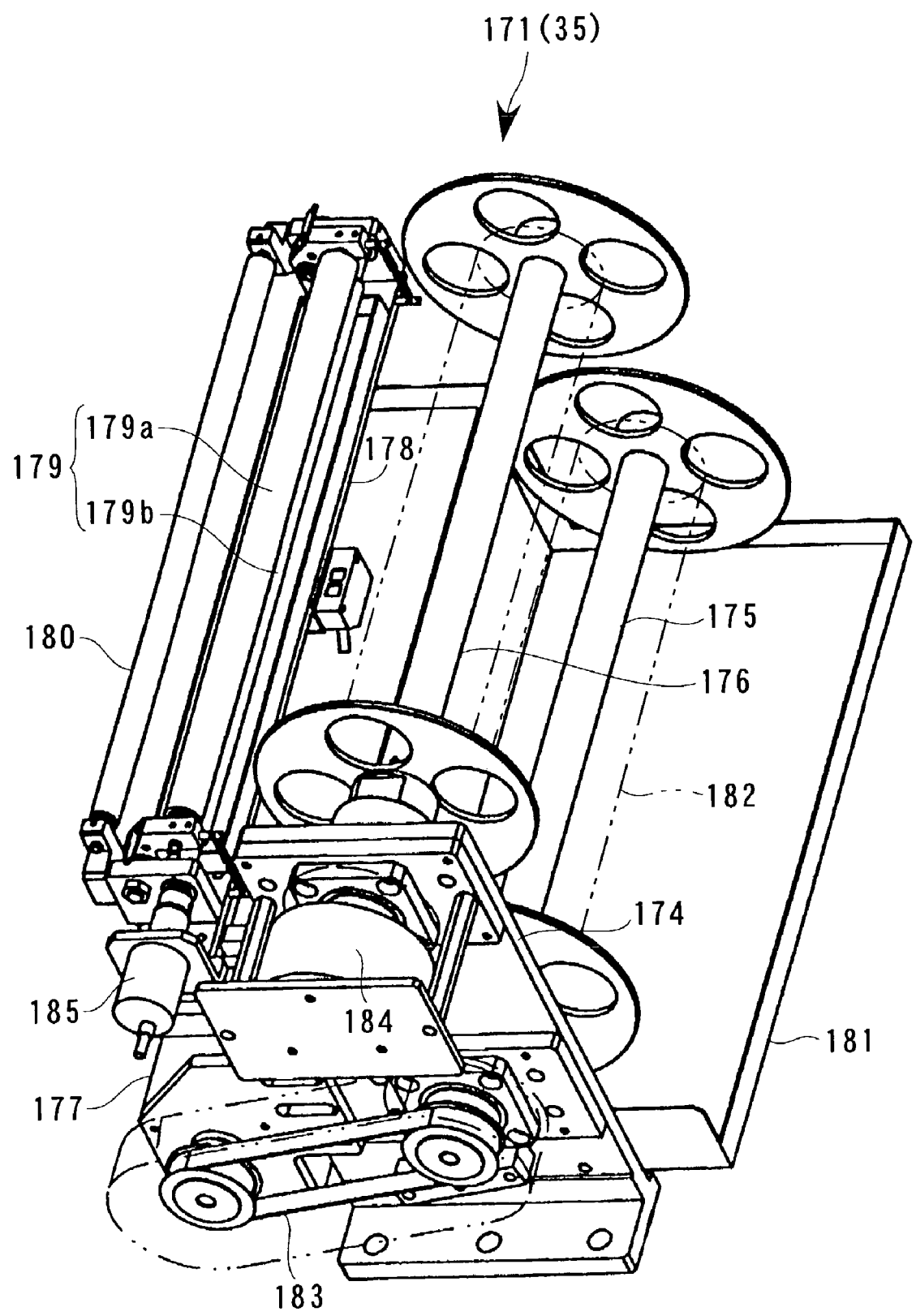
FIG. 50 is a perspective view of a rolling unit in a wiping unit according to this invention.
Figure 51:
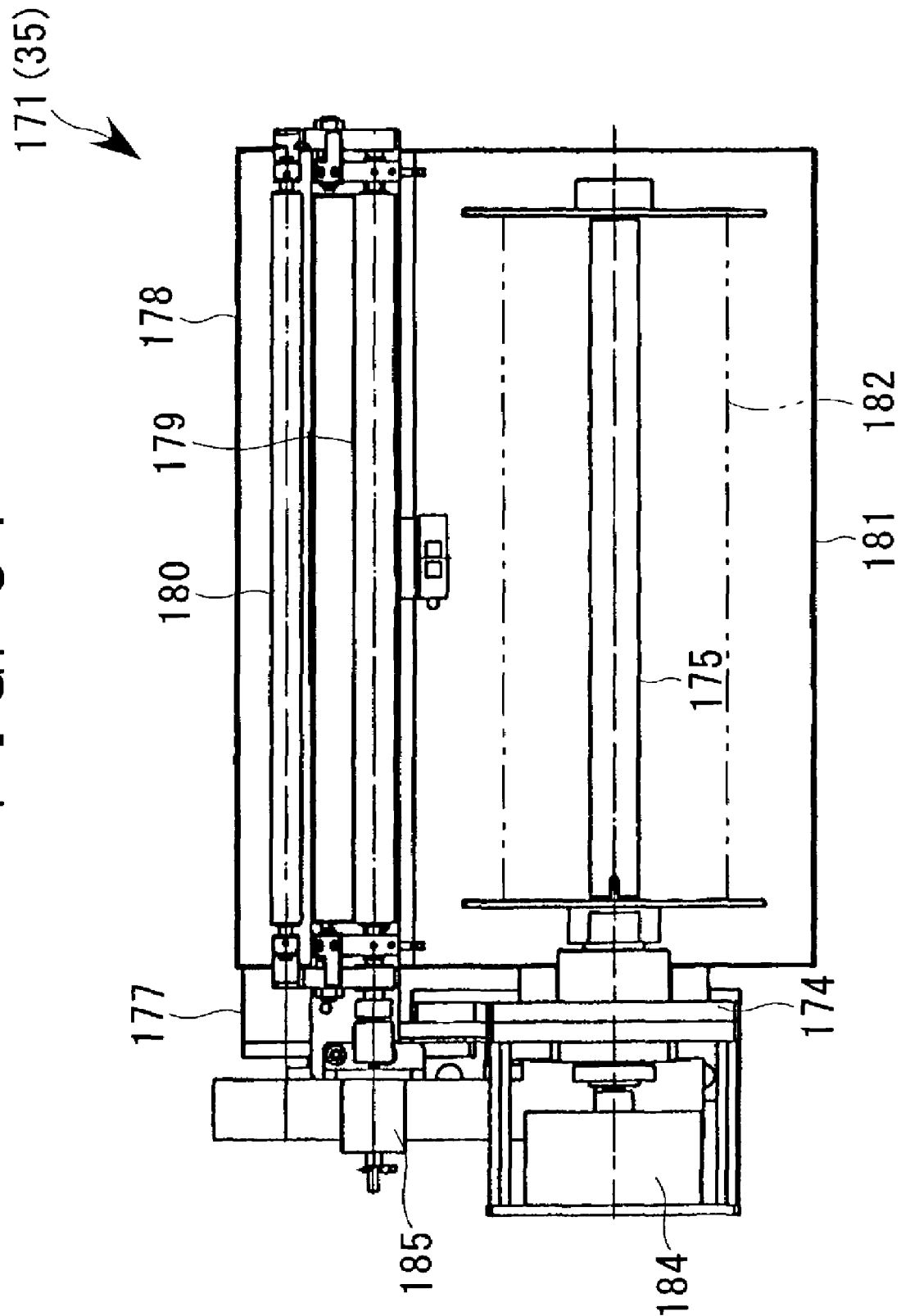
FIG. 51 is a plan view of the rolling unit in the wiping unit according to this invention.
Figure 52:
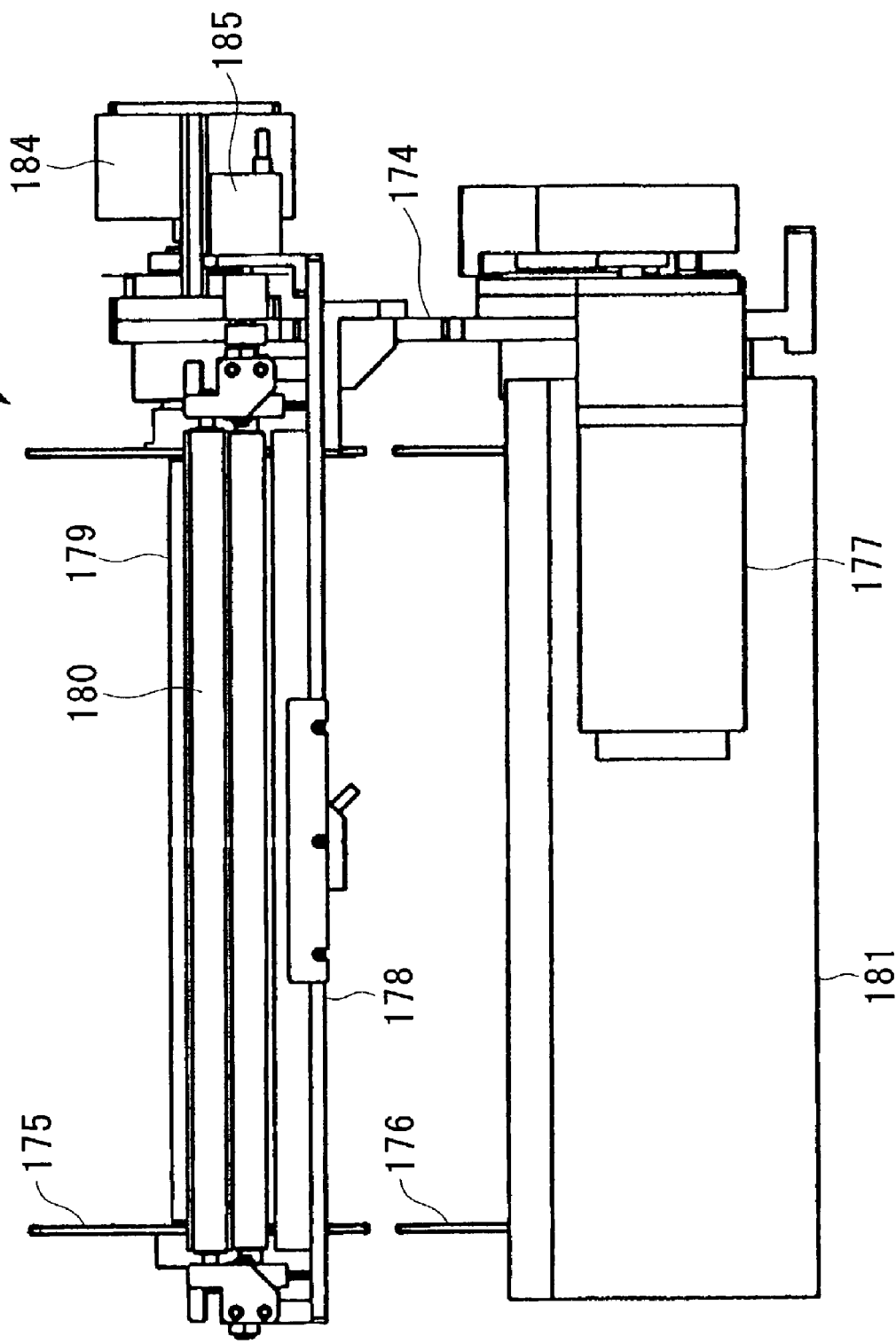
FIG. 52 is a front view of the rolling unit in the wiping unit according to this invention.

As shown in FIGS. 50 through 52, the rolling unit 171 is made up of: a frame 174 of a cantilever type; an upper feeding reel 175 which is rotatably supported on the frame 174; and a takeup motor 177 which rotates a takeup reel 176 for the purpose of taking up. The frame 174 has a sub-frame 178 which is fixed to an upper side portion thereof. This sub-frame 178 has supported thereon a speed detecting roller 179 and an intermediate roller 180 so as to be positioned on a front end of the feeding reel 175 in a manner supported on both sides. On a lower side of these constituent parts, there is disposed a cleaning liquid pan 181 for receiving therein the cleaning liquid.

The feeding reel 175 has inserted therethrough a wiping sheet 182 of a rolled shape. The wiping sheet 182 rolled (or fed) out of the feeding reel 175 is fed to the wiping unit 172 through a speed detecting roller 179 and an intermediate roller 180. Between the takeup reel 176 and the takeup motor, there is extended a timing belt 183. The takeup reel takes up the wiping sheet 182 by the rotation of the takeup motor 177.

Though details are given hereinafter, the wiping unit 172 is also provided with a motor (wiping motor 194) which feeds the wiping sheet 182. The feeding reel 175 is rotated while being braked so as to act against the wiping motor 194. The speed detecting roller 179 is a grip roller which is made up of an upper and a lower, i.e., two, freely rotatable rollers 179a, 179b and controls the takeup motor 177 by means of a speed detector 185 which is provided thereon. In other words, the feeding reel 175 feeds out the wiping sheet 182 in a state of being stretched, and the takeup reel 176 rolls up such that the wiping sheet 182 does not slacken.

Figure 53:
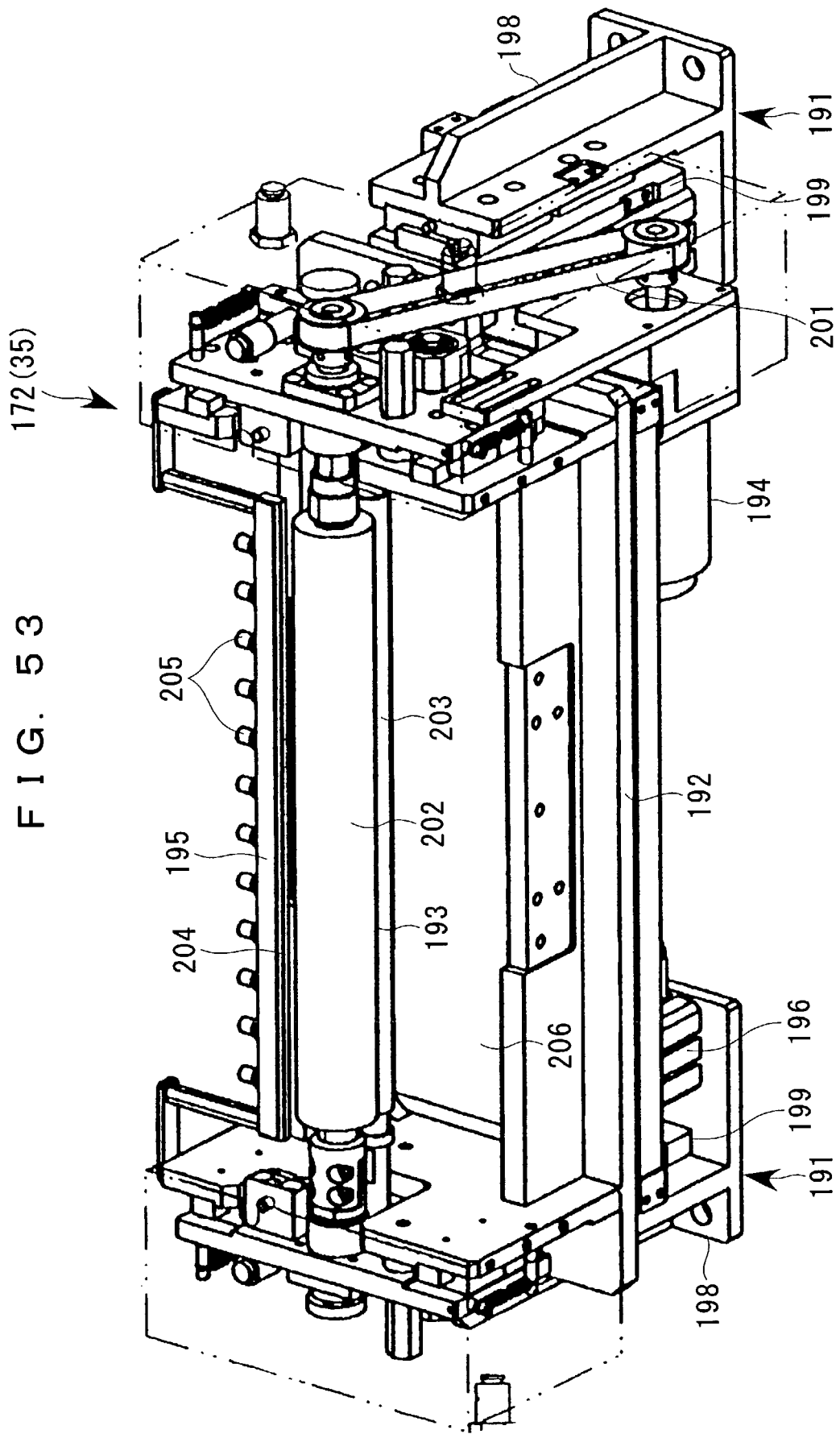
FIG. 53 is a perspective view of a wipe-out unit in the wiping unit according to this invention.
Figure 54:
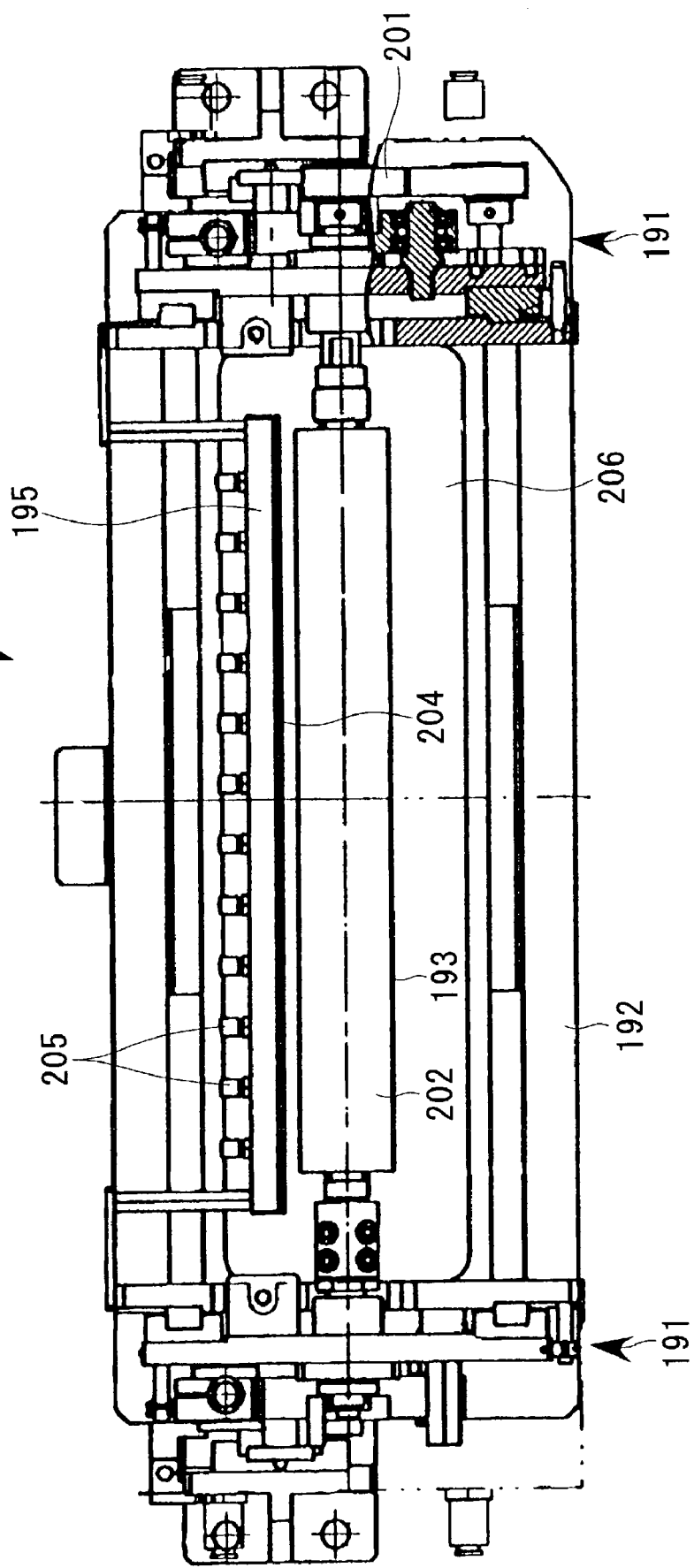
FIG. 54 is a plan view of the wipe-out unit in the wiping unit according to this invention.
Figure 55:
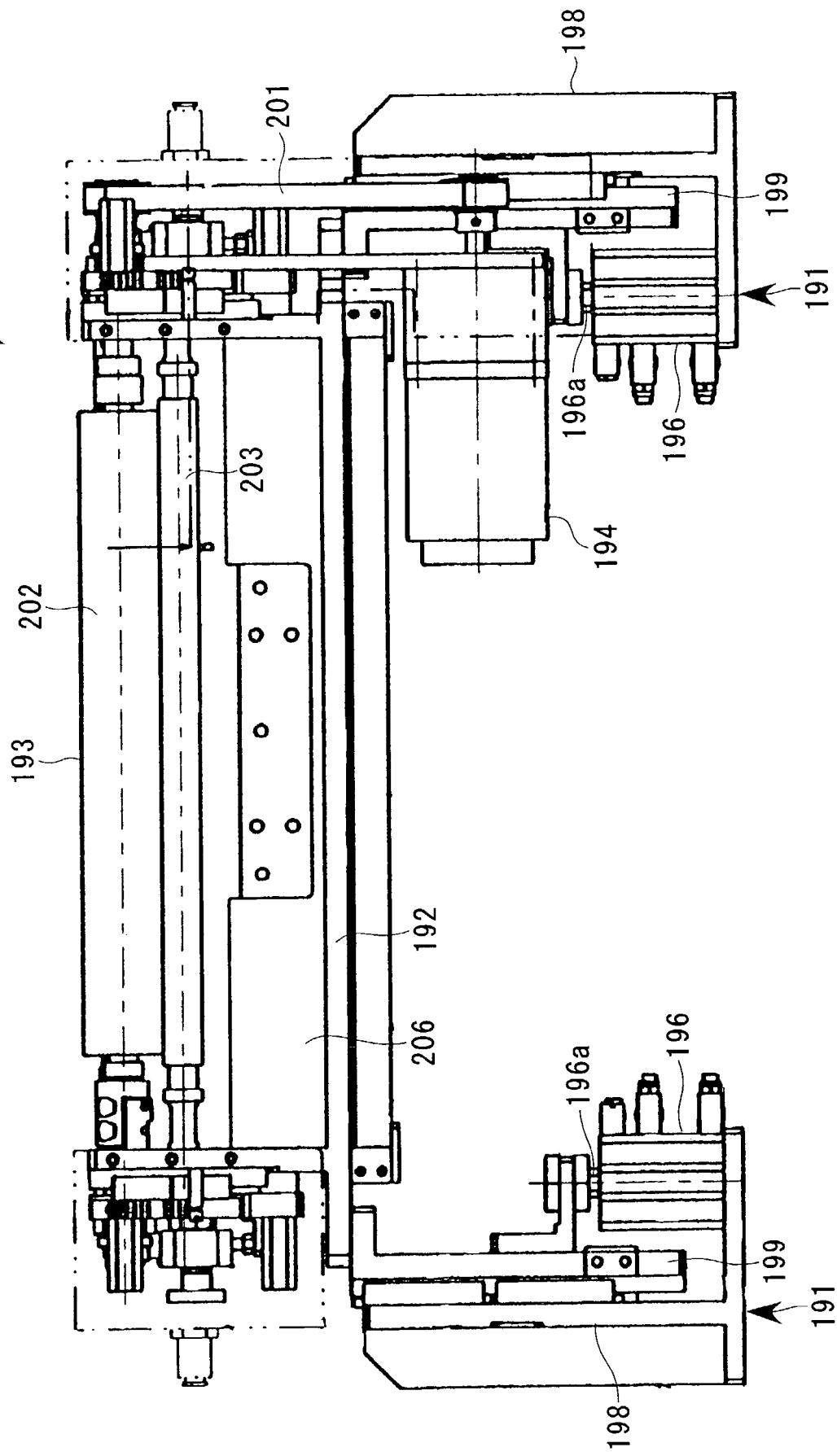
FIG. 55 is a front view of the wipe-out unit in the wiping unit according to this invention.
Figure 57:
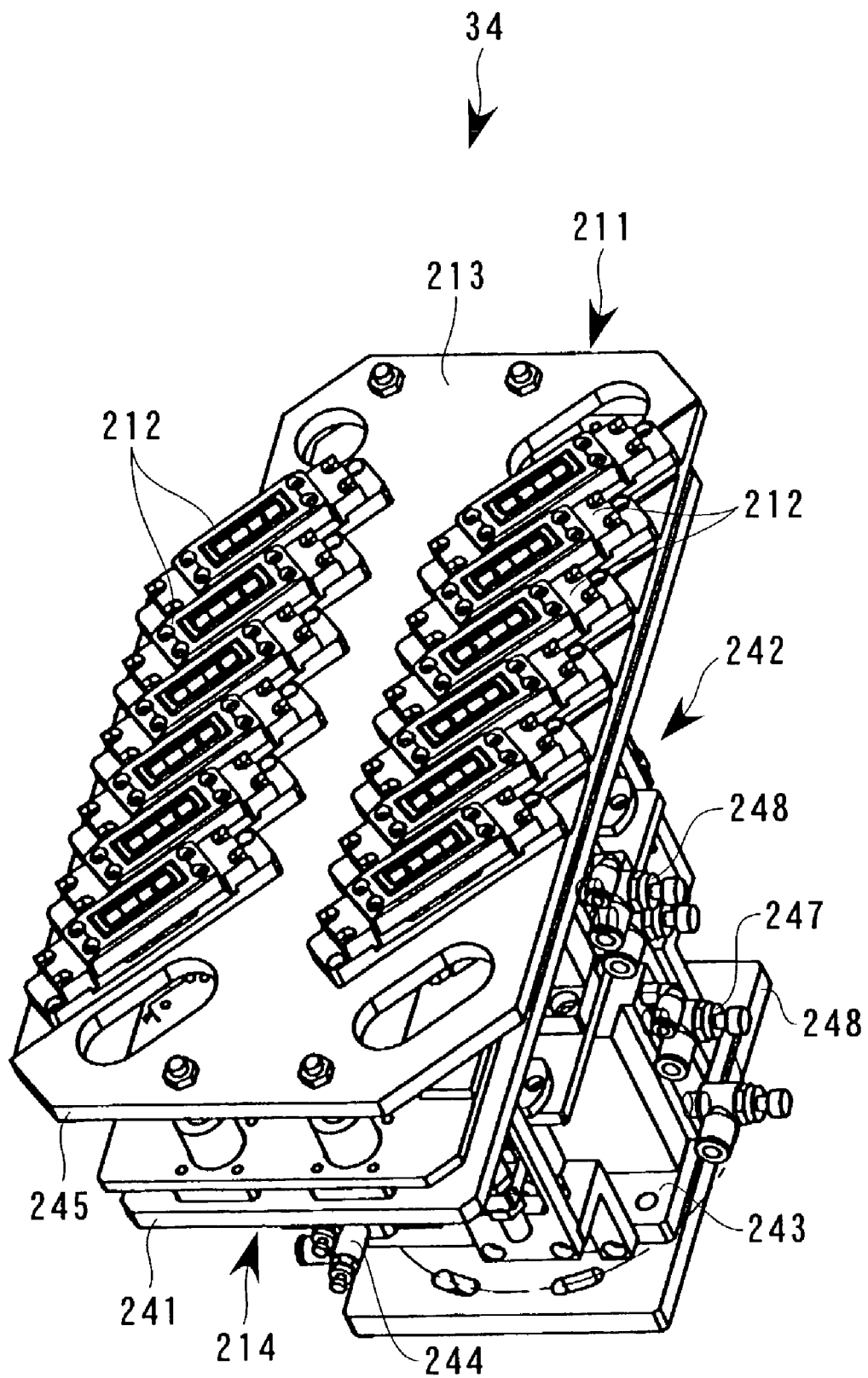
FIG. 57 is a outside perspective view of a cleaning unit according to this invention.
Figure 58:
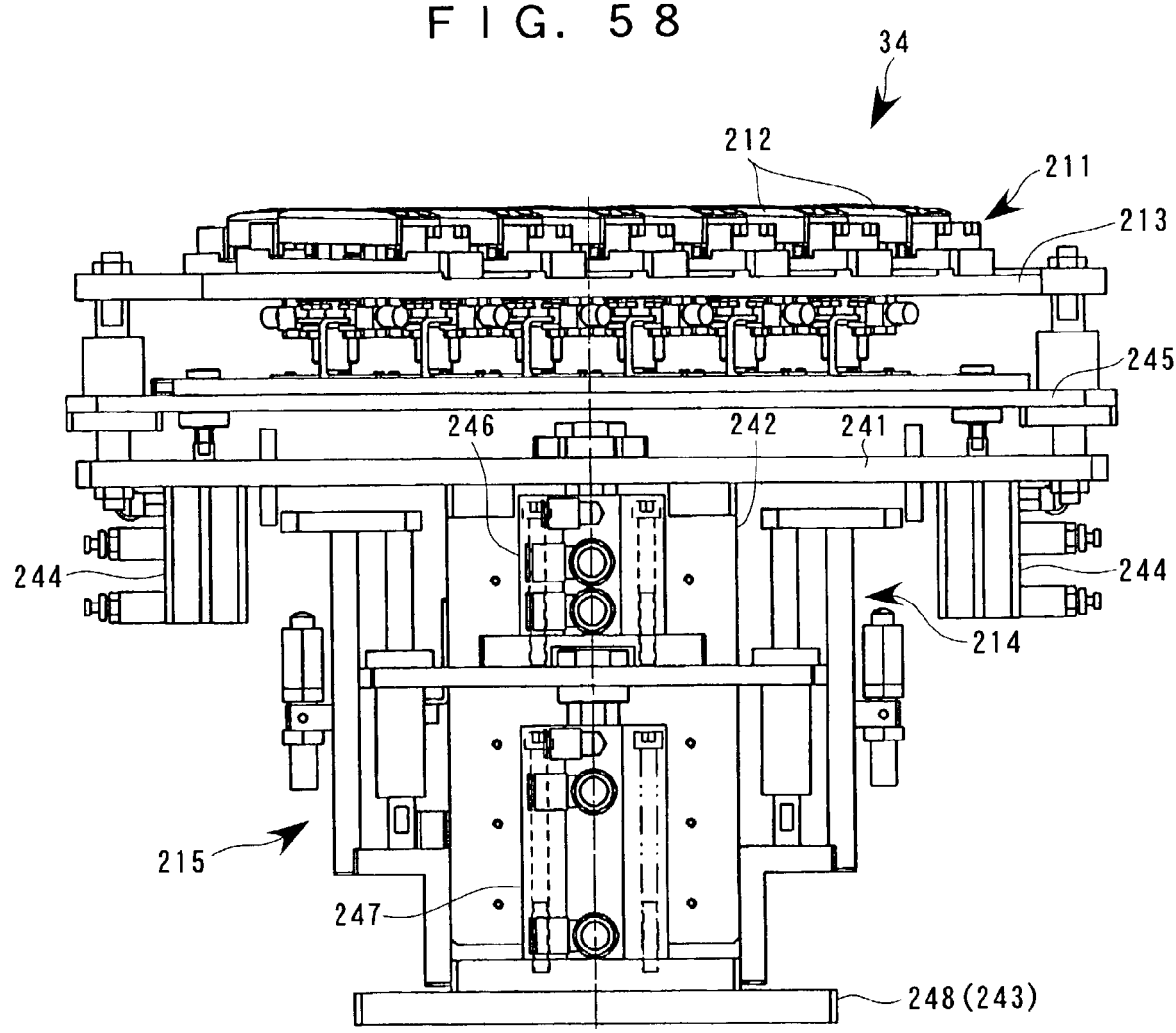
FIG. 58 is a front view of the cleaning unit according to this invention.
Figure 59:
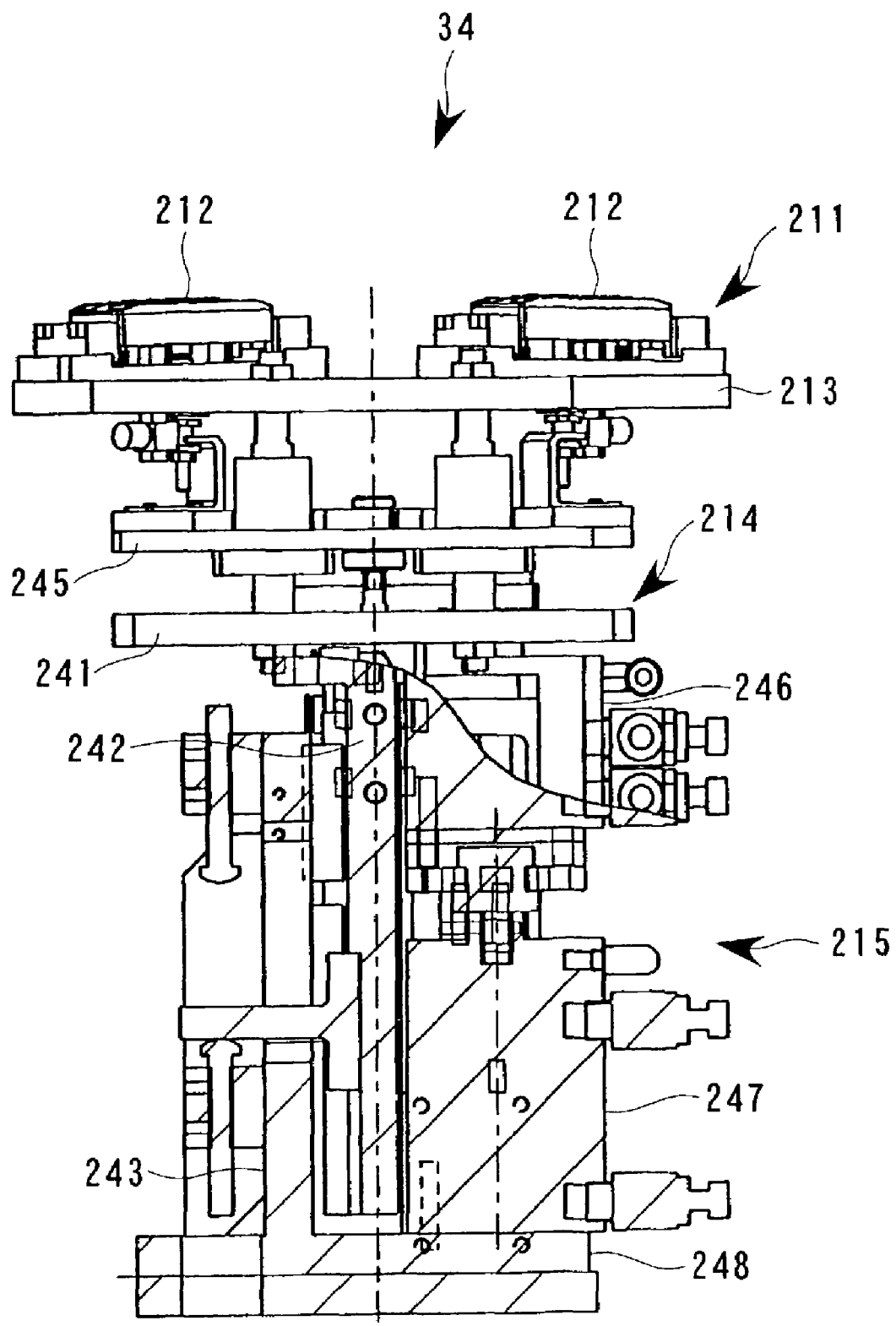
FIG. 59 is a side view of the cleaning unit according to this invention.
Figure 60:
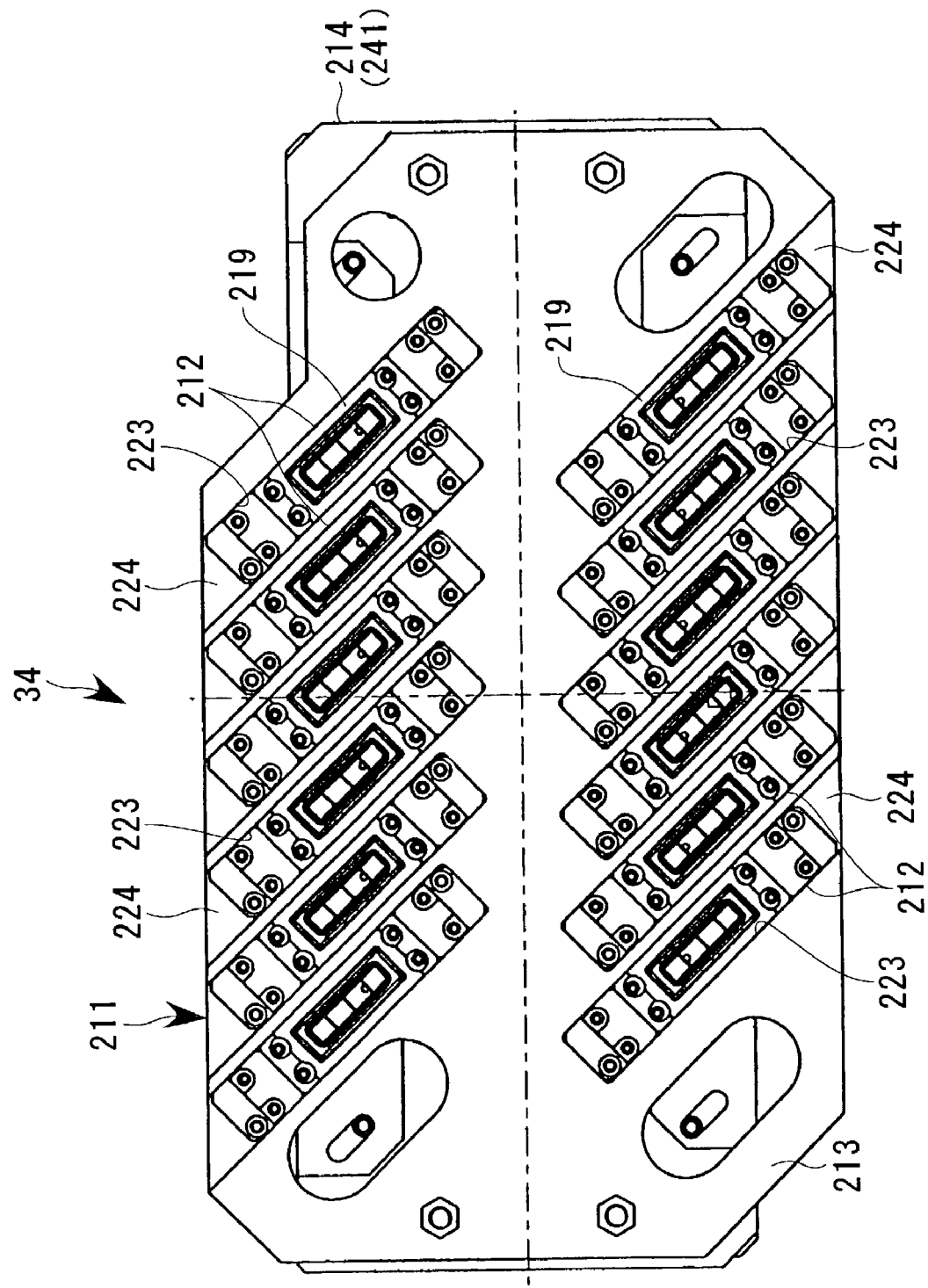
FIG. 60 is a plan view of the cleaning unit according to this invention.

As shown in FIGS. 53 through 55, the wiping unit 172 is made up of: a pair of left and right stands 191, 191; a base frame 192 which is substantially U-shaped in cross section and is supported by the pair of stands 191, 191; a wiping roller 193 which is rotatably supported by the base frame 192 on both sides thereof; a wiping motor 194 which rotates the wiping roller 193; a cleaning liquid spaying head 195 which lies in parallel with the wiping roller 193; and a pair of double-acting type of air cylinders 196, 196 which move the base frame 192 up and down.

The pair of stands 191, 191 are made up of stationary stands which are positioned respectively outside, and movable stands 199 which are attached to the inside of the stationary stands 198 in a manner slidable up and down. At the base portion of each of the stationary stands 198, there are vertically disposed the above-described air cylinders 196. A plunger 196a of each of the air cylinders 196 is fixed to the movable stand 199. By means of the pair of air cylinders 196, 196 which are driven at the same time, the base frame 192 and the wiping roller 193, the wiping motor 194, or the like, that are supported on the base frame 192 are moved up and down.

The wiping roller 193 is constituted by a grip roller made up of a driving roller 202 which is coupled to the wiping motor 194 through a timing belt 201, and a driven roller 203 which comes into contact with the driving roller 202 with the wiping sheet 182 sandwiched therebetween. The driving roller 202 is constituted by a rubber roller around which is wound a rubber having resiliency or flexibility, e.g., at the core portion. The wiping sheet to be wound therearound is urged toward the nozzle forming surface 67 of the function liquid droplet ejection heads 7.

The cleaning liquid atomizing head 195 lies close to the wiping roller 193 (driving roller 202) and sprays the wiping sheet 182, to be fed from the intermediate roller 180, with the cleaning liquid which is constituted by a solvent, or the like, of the function liquid. For this purpose, the front surface of the cleaning liquid atomizing head 195, i.e., the side of the wiping roller 193, is laterally provided with a plurality of atomizing nozzles 204 to suit the width of the wiping sheet 182. The back surface of the cleaning liquid atomizing head 195 is provided with a plurality of connectors 205 for connection of the pipes which are in communication with the cleaning tank 147.

The wiping sheet 182 which has been sprayed with the cleaning liquid is impregnated with the cleaning liquid and is arranged to face the function liquid droplet ejection heads 7 to wipe them out. Below the wiping roller 193, a cleaning liquid pan is also provided in the base frame 192 so that, together with the cleaning liquid pan 181 of the rolling unit 171, the cleaning liquid to be dropping from the wiping sheet 182 is received therein.

With reference to the schematic diagram in FIG. 56, a brief description will now be made about a series of wiping operations. Once the cleaning of the head unit 26 has been finished, the moving table 123 is driven, and the wiping unit 35 is moved forward to thereby make it close enough to the head unit 26. Once the wiping roller 193 has moved to the neighborhood of the function liquid droplet ejection heads 7, the moving table 123 is stopped. The air cylinders 196, 196 are driven to move upward the wiping roller 193 so as to urge or bring it into contact with the function liquid droplet ejection heads 7.

Then, the takeup motor 177 and the wiping motor 194 are driven to thereby feed the wiping sheet 182 for wiping operation, and the atomizing of the cleaning liquid is started. At the same time, the moving table 123 is moved once again. While feeding the wiping sheet 182, the wiping roller 193 is advanced so that the lower surface of the plurality of the function liquid droplet ejection heads 7 can be wiped. Once the wiping operation has been finished, the feeding of the wiping sheet 182 is stopped and the wiping roller 193 is lowered, and the wiping unit 35 is returned to the original position by the moving table 123.

With reference to FIGS. 57 through 60, a description will now be made about the cleaning unit 34. The cleaning unit 34 is made up of: a cap unit 211 in which twelve caps 212 corresponding to the twelve function liquid droplet ejection heads 7 are disposed in a cap base 213; a supporting member 214 which supports the cap unit 211; and an elevating mechanism 215 which moves up and down the cap unit 211 through the supporting member 214. As shown in FIG. 43, the cleaning unit 34 has connected thereto: a suction pipe 216 which is connected to each of the cps 212; a header pipe 217 to which are connected the twelve suction pipes 216; and a suction pump 153 which is disposed on a downstream side of the header pipe 217. The suction pump 153 is in communication with the reusing tank 148.

The supporting member 214 is provided with a supporting member main body 242 which has a supporting plate 241 for supporting the cap unit 211 on an upper end thereof, and a stand 243 which supports the supporting member main body 242 in a manner movable up and down. To the lower surface on longitudinal both sides of the supporting plate 241, there are fixed a pair of open air vent cylinders (air pressure cylinders) 244, 244. By means of these pair of open air vent cylinders 244, 244, an open air vent valve 231 which is described hereinafter is arranged to be opened and closed (to be opened by downward movement and closed by upward movement) through an operating plate 245.

The lifting mechanism 215 is made up of an upper lifting mechanism (air pressure cylinder) 246 and a lower lifting mechanism (air pressure cylinder) 247. The lower lifting mechanism 247 is fixed to a stand base 248 and moves the upper lifting mechanism 246 up and down. The upper lifting mechanism 246 is fixed at its plunger to the supporting plate 241 and moves the supporting member main body 242 up and down. In this arrangement, there is a predetermined gap between the lower surface of the head unit 26 (the nozzle forming surface of the function liquid droplet ejection heads 7) and the upper surface of the cap unit 211. The upward and downward movement corresponding to this gap is made by the upper lifting mechanism 246, and the upward and downward movement for adjusting the gap is made by the lower lifting mechanism 247. Therefore, in normal operation, only the upper lifting mechanism 246 is driven.

Figure 61:
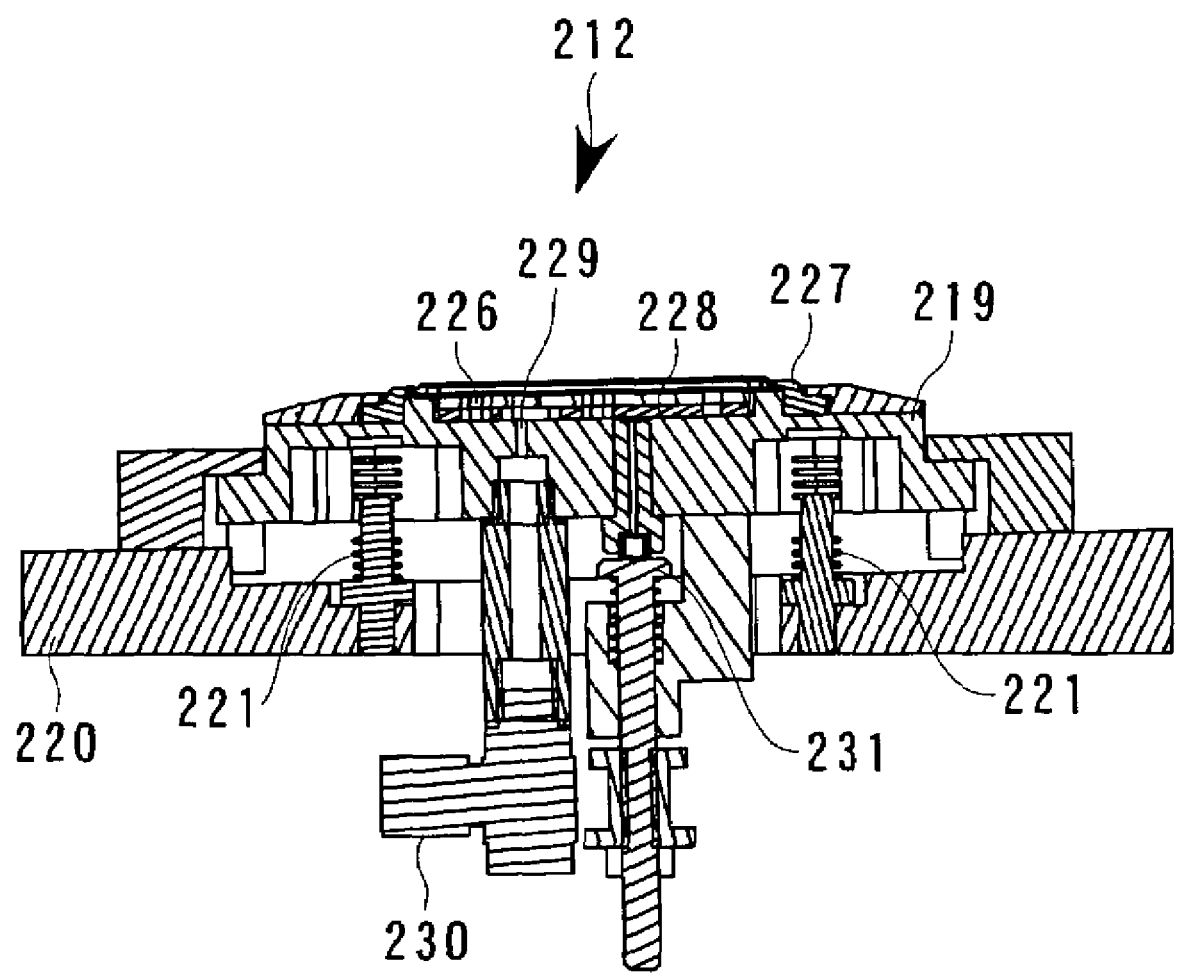
FIG. 61 is an enlarged sectional view of a cap of the cleaning unit according to this invention.

Twelve caps 212 correspond to the head main bodies 60 of the twelve function liquid droplet ejection heads 7 and are fixed to the cap base 213 in the same array and in the same inclination as those of the twelve head main bodies 60. As shown in FIG. 61, each of the caps 212 is made up of a cap main body 219 and a cap holder 220. The cap main body 219 is held by the cap holder 220 in a state of being urged upward by two springs 221, 221 and is also slightly movable up and down. The cap base 213 has formed therein twelve mounting openings 223 corresponding to the twelve caps 212, and has formed therein twelve shallow grooves 224 in a manner to enclose the mounting openings 223. Each of the caps 212 is screwed to the portions of the shallow grooves 224 in a state in which the lower part thereof is inserted into the mounting opening 223 and in which the cap holder 220 is set in position in the shallow groove 224 (see FIG. 60).

On a surface of each of the cap main bodies 219, there is formed a recessed portion 226 which encloses the two rows of nozzle arrays 69, 69 of the head main body 60. Around the periphery of the recessed portion 226 there is attached a sealing packing 227, and an absorbent member 228 is laid down on the bottom part. On the bottom part of the recessed portion 226 there is formed a small hole 229. This small hole 229 is in communication with an L-shaped coupling 230 which is connected to the suction pipe 216. When the function liquid is sucked, the sealing packing 227 is urged against the head main body 60 of the function liquid droplet ejection heads 7, and the nozzle forming surface 67 of the head main body 60 is sealed so as to enclose the two rows of nozzle arrays 69, 69. In the figure, reference numeral 231 denotes the open air vent valve. By opening it at the last stage of the suction operation of the function liquid, the function liquid that has been impregnated into the absorbent member 228 can also be sucked.

The cleaning unit 34 thus constituted is moved by the moving table 123 into the cleaning position. The head unit 26 is moved by the Y-axis table 24 so as to face right above the cleaning unit 34. Then, the lifting mechanism 215 (upper lifting mechanism 246) is driven so that the twelve caps 212 are urged from the lower side against the twelve function liquid droplet ejection heads 7 of the head unit 26. The cap urged against each of the function liquid droplet ejection heads 7 makes the cap main body 219 to sink slightly against its own two springs 221, 221. As a result, the sealing packing 227 comes into close contact with the nozzle forming surface 67 of the head main body 60.

Subsequently, by driving the suction pump 153, the function liquid is sucked from all of the ejection nozzles 68 of the twelve function liquid droplet ejection heads 7 through the cap unit 211. The open air vent valve 231 is opened prior to the completion of the suction, whereby the suction is finished. Once the sucking operation is finished, the lifting mechanism 215 (upper lifting mechanism 246) is driven again to thereby lower the cap unit 211. When the heads are in a standby state (i.e., are not in operation), such as while the apparatus operation is stopped, the cap unit 211 is lifted to seal each of the function liquid droplet ejection heads 7. The heads are thus made to be in a standby state.

With reference to FIGS. 62 through 66, a description will now be made about the flushing unit 33. The flushing unit 33 is to receive the function liquid ejected by the function liquid droplet ejection heads 7. The flushing unit 33 in the imaging apparatus 1 of this embodiment has mounted thereon: a movable type of small-sized flushing unit 33A (FIGS. 62 and 63) which is moved by the X-axis table 23 together with the substrate W (suction table 81); and a stationary type of large-sized flushing unit 33B (FIGS. 64 and 66) which is directly fixed to the stone base 22.

The movable type of flushing unit 33A is mainly used for flushing at the time of liquid droplet ejection operation of the head unit 26, and the stationary type of flushing unit 33B is mainly used for flushing at the time of standby of the head unit 26.

Figure 62:
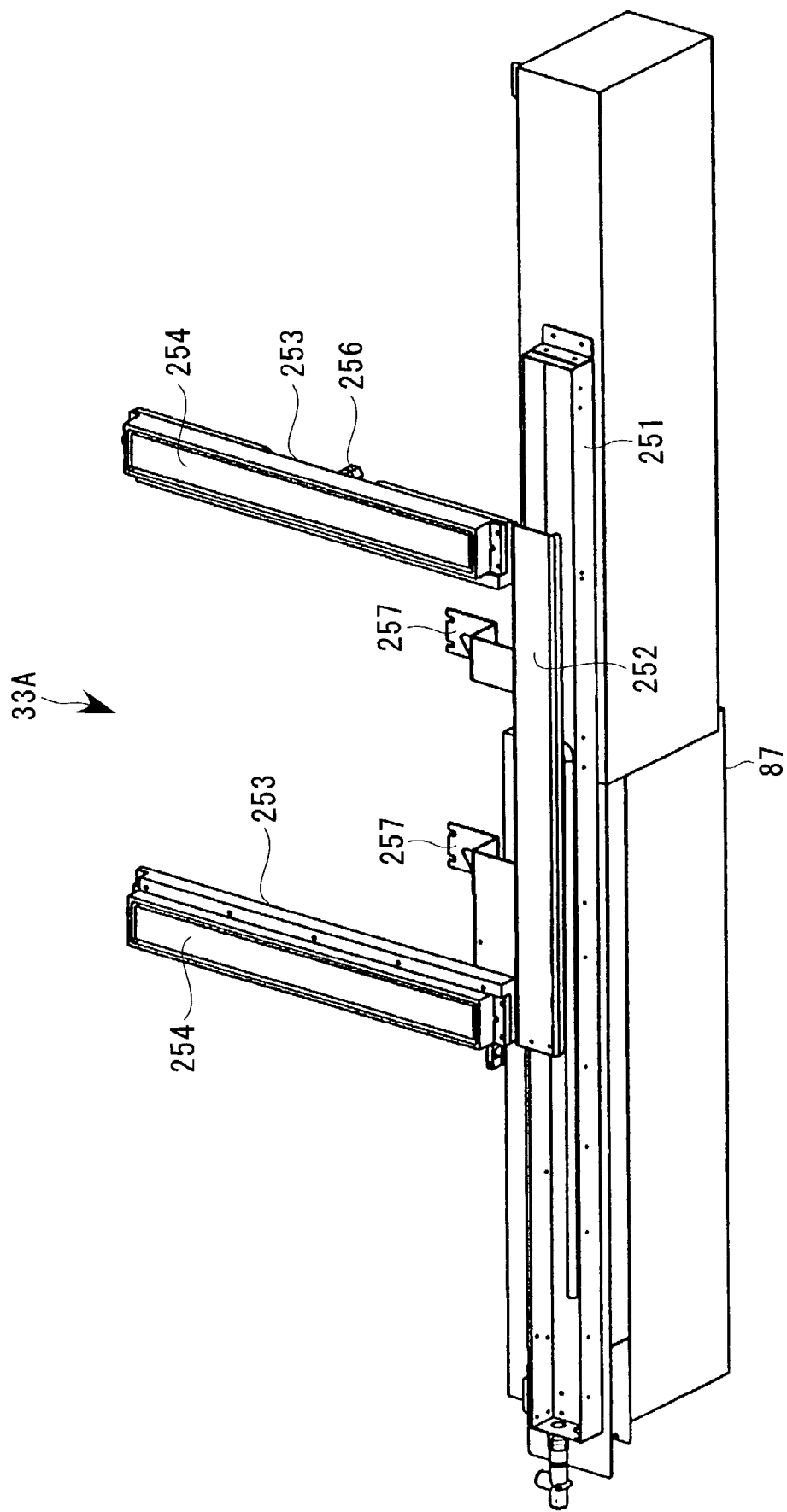
FIG. 62 is a perspective view of a flushing unit (movable type) according to this invention.
Figure 63:
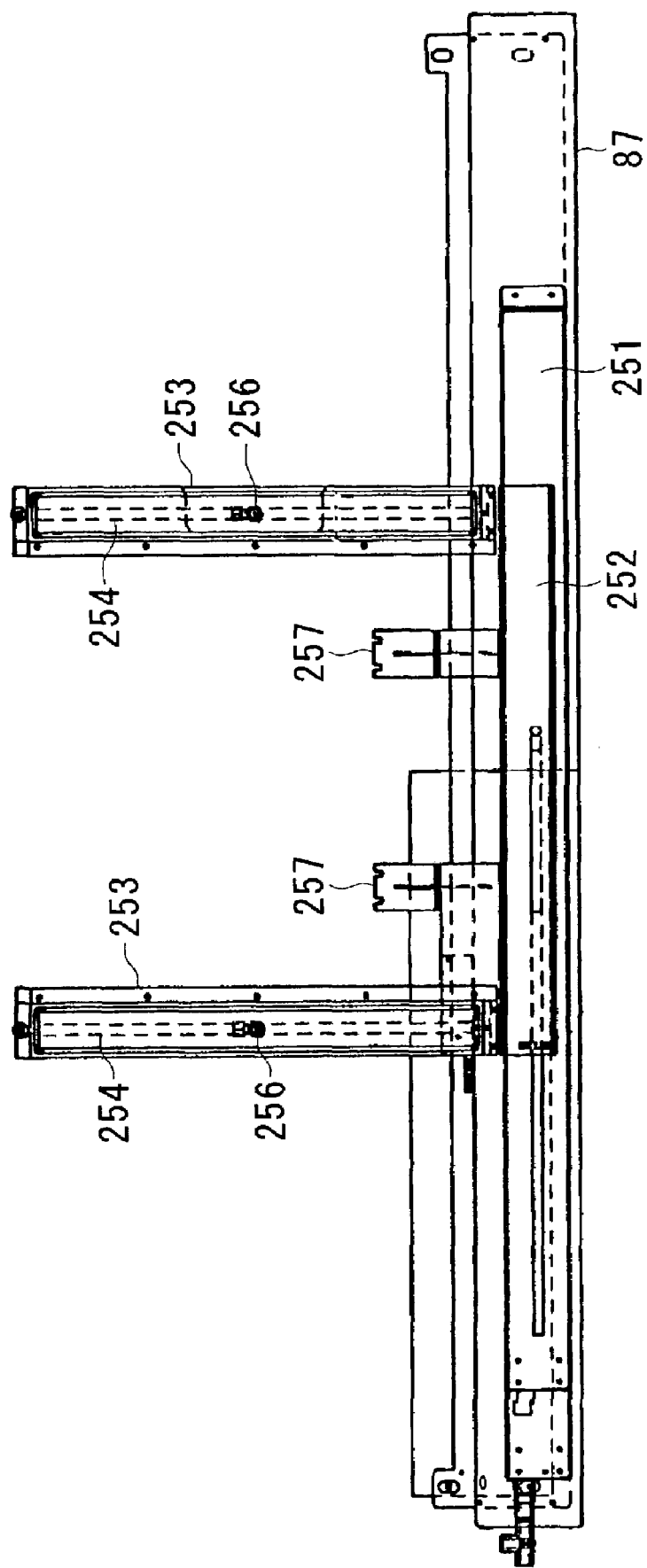
FIG. 63 is a plan view of the flushing unit (movable type) according to this invention.

First, with reference to FIGS. 62 and 63, a description will be made about the movable type of flushing unit 33A. This flushing unit 33A is disposed on the box 88 of the X-axis flexible cable bundler 87 (see FIG. 30). The flushing unit 33A is made up of: a slide base 251 which is fixed to the X-axis flexible cable bundler 87; a long plate-shaped slider 252 which is provided in a retractable manner on the slide base 251; a pair of flushing boxes 253, 253 which are fixed to both end portions of the slider 252; and a pair of function liquid absorbing materials 254, 254 which are laid out inside each of the flushing boxes 253.

The pair of the flushing boxes 253, 253 have widths corresponding to each of the function liquid droplet ejection head groups 7a of the head unit 26 and have lengths corresponding to the movable range in the direction of sub-scanning of each of the function liquid droplet ejection head groups 7a, thereby being formed in an elongated shape. These pair of flushing boxes 253, 253 extend at right angles from the slider 252 to the upper side of the X-axis table 23 and are disposed in a manner to sandwich the suction table 81. At the central bottom surface of each of the flushing boxes 253, 253 there is attached a drain coupling 256 which constitutes a drain port. The drain pipe (not illustrated) which is connected to this drain coupling 256 is connected to the waste liquid tank 150 through the X-axis flexible cable bundler 87.

The slider 252 has fixed thereto a pair of mounting pieces 257, 257 of the X-axis table 23. The mounting pieces 257, 257 are positioned between the pair of flushing boxes 253, 253 and extend toward the Θ-axis table 82. The front end portions of these pair of mounting pieces 257, 257 are fixed to the base portion of the Θ-axis table 82. In other words, the pair of the flushing boxes 253, 253 are arranged to be movable together with the Θ-axis table 82 through the slide base 251.

In the movable type of flushing unit 33A as constructed above, when the flushing unit 33A moves forward together with the Θ-axis table 82 as shown in FIG. 30, the right side flushing box 253 as shown therein passes first under the head unit 26. At this time, the plurality of (twelve) function liquid droplet ejection heads 7 carry out flushing operation in sequence, and the head unit 26 transfers to the ordinary liquid droplet ejection operation. Similarly, when the flushing unit 33A moves forward, the left side flushing box 253 first passes right under the head. At this time, the plurality of function liquid droplet ejection heads 7 carry out flushing operation, and the head unit 26 transfers to the ordinary liquid droplet ejection operation.

In other words, in the movable flushing unit 33A, the flushing is appropriately carried out while the head unit 26 moves back and forth for the main scanning. Therefore, the head unit 26, or the like, does not move exclusively for the purpose of the flushing operation, and the flushing thus does not influence the tact time.

Figure 64:
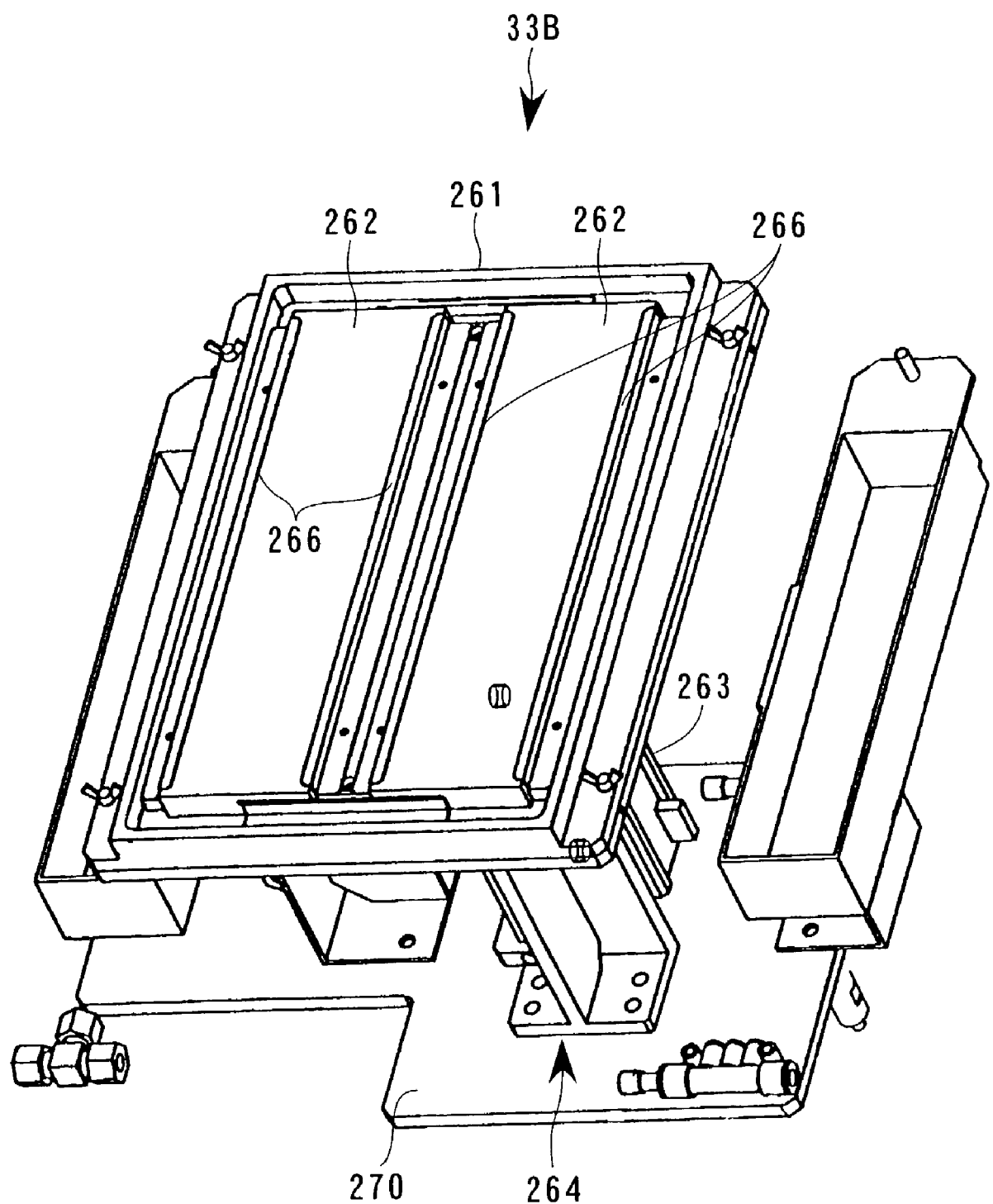
FIG. 64 is a perspective view of a flushing unit (stationary type) according to this invention.
Figure 65:
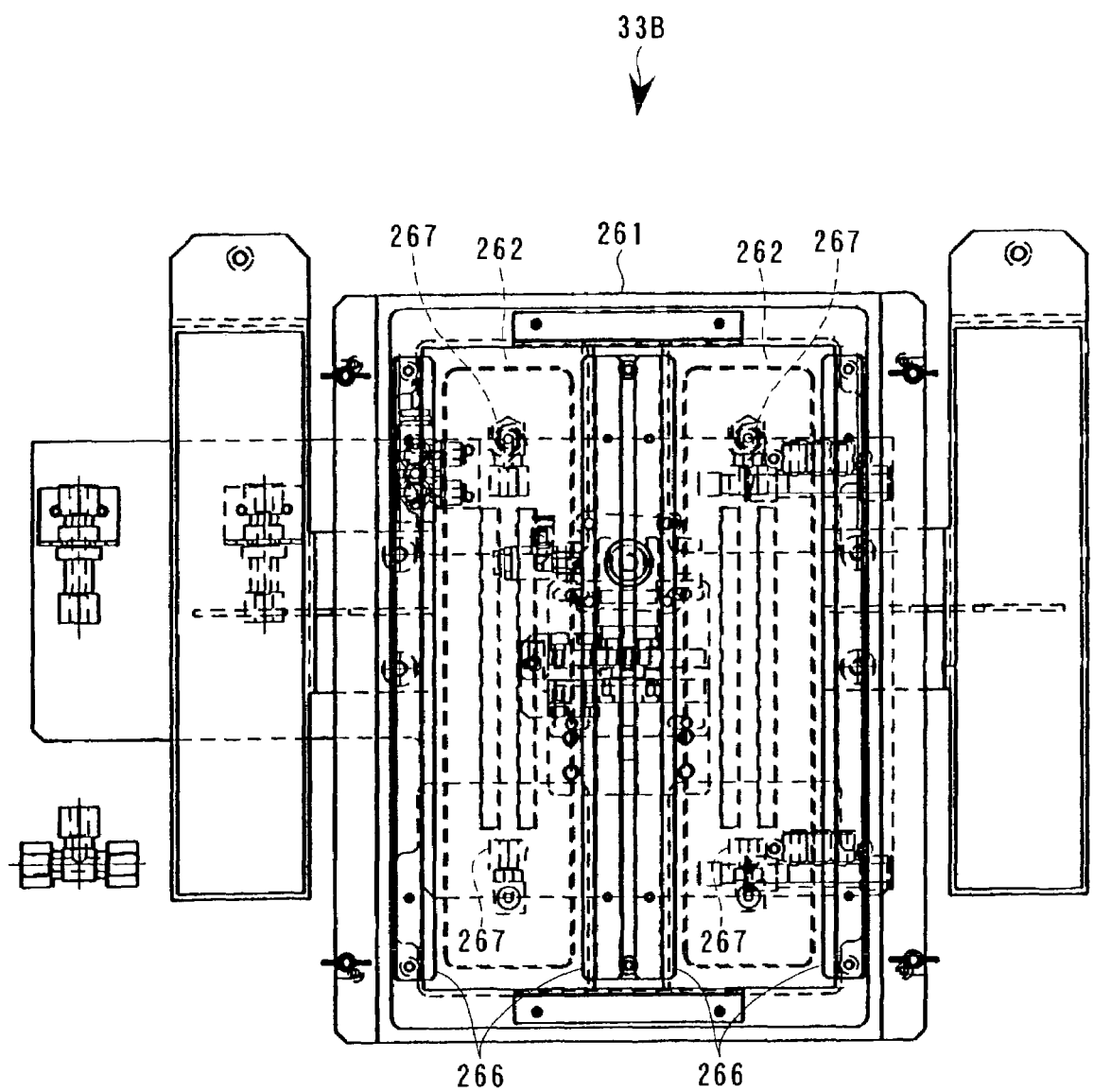
FIG. 65 is a plan view of the flushing unit (stationary type) according to this invention.
Figure 66:
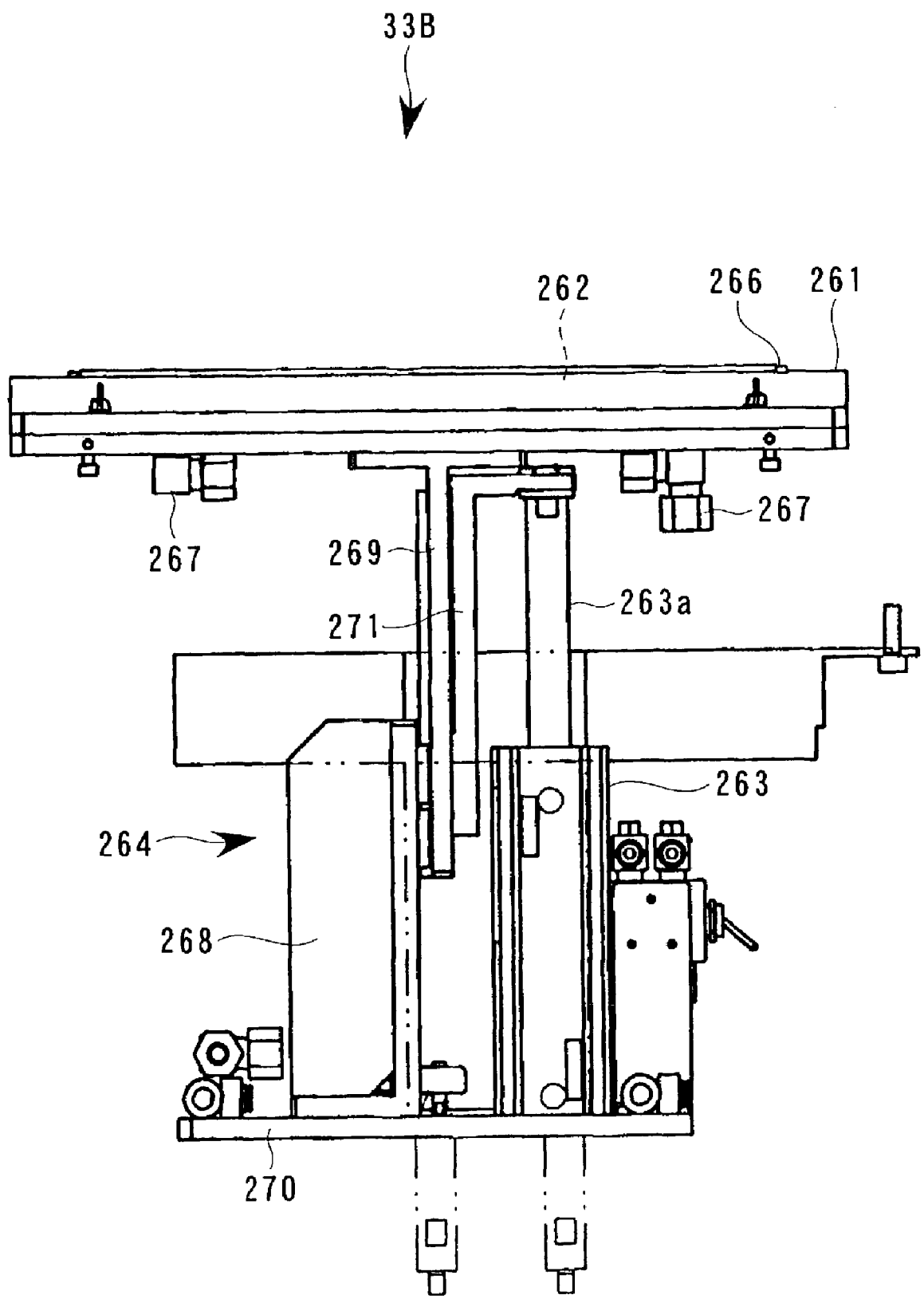
FIG. 66 is a side view of the flushing unit (stationary type) according to this invention.

With reference to FIGS. 64, 65 and 66, a description will now be made about the stationary type of flushing unit 33B. The flushing unit 33B is made up of: flushing boxes 261, 261 each having an upper end which is left open for receiving the function liquid droplet; two sets of function liquid absorption members 262, 262 which are laid inside the flushing boxes 261; a lifting cylinder 263 which moves the flushing box 261 up and down; and a box stand 264 which supports the flushing box 33B.

The flushing box 33B is of a shape of a shallow tray formed into a rectangle and has inside thereof two sets of function liquid absorption members 262, 262 which are disposed at a distance from each other in correspondence to the two rows of function liquid droplet ejection heads 7a, 7a of the head unit 26. Inside the flushing box 261, there is provided a splash-prevention board 266 which prevents the function liquid droplet from splashing at the time of flushing, the board 266 being disposed in a manner to sandwich, from both sides, each of the function liquid absorption members 262. The bottom board of the flushing box 33B is provided with drain couplings 267 which serve as drain ports to two portions corresponding to each of the function liquid absorption members 262, i.e., a total of four drain ports. The drain pipes (not illustrated) connected to these drain couplings 267 are connected to the waste liquid tank 150.

The box stand 264 is made up of a fixed or stationary stand 268, a movable stand 269 which is mounted on a side surface of the stationary stand 268 in a manner slidable up and down, and a stand base 270 which supports the stationary stand 268. The stand base 270 is vertically provided with the above-described lifting cylinder 263 in a manner to lie face to face with the stationary stand 268. A plunger 263a of the lifting cylinder 263 is fixed to the movable stand 269 through a bracket 271.

The flushing box 33B at the time when the apparatus is in operation is in a lifted position, but it is moved to the lowered position at the time when the apparatus is not in operation so as not to interfere with the maintenance work, or the like. In the liquid droplet ejection apparatus 10 of this embodiment, after the function liquid droplet has been ejected and after the substrate W has been moved forward, the head unit 26 is moved, while the substrate W is being returned, by the Y-axis table 24 to the position of the flushing unit 33B to thereby carry out the flushing.

Figure 67:
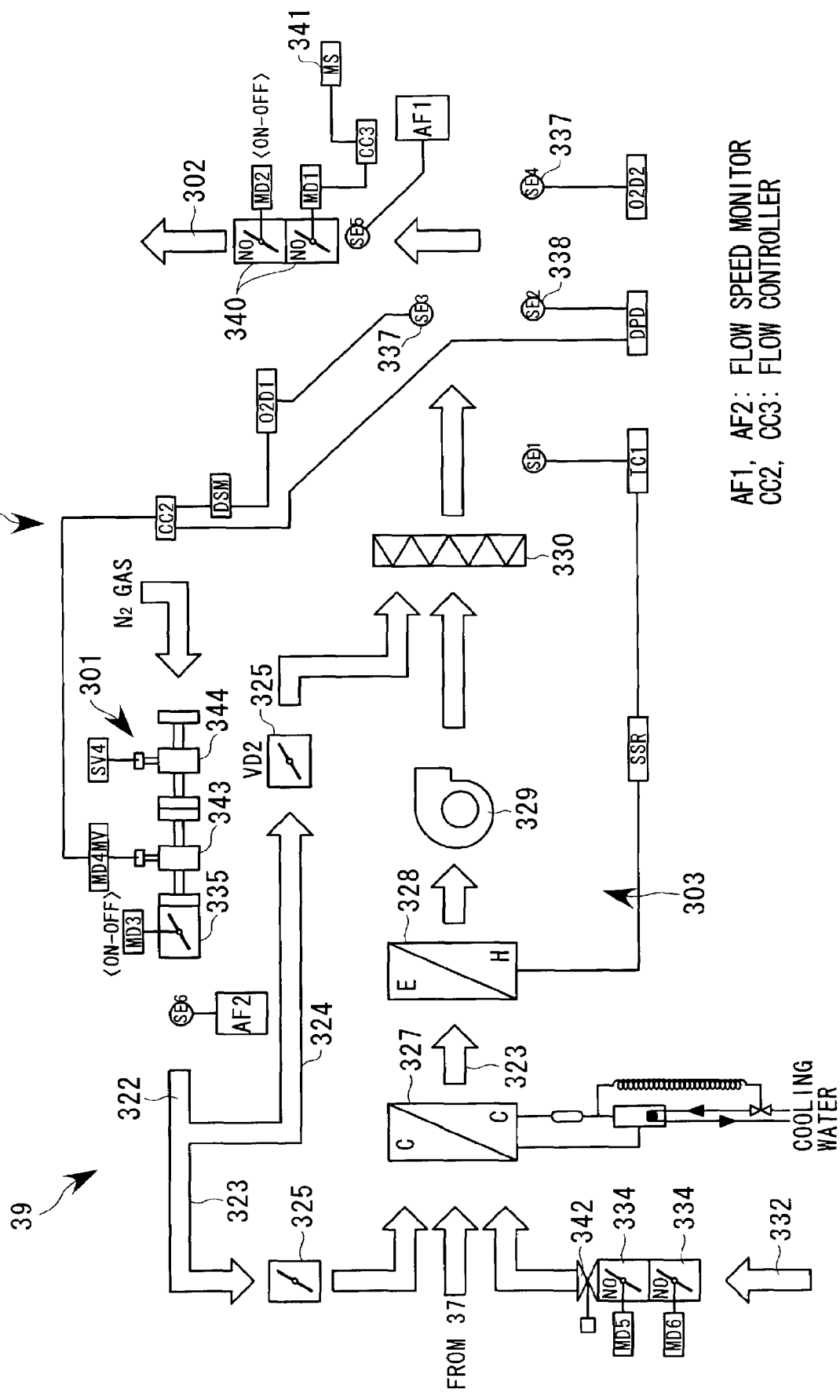
FIG. 67 is a system diagram of a main chamber according to this invention.
Figure 68:
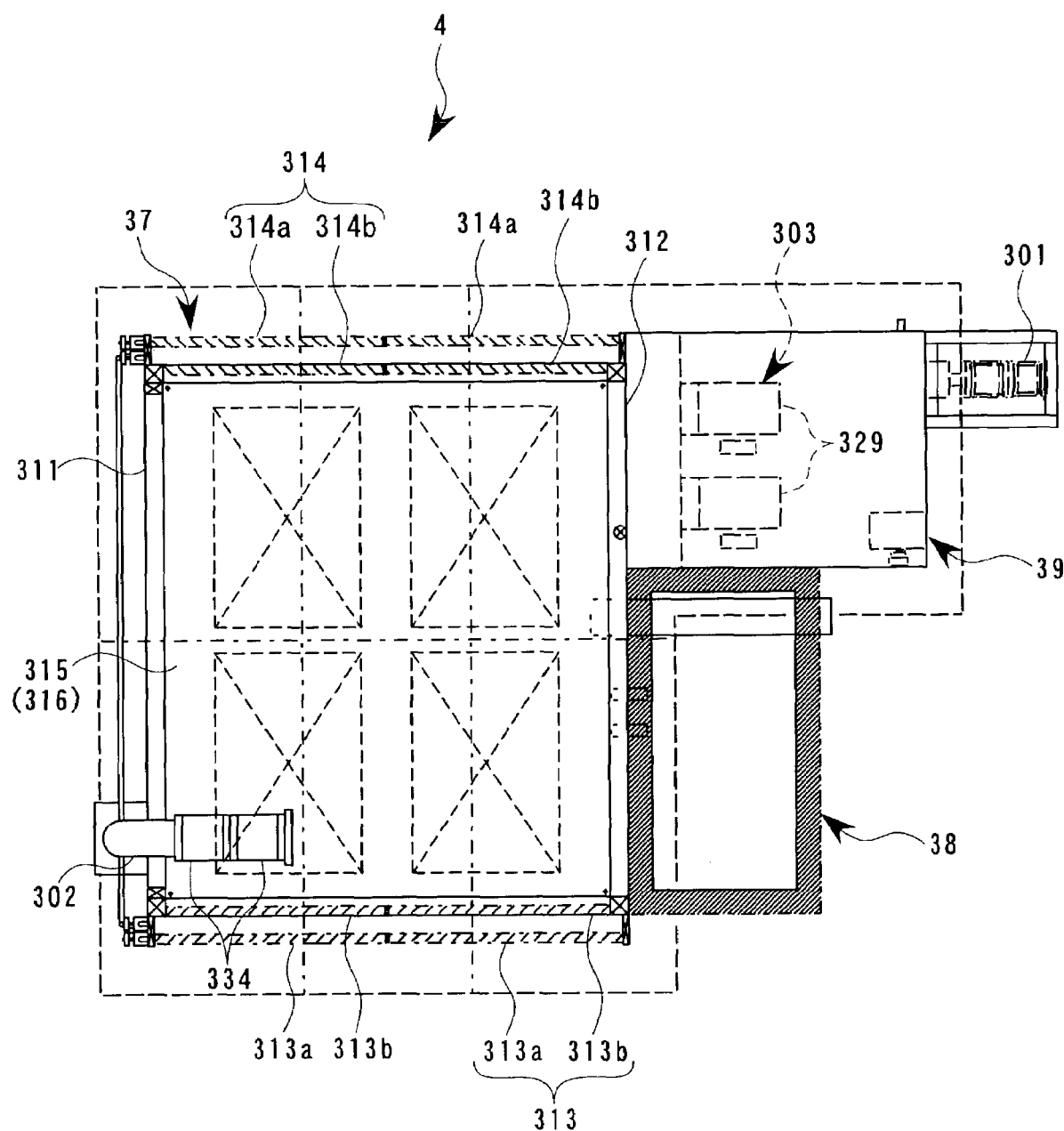
FIG. 68 is a plan view of the main chamber according to this invention.
Figure 69:
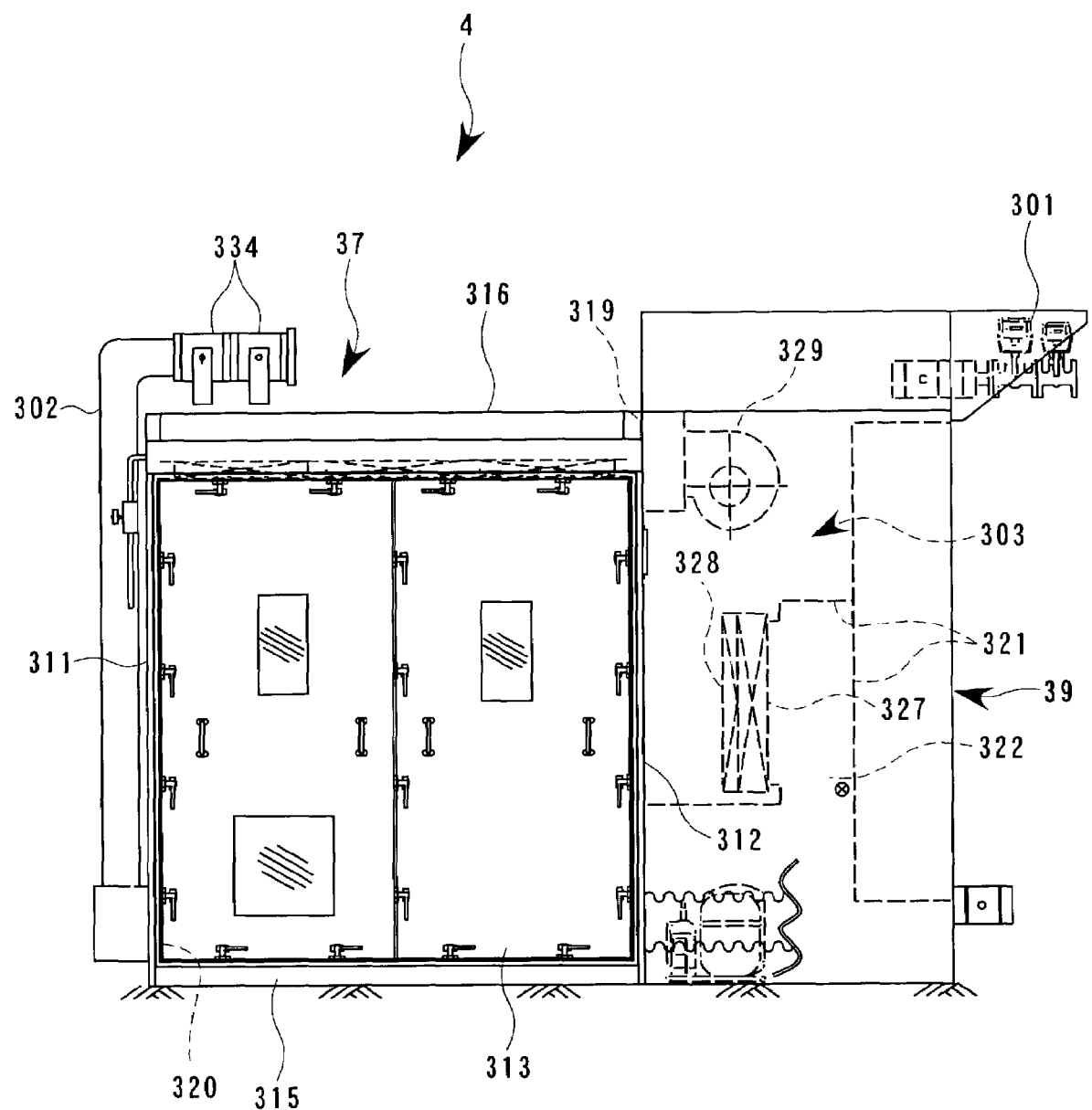
FIG. 69 is a front view of the main chamber according to this invention.
Figure 70:
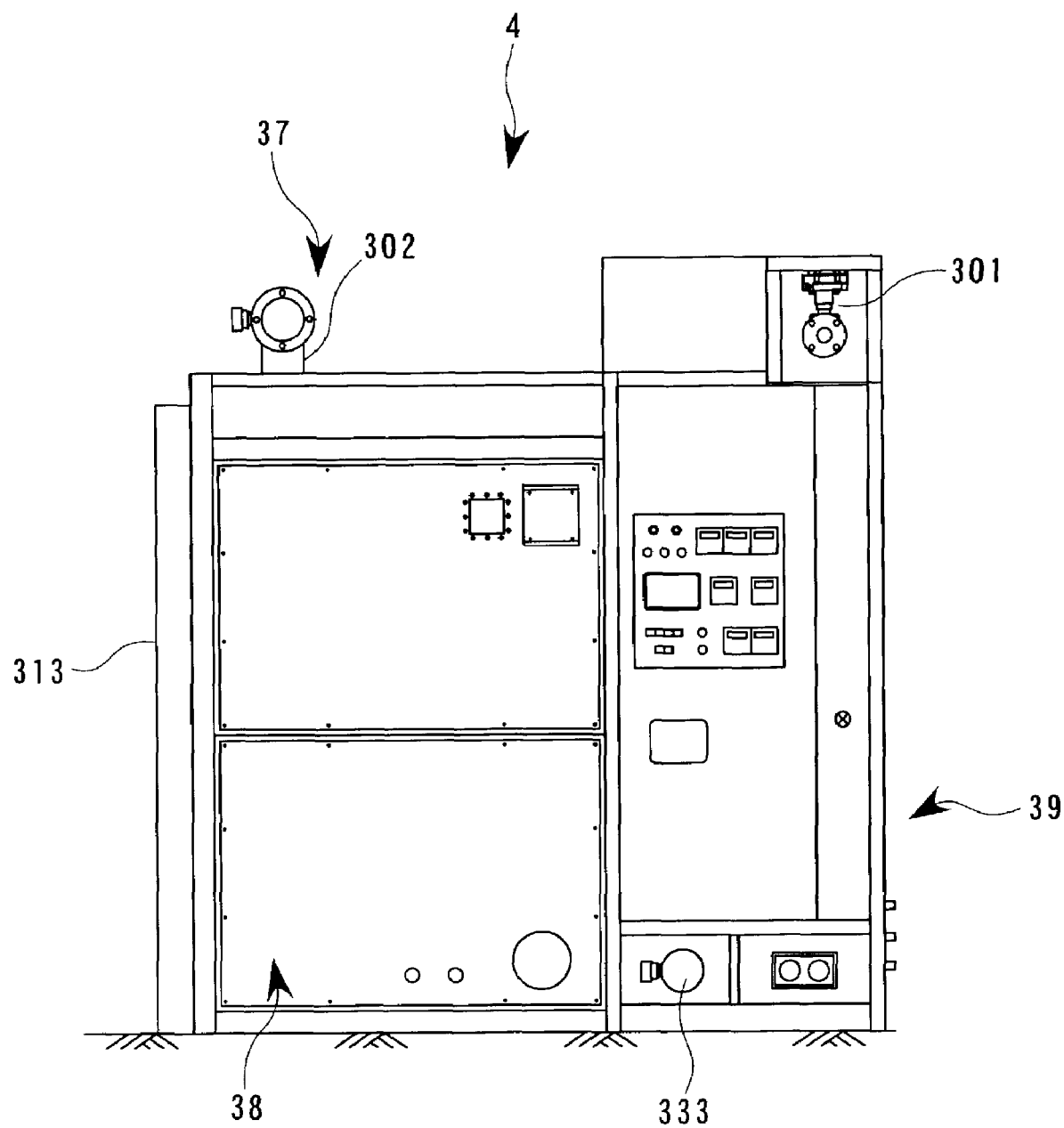
FIG. 70 is a right side view of the main chamber according to this invention.
Figure 71:
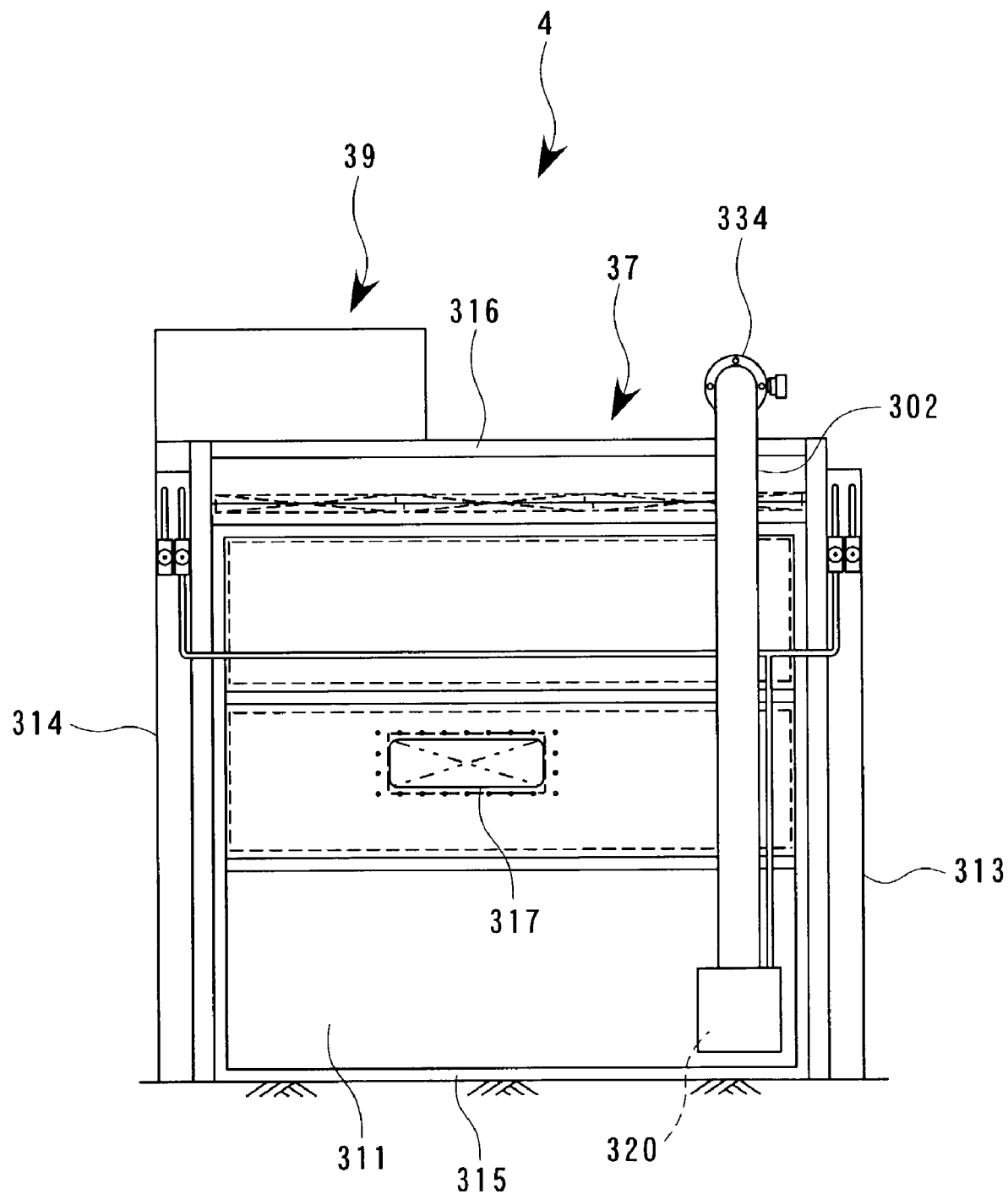
FIG. 71 is a left side view of the main chamber according to this invention.

With reference to FIGS. 67 through 71, a description will now be made about the main chamber 4. In the description of the main chamber 4, the lower side of the drawing sheet of FIG. 67 is defined as the "front," the upper side thereof is defined as "rear," the left side thereof is defined as "left," and the right side is defined as "right." The main chamber 4 is made up of: the chamber room 37 which contains or houses therein the imaging apparatus 1; the electrical room 38 which is parallelly disposed on the right front portion of the chamber room 37; and the machine room (gas supply equipment) 39 which is parallelly disposed on the right rear portion of the chamber room 37. As the inert gas to be charged into the chamber room 37, preferably one of the following gases is used, i.e., nitrogen, carbon dioxide, helium, neon, argon, krypton, xenon, and radon. In this embodiment, nitrogen (nitrogen gas) is used from the viewpoint of cost and handling safety.

The inert gas (nitrogen gas) is introduced from a gas manufacturing apparatus (not illustrated) into the machine room 39 through the gas introduction unit 301 and is subjected therein to conditioning for further introduction into the chamber room 37. The inert gas inside the chamber room 37 is appropriately exhausted or vented through a gas exhaust duct 302 which is added to the left front portion of the chamber room 37 and is sent to a gas treatment apparatus (not illustrated). In other words, the gas manufacturing apparatus, the gas introduction unit 301, the machine room 39, or the like, constitute the gas supply apparatus. The gas exhaust duct 302 and the gas treatment apparatus constitute the gas exhaust apparatus.

The chamber room 37 is of a prefabricated type which is assembled by mutually sealing, with an airtight material, a left side wall 311, a right side wall 312, a front side double-construction panel 313, a rear side double-construction panel 314, a floor wall 315, and a ceiling wall 316. On the other hand, the liquid droplet ejection apparatus 10 which is housed inside the chamber room 37 is housed in a posture with the back and forth direction being defined as the Y-axis direction and with the left and right direction being defined as the X-axis direction. The front side double-construction panel 313 and the rear side double-construction panel 314 are detachable panels. Taking into consideration the maintenance work, or the like, the auxiliary apparatus 11 of the imaging apparatus 1 is disposed to face the front-side double-construction panel 313. Taking into consideration the carrying (or transporting) the head unit 26 inside, the home position side of the head unit 26 is disposed to face the rear double-construction panel 314. The left side wall 311 has formed therein a shutter-equipped handover opening 317 for carrying the substrate W into, and out of, the chamber room 37.

The front side double-construction panel 313 and the rear side double-construction panel 314 are made up of two outer panels 313a, 314a and two inner panels 313b, 314b, respectively, both of which are provided with detachable windows, and are interlocked so that they can be opened only when the open air (outside air) has been introduced into the chamber room 37. A gas supply port 319 which is communicated with the machine room 39 is formed in a rear upper portion of the right side wall 312, and a gas exhaust port 320 which is communicated with the gas exhaust duct 302 is correspondingly formed in a front lower portion of the left side wall.

In this embodiment, the inert gas is continuously supplied and exhausted so that the atmosphere of inert gas is formed inside the chamber room 37. The gas coming into the chamber room 37 from the gas supply port 319 flows inside the chamber room 37 in a diagonal direction thereof to thereby reach the gas exhaust port 320. The region in which the liquid droplet ejection operation of the liquid droplet ejection apparatus 10 is carried out, i.e., the ejection area, lies to face the main gas flow passage in the diagonal direction.

The machine room 39 is provided in its upper portion with a gas introduction unit 301 which is communicated with the gas manufacturing apparatus. The machine room 39 is appropriately divided or partitioned in the inside thereof with partition walls 321 so as to form a gas passage 322 which extends from the gas introduction unit 301 to the gas supply port 319. The gas passage 322 is branched on the downstream side of the gas introduction unit 301, and is made up of: one main gas passage 323 which leads through a gas conditioner 303 (to be described hereinafter) to the gas supply port 319; and the other bypass passage 324 which leads through a filter 330 of the gas conditioner 303 directly to the gas supply port 319 (see FIG. 67).

The main gas passage 323 and the bypass passage 324 are subjected to the flow adjustment by means of manual dampers 325, 325 when the main chamber 4 is installed. Therefore, the inert gas in the ordinary operation is appropriately sent from the main gas passage 323 and the bypass passage 324 into the chamber room 37.

This main gas passage 323 has interposed therein the gas conditioner 303 which is made up of a cooler (chilling unit) 327, a heater (electric heater) 328, a fan (sirocco fan) 329, and the filter (high efficiency particulate air filter, HEPA filter) 330. This arrangement makes sure that the atmosphere inside the chamber room 37 is maintained at a predetermined temperature and moisture content. For example, the atmosphere in the embodiment is maintained at 20° C.±0.520 C. In order to secure the filter area large enough, the filter 330 may be disposed right below the upper wall 316. In other words, inside the chamber room 37, the filter 330 may be disposed right below the upper wall 316 like a partition wall.

On the upstream side of the gas conditioner 303, the main gas passage 323 joins the open air passage 332. An open air intake port 333 of the open air passage 332 is open to the side surface at the lower portion of the machine room 39, and the downstream end of the open air passage 332 joins the main gas passage 323 on the upstream side of the cooler 327. The open air passage 332 has interposed therein two highly hermetic dampers 334, 334 and a solenoid valve 342 so that the open air can surely be prevented from entering the chamber room 37.

In carrying out the maintenance, e.g., of the imaging apparatus 1, it is necessary to change the atmosphere inside the chamber room 37 from the inert gas to the open air before opening each of the above-described double-construction panels 313, 314. In such a case, after closing a gas damper 335, an electrically operated valve 343, and a solenoid valve 344 in the gas introduction unit 301 and after opening both the highly hermetic dampers 334, 334 in the open air passage 332 and also opening exhaust dampers 340, 340 (to be described hereinafter), the fan 329 is driven to thereby send the open air into the chamber room 37. By forcibly sending the open air in this manner, the replacement of the inert gas with the open air can be carried out at a short time.

The chamber room 37 is provided therein with an oxygen analyzer 337 and a moisture meter 338. Based on the results of measurement by these instruments, the electrically operated valve 343 in the gas introduction unit 301 is controlled so as to maintain the oxygen concentration and the moisture content below 10 ppm, respectively.

The gas exhaust duct 302 has interposed therein two exhaust dampers 340, 340. One of them is subjected to open-close control, and the other thereof is controlled so that the chamber room 37 is always maintained in a positive pressure based on the results of measurement by a pressure gauge 341 inside the chamber room 37. As a result, the open air is prevented from flowing into the chamber room 37 through the sealed portions (improperly or insufficiently sealed portions of the air tight members), or the like.

As described above, since the liquid droplet ejection apparatus 10 and the auxiliary apparatus 11 are housed inside the chamber room 37 so that the liquid droplet ejection work by the liquid droplet ejection apparatus 10 is carried out inside the atmosphere of the inert gas, there is no possibility of deterioration in quality of, or damage to, the function liquid droplet (light emitting material) ejected onto (or adhered to) the substrate W, whereby the organic EL can be stably manufactured.

What is claimed is:

1. A method of manufacturing an organic electroluminescent (EL) device, in which:

relative scanning is carried out between a substrate and a plurality of function liquid droplet ejection heads having introduced therein a light emitting function material; and the light emitting function material is selectively ejected such that an organic EL function layer is formed on a multiplicity of pixel regions on the substrate, the method comprising:

providing a chamber room sealed from open air and having multiple regions;

forming an atmosphere of inert gas in the chamber room by supplying gas from one corner region of the chamber room and exhausting gas from a diagonally opposite corner region to provide a diagonal inert gas flow through the chamber room;

ejecting a first of the light emitting function material in the atmosphere of an inert gas;

transporting the substrate into a drying apparatus;

drying the first of the light emitting function material in a first chamber by exposing the substrate to a high-temperature inert gas atmosphere for a predetermined period of time;

ejecting a second of the light emitting function material in an atmosphere of an inert gas after the drying of the first of the light emitting function material;

transporting the substrate into a drying apparatus;

drying the second of the light emitting function material in a second chamber by exposing the substrate to a high-temperature inert gas atmosphere for a predetermined period of time, wherein the drying of the second of the light emitting function material is separate from the drying of the first of the light emitting function material;

ejecting a third of the light emitting function material in an atmosphere of an inert gas after the drying of the second of the light emitting function material;

transporting the substrate into a drying apparatus; and drying the third of the light emitting function material in a third chamber by exposing the substrate to a high-temperature inert gas atmosphere for a predetermined period of time, wherein the drying of the third of the light emitting function material is separate from the drying of the first and second of the light emitting function material, wherein the ejecting steps are performed in the chamber room sealed from open air and supply of the inert gas to and exhaust from the chamber room is carried out constantly to maintain a stable atmosphere in the chamber room during manufacture of the EL device, with the plurality of function liquid droplet ejection heads being oriented in the chamber room so that a main gas flow passage from the supply to the exhaust passes the plurality of function liquid droplet ejection heads diagonally and evaporated solvent of the light emitting function material is appropriately exhausted out of the chamber room.

2. The method according to claim 1, wherein the organic EL function layer is at least an EL light emitting layer of the EL layer and a hole injection layer.

3. The method according to claim 1, wherein the temperature of the inert gas atmosphere is 20° C.±0.5° C.

4. The method according to claim 1, wherein the atmosphere is maintained below a predetermined oxygen concentration.

5. The method according to claim 4, wherein said predetermined oxygen concentration is 10 ppm.

6. The method according to claim 1, wherein the atmosphere is maintained below a predetermined moisture content.

7. The method according to claim 6, wherein said predetermined moisture content is 10 ppm.

8. The method according to claim 1, wherein said transporting step is carried out in the atmosphere of the inert gas.

9. The method according to claim 1, wherein the inert gas is one of nitrogen, oxygen dioxide, helium, neon, argon, krypton, xenon, and radon.

10. The method according to claim 1, wherein the steps of ejecting the first, second and third of the light emitting function materials are repeated a plurality of times, thereby attaining a desired thickness.

11. The method according to claim 1, wherein the drying step is carried out in a sub-chamber sealed from the open air, the sub-chamber being in communication with the sealed chamber room containing the atmosphere of inert gas.

12. The method according to claim 1, wherein the transporting step is carried out in a sub-chamber sealed from the open air, the sub-chamber being in communication with the sealed chamber room containing the atmosphere of inert gas.

* * * * *